US 12,072,416 B2

(12) United States Patent
Ogita

(10) Patent No.: US 12,072,416 B2
(45) Date of Patent: Aug. 27, 2024

(54) BACK-ILLUMINATED CURRENT ASSISTED PHOTONIC DEMODULATOR (CAPD) LIGHT-RECEIVING ELEMENT AND DISTANCE-MEASURING MODULE

(71) Applicant: SONY SEMICONDUCTOR SOLUTIONS CORPORATION, Kanagawa (JP)

(72) Inventor: Tomoharu Ogita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 819 days.

(21) Appl. No.: 17/258,394

(22) PCT Filed: Jul. 4, 2019

(86) PCT No.: PCT/JP2019/026573
§ 371 (c)(1),
(2) Date: Jan. 6, 2021

(87) PCT Pub. No.: WO2020/017338
PCT Pub. Date: Jan. 23, 2020

(65) Prior Publication Data
US 2021/0293956 A1    Sep. 23, 2021

(30) Foreign Application Priority Data

Jul. 18, 2018  (JP) ................................ 2018-135350

(51) Int. Cl.
*G01S 17/08*     (2006.01)
*G01B 11/22*     (2006.01)
(Continued)

(52) U.S. Cl.
CPC .............. *G01S 17/08* (2013.01); *G01B 11/22* (2013.01); *G01S 7/4816* (2013.01); *G01S 17/89* (2013.01);
(Continued)

(58) Field of Classification Search
CPC ........ G01S 17/08; G01S 7/4816; G01S 17/89; G01S 7/4914; G01S 17/36; G01S 17/931;
(Continued)

(56) References Cited

U.S. PATENT DOCUMENTS

| 9,117,712 B1 | 8/2015 | Oggier et al. |
| 2007/0158770 A1 | 7/2007 | Kawahito |

(Continued)

FOREIGN PATENT DOCUMENTS

| CN | 104347652 A | 2/2015 |
| CN | 106575658 A | 4/2017 |

(Continued)

OTHER PUBLICATIONS

International Search Report prepared by the Japan Patent Office on Sep. 10, 2019, for International Application No. PCT/JP2019/026573.

*Primary Examiner* — Thanh Luu
*Assistant Examiner* — Mai Thi Ngoc Tran
(74) *Attorney, Agent, or Firm* — Sheridan Ross PC

(57) ABSTRACT

The present technology relates to a light-receiving element and a distance-measuring module. A light-receiving element includes an on-chip lens, a wiring layer, and a semiconductor layer arranged between the on-chip lens and the wiring layer, the semiconductor layer includes a first voltage application portion to which a first voltage is applied, a second voltage application portion to which a second voltage different from the first voltage is applied, a first charge detection portion arranged around the first voltage application portion, a second charge detection portion arranged around the second voltage application portion, and a pixel separation portion that separates the semiconductor layer at least up to a predetermined depth in a boundary portion of adjacent pixels, and a third voltage is applied to the pixel (Continued)

separation portion. The present technology can be applied to, for example, a light-receiving element that generates distance information by a ToF method.

20 Claims, 63 Drawing Sheets

(51) Int. Cl.
  *G01S 7/481* (2006.01)
  *G01S 17/89* (2020.01)
  *H01L 27/146* (2006.01)

(52) U.S. Cl.
  CPC .. *H01L 27/14623* (2013.01); *H01L 27/14627* (2013.01); *H01L 27/14629* (2013.01); *H01L 27/1463* (2013.01); *H01L 27/14636* (2013.01); *H01L 27/14649* (2013.01)

(58) Field of Classification Search
  CPC .............. G01B 11/22; H01L 27/14623; H01L 27/14627; H01L 27/14629; H01L 27/1463; H01L 27/14636; H01L 27/14649; H01L 27/14609; H01L 27/1464; H01L 31/02327; H01L 31/165; H01L 31/167; H01L 31/10; H04N 25/70; H04N 25/79
  USPC .............................................. 250/208.1, 216
  See application file for complete search history.

(56) References Cited

U.S. PATENT DOCUMENTS

| | | |
|---|---|---|
| 2007/0164767 A1 | 7/2007 | Herz |
| 2015/0001664 A1 | 1/2015 | Van Der Tempel |
| 2015/0028405 A1 | 1/2015 | Minami et al. |
| 2015/0171146 A1* | 6/2015 | Ooki ................. H01L 27/14636 |
| | | 257/40 |
| 2017/0194367 A1* | 7/2017 | Fotopoulou ....... H01L 27/14609 |
| 2017/0301708 A1 | 10/2017 | Fotopoulou |
| 2018/0106892 A1* | 4/2018 | Parascandola .... H01L 27/14603 |
| 2019/0131478 A1* | 5/2019 | Wang ................ H01L 27/14689 |

FOREIGN PATENT DOCUMENTS

| | | | |
|---|---|---|---|
| EP | 2960952 | | 12/2015 |
| EP | 3193369 | | 7/2017 |
| JP | 2005-150521 | | 6/2005 |
| JP | 2005-235893 | | 9/2005 |
| JP | 2007-506269 | | 3/2007 |
| JP | 2012049547 A | | 3/2012 |
| JP | 2012094719 A | | 5/2012 |
| JP | 2012-169530 | | 9/2012 |
| JP | 2015-026708 | | 2/2015 |
| JP | 2017107132 | * | 6/2017 ............... G02B 7/26 |
| JP | 2017-522727 | | 8/2017 |
| TW | 201138072 A | | 11/2011 |

* cited by examiner

FIG. 5
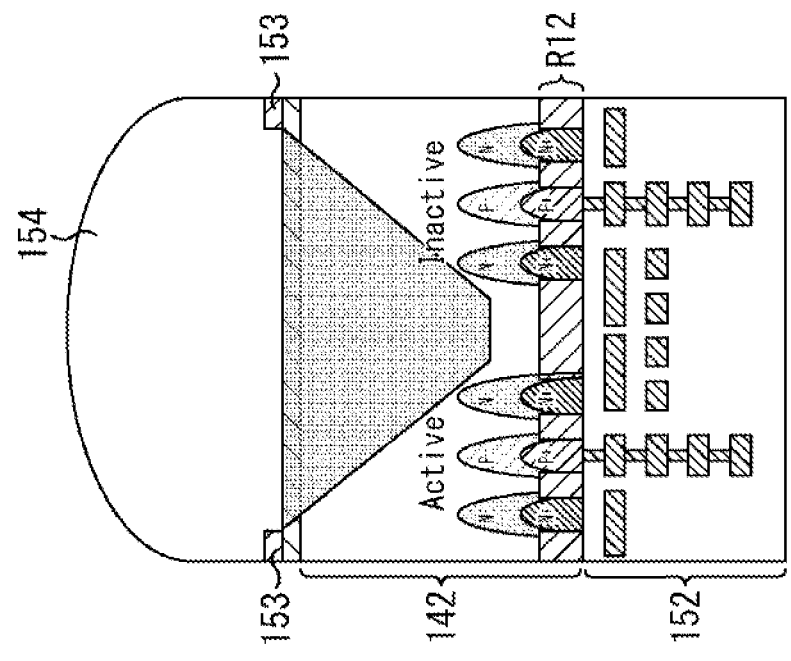
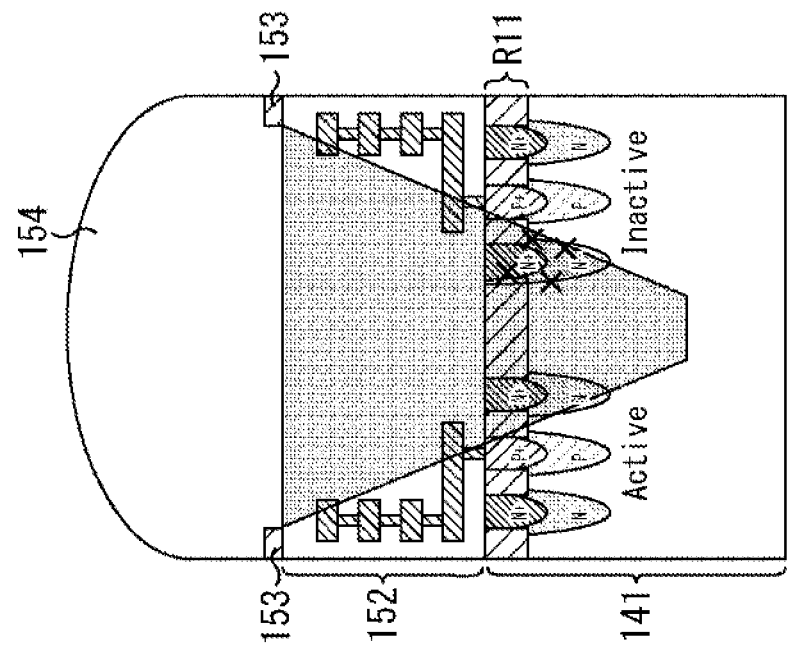

FIG. 7
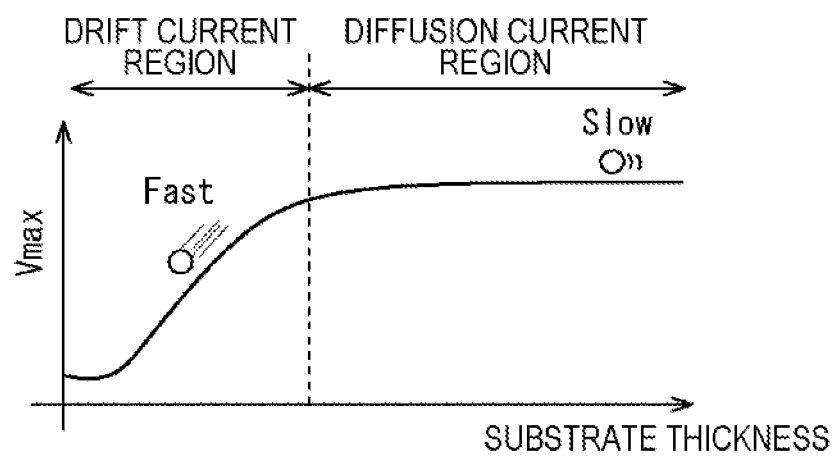
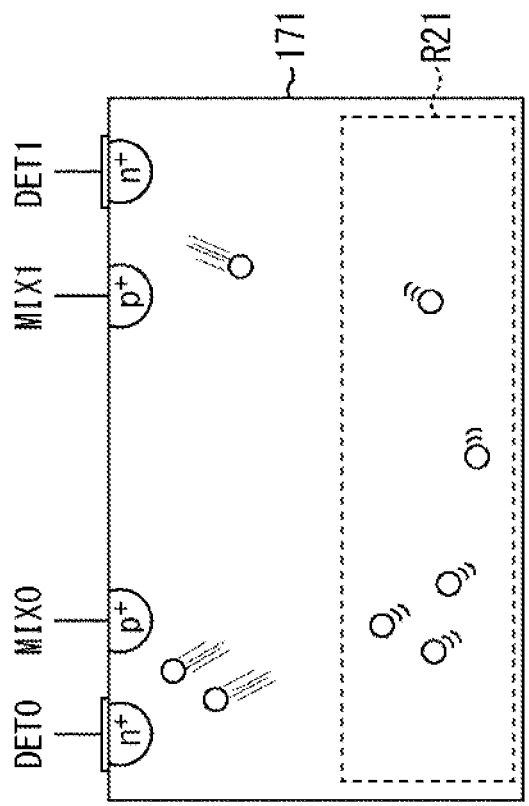

FIG. 35
A
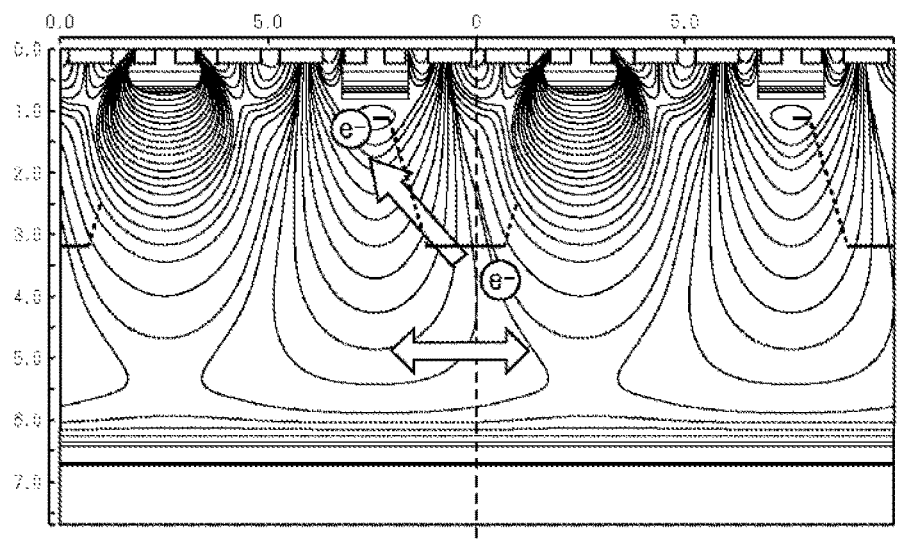
Periodic ARRANGEMENT
PIXEL BOUNDARY
B
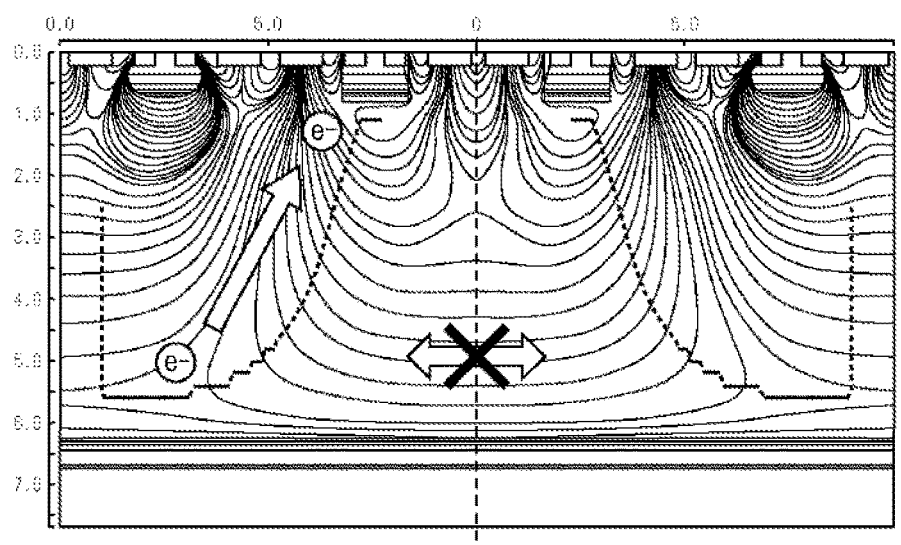
Mirror ARRANGEMENT
PIXEL BOUNDARY FIG. 47
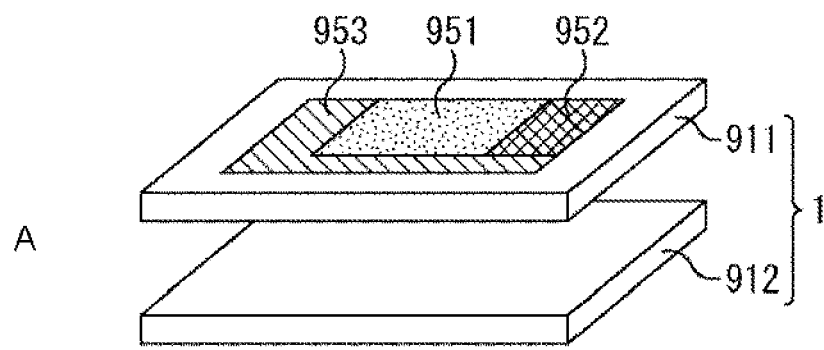
A
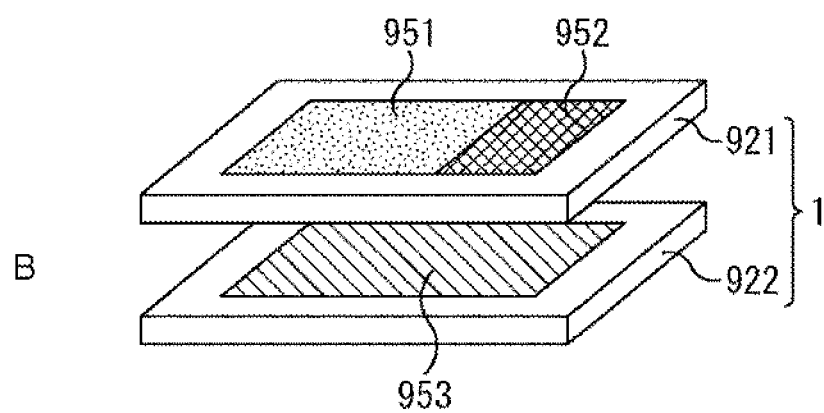
B
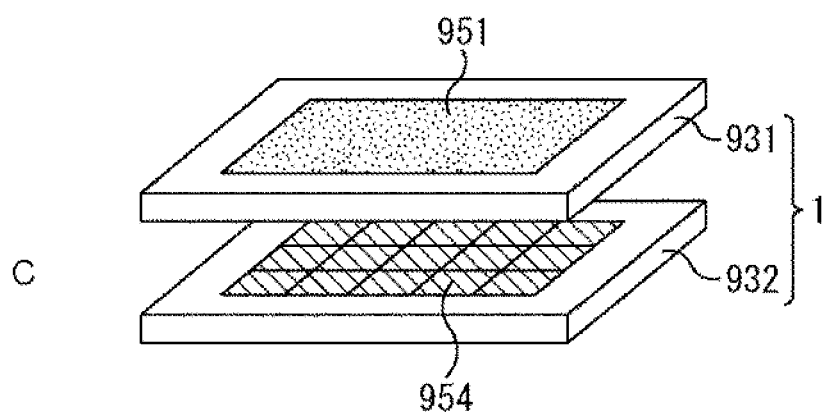
C

BACK-ILLUMINATED CURRENT ASSISTED PHOTONIC DEMODULATOR (CAPD) LIGHT-RECEIVING ELEMENT AND DISTANCE-MEASURING MODULE

CROSS REFERENCE TO RELATED APPLICATIONS

This application is a national stage application under 35 U.S.C. 371 and claims the benefit of PCT Application No. PCT/JP2019/026573 having an international filing date of 4 Jul. 2019, which designated the United States, which PCT application claimed the benefit of Japanese Patent Application No. 2018-135350, filed 18 Jul. 2018, the entire disclosures of each of which are incorporated herein by reference.

TECHNICAL FIELD

The present technology relates to a light-receiving element and a distance-measuring module, and particularly relates to a light-receiving element and a distance-measuring module for enabling improvement of characteristics.

BACKGROUND ART

Conventionally, distance-measuring systems using an indirect time of flight (ToF) method are known. In such distance-measuring systems, a sensor capable of distributing signal charges in different regions at a high speed, the signal charges being obtained by receiving light hitting and reflected at an object, the light being active light radiated using a light emitting diode (LED) or a laser at a certain phase, is indispensable.

Therefore, for example, there is proposed a technology of causing a wide-range of region in a substrate of a sensor to be modulated at a high speed by directly applying a voltage in the substrate to generate a current in the substrate (for example, see Patent Document 1). Such a sensor is also called a current assisted photonic demodulator (CAPD) sensor.

CITATION LIST

Patent Document

Patent Document 1: Japanese Patent Application Laid-Open No. 2011-86904

SUMMARY OF THE INVENTION

Problems to be Solved by the Invention

However, it has been difficult to obtain a CAPD sensor with sufficient characteristics by the above-described technology.

For example, the above-described CAPD sensor is a front-illuminated sensor having wiring and the like arranged on a surface of the substrate, the surface receiving light from the outside.

To secure a photodiode conversion region, it is desirable not to have wiring or the like that blocks an optical path of incoming light on the light-receiving surface side of a photodiode, that is, a photoelectric conversion unit. However, in the front-illuminated CAPD sensor, there is no choice but to arrange wiring for charge extraction, various control lines and signal lines on the light-receiving surface side of the PD depending on a structure, which limits the photoelectric conversion region. That is, a sufficient photoelectric conversion region cannot be secured, and characteristics of pixels, such as sensitivity, deteriorate.

Furthermore, in a case of considering use of a CAPD sensor in a place with external light, an external light component becomes a noise component for the indirect ToF method for measuring distance using active light. Therefore, a sufficient saturation signal amount (Qs) needs to be secured in order to secure a sufficient signal to noise (SN) ratio and obtain distance information. However, in the front-illuminated CAPD sensor, the wiring layout is limited. Therefore, it is necessary to devise a method other than the wiring capacitance, such as providing an additional transistor for securing a capacitance.

Moreover, in the front-illuminated CAPD sensor, a signal extraction portion called Tap is arranged on the side in the substrate on which light is incident. Meanwhile, in a case of considering photoelectric conversion in a Si substrate, a rate of occurrence of photoelectric conversion on the light incident surface side is high although there is a difference in an attenuation rate depending a wavelength of the light. Therefore, in the surface-type CAPD sensor, a probability that photoelectric conversion is performed in an Inactive Tap region may be high, the Inactive Tap region being a Tap region to which the signal charge is not distributed, of the Tap region in which the signal extraction portion is provided. Since the indirect ToF sensor obtains distance measurement information using a signal distributed to each charge accumulation region according to a phase of the active light, a directly photoelectrically converted component in the Inactive Tap region becomes a noise, and as a result, the distance-measuring accuracy may become worse. That is, the characteristics of the CAPD sensor may deteriorate.

The present technology has been made in view of such a situation and enables improvement of characteristics.

Solutions to Problems

A light-receiving element according to the first aspect of the present technology includes:
an on-chip lens;
a wiring layer; and
a semiconductor layer arranged between the on-chip lens and the wiring layer, in which
the semiconductor layer includes
    a first pixel,
    a second pixel adjacent to the first pixel, and
    a first pixel separation portion that separates the semiconductor layer at least up to a predetermined depth between the first pixel and the second pixel,
the first pixel includes
    a first voltage application portion connected to first control wiring,
    a second voltage application portion connected to second control wiring,
    a first charge detection portion arranged around the first voltage application portion, and
    a second charge detection portion arranged around the second voltage application portion,
the second pixel includes
    a third voltage application portion connected to third control wiring,
    a fourth voltage application portion connected to fourth control wiring,
    a third charge detection portion arranged around the third voltage application portion, and a fourth charge detection portion arranged around the fourth voltage application portion, and the first pixel separation portion includes
a fifth voltage application portion connected to fifth control wiring.

In the first aspect of the present technology, an on-chip lens, a wiring layer, and a semiconductor layer arranged between the on-chip lens and the wiring layer are provided, the semiconductor layer is provided with a first pixel, a second pixel adjacent to the first pixel, and a first pixel separation portion that separates the semiconductor layer at least up to a predetermined depth between the first pixel and the second pixel, the first pixel is provided with a first voltage application portion connected to first control wiring, a second voltage application portion connected to second control wiring, a first charge detection portion arranged around the first voltage application portion, and a second charge detection portion arranged around the second voltage application portion, the second pixel is provided with a third voltage application portion connected to third control wiring, a fourth voltage application portion connected to fourth control wiring, a third charge detection portion arranged around the third voltage application portion, and a fourth charge detection portion arranged around the fourth voltage application portion, and the first pixel separation portion is provided with a fifth voltage application portion connected to fifth control wiring.

A light-receiving element according to the second aspect of the present technology includes:
an on-chip lens;
a wiring layer; and
a semiconductor layer arranged between the on-chip lens and the wiring layer, in which
the semiconductor layer includes
a first pixel,
a second pixel adjacent to the first pixel, and
a first pixel separation portion that separates the semiconductor layer at least up to a predetermined depth between the first pixel and the second pixel,
an inter-pixel light-shielding film formed between the first pixel and the second pixel, on a front surface of the semiconductor layer on the on-chip lens side, and
a through electrode connected to the inter-pixel light-shielding film,
the first pixel includes
a first voltage application portion connected to first control wiring,
a second voltage application portion connected to second control wiring,
a first charge detection portion arranged around the first voltage application portion, and
a second charge detection portion arranged around the second voltage application portion,
the second pixel includes
a third voltage application portion connected to third control wiring,
a fourth voltage application portion connected to fourth control wiring,
a third charge detection portion arranged around the third voltage application portion, and
a fourth charge detection portion arranged around the fourth voltage application portion, and
the first pixel separation portion includes
a fifth voltage application portion at least partly connected to the inter-pixel light-shielding film.

In the second aspect of the present technology, an on-chip lens, a wiring layer, and a semiconductor layer arranged between the on-chip lens and the wiring layer are provided, the semiconductor layer is provided with a first pixel, a second pixel adjacent to the first pixel, and a first pixel separation portion that separates the semiconductor layer at least up to a predetermined depth between the first pixel and the second pixel, an inter-pixel light-shielding film formed between the first pixel and the second pixel, on a front surface of the semiconductor layer on the on-chip lens side, and a through electrode connected to the inter-pixel light-shielding film, the first pixel is provided with a first voltage application portion connected to first control wiring, a second voltage application portion connected to second control wiring, a first charge detection portion arranged around the first voltage application portion, and a second charge detection portion arranged around the second voltage application portion, the second pixel is provided with a third voltage application portion connected to third control wiring, a fourth voltage application portion connected to fourth control wiring, a third charge detection portion arranged around the third voltage application portion, and a fourth charge detection portion arranged around the fourth voltage application portion, and the first pixel separation portion is provided with a fifth voltage application portion at least partly connected to the inter-pixel light-shielding film.

A distance-measuring module according to the third aspect of the present technology includes:
the light-receiving element according to the first aspect or the second aspect;
a light source configured to radiate irradiation light in which brightness periodically varies; and
a light-emission control unit configured to control irradiation timing of the irradiation light.

In the third aspect of the present technology, the light-receiving element according to the first aspect or the second aspect, a light source configured to radiate irradiation light in which brightness periodically varies, and a light-emission control unit configured to control irradiation timing of the irradiation light are provided.

Effects of the Invention

According to the first to third aspects of the present technology, the characteristics can be improved.

Note that the effects described here are not necessarily limited, and any of effects described in the present disclosure may be exhibited.

BRIEF DESCRIPTION OF DRAWINGS

FIG. 5 is a view for describing improvement of charge separation efficiency.

FIG. 7 is a diagram for describing a moving speed of a signal carrier in a front-illuminated type.

FIG. 35 is diagrams for describing characteristics of the Periodic arrangement and the Mirror arrangement.

FIG. 47 is views for describing a substrate configuration of a light-receiving element.

MODE FOR CARRYING OUT THE INVENTION

Hereinafter, embodiments to which the present technology is applied will be described with reference to the drawings.

First Embodiment

<Configuration Example of Light-Receiving Element>

The present technology enables improvement of characteristics such as pixel sensitivity by causing a CAPD sensor to have a back-illuminated configuration.

The present technology can be applied to, for example, a light-receiving element that constitutes a distance-measuring system that measures distance by an indirect ToF method, an imaging device including such a light-receiving element, or the like.

The distance-measuring system can be applied to, for example, an in-vehicle system mounted on a vehicle and which measures the distance to an object outside the vehicle, a system for gesture recognition that measures the distance to an object such as a hand of a user and recognizes a gesture of the user on the basis of a measurement result, or the like. In this case, the gesture recognition result can be used for, for example, operating a car navigation system or the like.

Figure 1:
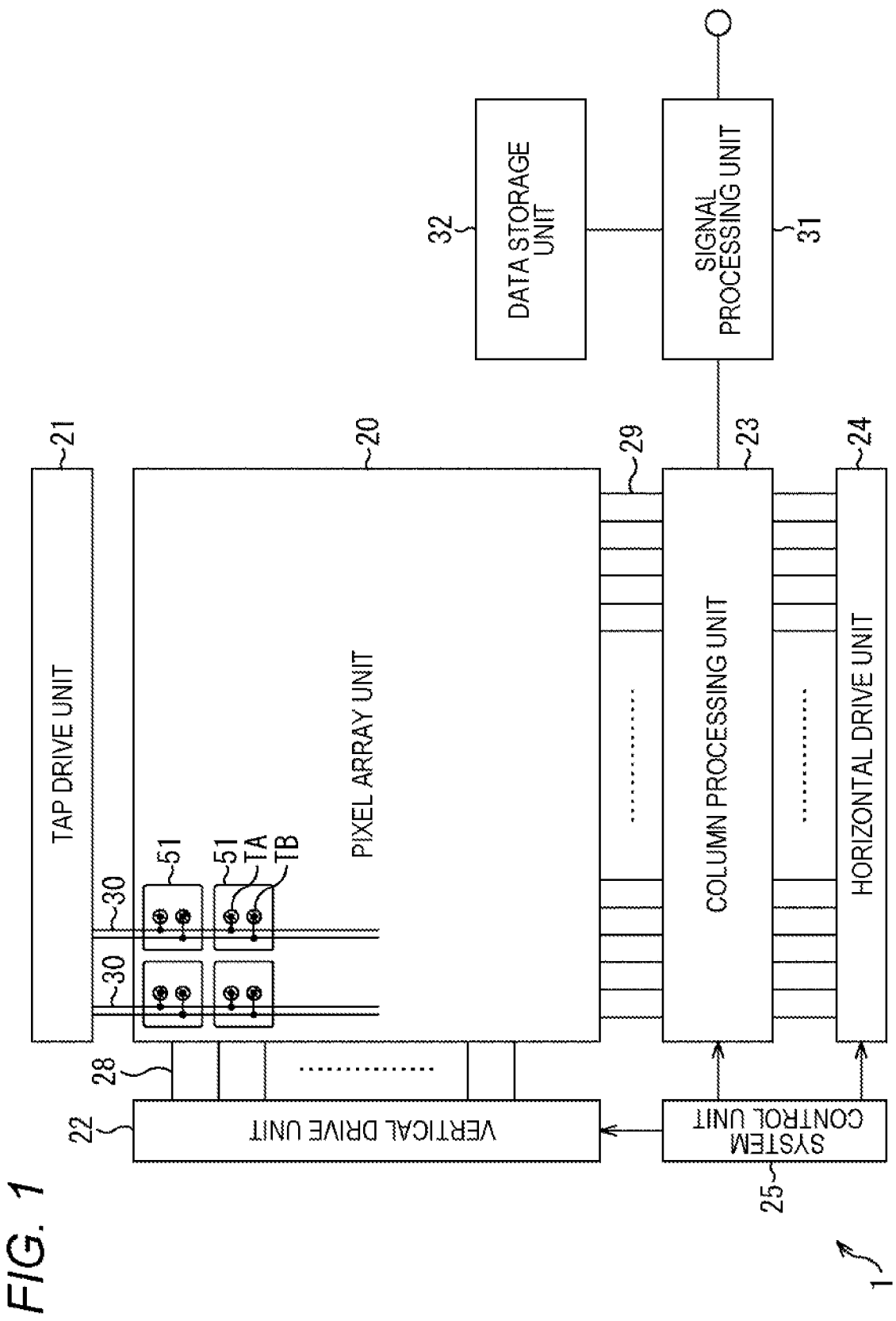
FIG. 1 is a block diagram illustrating a configuration example of a light-receiving element.

FIG. 1 is a block diagram illustrating a configuration example of an embodiment of a light-receiving element to which the present technology is applied.

A light-receiving element 1 illustrated in FIG. 1 is a back-illuminated CAPD sensor and is provided in, for example, an imaging device having a distance-measuring function.

The light-receiving element 1 has a configuration including a pixel array unit 20 formed on a semiconductor substrate (not illustrated) and a peripheral circuit unit integrated on the same semiconductor substrate as the pixel array unit 20. The peripheral circuit unit includes, for example, a tap drive unit 21, a vertical drive unit 22, a column processing unit 23, a horizontal drive unit 24, and a system control unit 25.

The light-receiving element 1 is also provided with a signal processing unit 31 and a data storage unit 32. Note that the signal processing unit 31 and the data storage unit 32 may be mounted on the same substrate as the light-receiving element 1 or may be arranged on a substrate different from the substrate of the light-receiving element 1 in the imaging device.

The pixel array unit 20 has a configuration in which pixels 51 that each generate a charge according to an amount of received light and outputs a signal corresponding to the charge are two-dimensionally arranged in a matrix in a row direction and a column direction. That is, the pixel array unit 20 includes a plurality of pixels 51 each photoelectrically converting incident light and outputting a signal corresponding to the charge obtained as a result of the photoelectric conversion. Here, the row direction refers to an array direction of the pixels 51 in a horizontal direction, and the column direction refers to an array direction of the pixels 51 in a vertical direction. The row direction is a cross direction in FIG. 1 and the column direction is a vertical direction in FIG. 1.

The pixel 51 receives light incident from an outside, in particular, infrared light, photoelectrically converts the received light, and outputs a pixel signal according to a charge obtained as a result of the photoelectric conversion. The pixel 51 includes a first tap TA that applies a predetermined voltage MIX0 (first voltage) to detect the photoelectrically converted charge and a second tap TB that applies a predetermined voltage MIX1 (second voltage) to detect the photoelectrically converted charge.

The tap drive unit 21 supplies the predetermined voltage MIX0 to the first tap TA via a predetermined voltage supply line 30 and supplies the predetermined voltage MIX1 to the second tap TB via a predetermined voltage supply line 30, of each pixel 51 of the pixel array unit 20. Therefore, one pixel column of the pixel array unit 20 is wired with the two voltage supply lines 30, which are the voltage supply line 30 that transmits the voltage MIX0 and the voltage supply line 30 that transmits the voltage MIX1.

In the pixel array unit 20, a pixel drive line 28 is wired along the row direction for each pixel row and two vertical signal lines 29 are wired along the column direction for each pixel column with respect to the pixel array in the matrix. For example, the pixel drive line 28 transmits a drive signal for driving the pixel when reading a signal from the pixel. Note that, in FIG. 1, one wire is illustrated for the pixel drive line 28 but the number of wires is not limited to one. One end of the pixel drive line 28 is connected to an output end corresponding to each row of the vertical drive unit 22.

The vertical drive unit 22 is configured by a shift register, an address decoder, and the like, and drives all the pixels of the pixel array unit 20 at the same time, on a row basis, or the like. That is, the vertical drive unit 22 constitutes a drive unit that controls the operation of each pixel of the pixel array unit 20 together with the system control unit 25 that controls the vertical drive unit 22.

The signal output from each pixel 51 of the pixel row according to the drive control by the vertical drive unit 22 is input to the column processing unit 23 via the vertical signal line 29. The column processing unit 23 performs predetermined signal processing for a pixel signal output from each pixel 51 through the vertical signal line 29, and temporarily stores the pixel signal after the signal processing.

Specifically, the column processing unit 23 performs noise removal processing, analog to digital (AD) conversion processing, and the like as the signal processing.

The horizontal drive unit 24 is configured by a shift register, an address decoder, and the like, and sequentially selects a unit circuit corresponding to the pixel column of the column processing unit 23. By the selective scanning by the horizontal drive unit 24, pixel signals processed in the column processing unit 23 for each unit circuit are sequentially output.

The system control unit 25 is configured by a timing generator that generates various timing signals, and the like, and drives and controls the tap drive unit 21, the vertical drive unit 22, the column processing unit 23, the horizontal drive unit 24, and the like on the basis of the various timing signals generated by the timing generator.

The signal processing unit 31 has at least an arithmetic processing function and performs various types of signal processing such as arithmetic processing on the basis of the pixel signal output from the column processing unit 23. The data storage unit 32 temporarily stores data necessary for the signal processing in the signal processing unit 31.

<Configuration Example of Pixel>

Next, a configuration example of the pixel provided in the pixel array unit 20 will be described. The pixel provided in the pixel array unit 20 is configured as illustrated in FIG. 2, for example.

Figure 2:
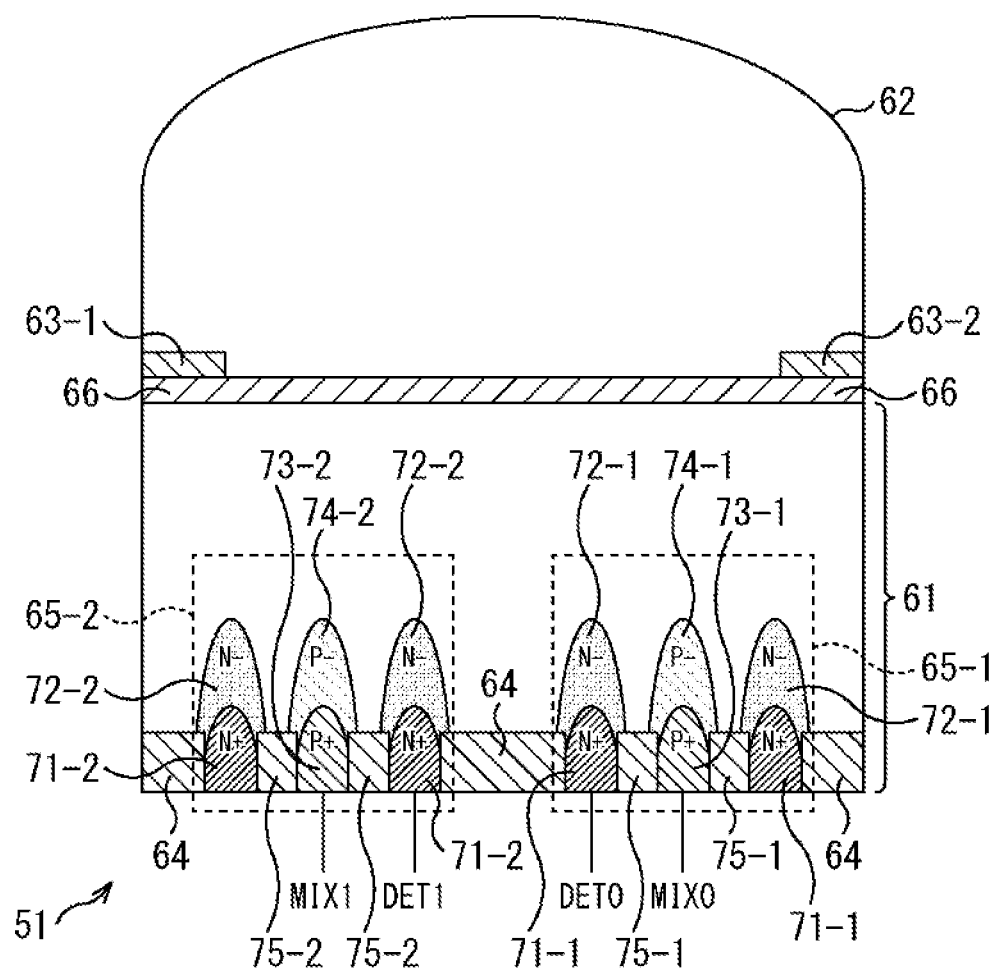
FIG. 2 is a view illustrating a configuration example of a pixel.

FIG. 2 illustrates a cross-section of one pixel 51 provided in the pixel array unit 20, and the pixel 51 receives light incident from the outside, in particular, infrared light, photoelectrically converts the received light, and outputs a signal according to the charge obtained as a result of the photoelectric conversion.

The pixel 51 includes, for example, a substrate 61 formed using a P-type semiconductor layer such as a silicon substrate, and an on-chip lens 62 formed on the substrate 61.

For example, in the substrate 61, the thickness in the vertical direction in FIG. 2, that is, the thickness in a direction perpendicular to the surface of the substrate 61, is 20 μm or less. Note that the thickness of the substrate 61 may be 20 μm or more, and the thickness may be determined according to a target characteristic of the light-receiving element 1, or the like.

Furthermore, the substrate 61 is, for example, a high-resistance P-Epi substrate having a substrate concentration of 1E+13 order or less, and the resistance (resistivity) of the substrate 61 is, for example, 500 [Ωcm] or more.

Here, the relationship between the substrate concentration and the resistance of the substrate 61 is, for example, the resistance of 2000 [Ωcm] when the substrate concentration is 6.48E+12 [cm$^3$], the resistance of 1000 [Ωcm] when the substrate concentration is 1.30E+13 [cm$^2$], the resistance of 500 [Ωcm] when the substrate concentration is 2.59E+13 [cm$^3$], the resistance of 100 [Ωcm] when the substrate concentration is 1.30E+14 [cm$^3$], and the like.

In FIG. 2, an upper surface of the substrate 61 is a back surface of the substrate 61 and is a light incident surface of the substrate 61 on which the light from the outside is incident. Meanwhile, a lower surface of the substrate 61 is a front surface of the substrate 61 and a multilayer wiring layer (not illustrated) is formed. A fixed charge film 66 including a single-layer film or a stacked film having a positive fixed charge is formed on the light incident surface of the substrate 61, and the on-chip lens 62 that condenses the light incident from the outside and guides the light into the substrate 61 is formed on an upper surface of the fixed charge film 66. The fixed charge film 66 causes the light incident surface side of the substrate 61 to be in a hall-accumulated state and suppresses generation of a dark current.

Moreover, in the pixel 51, an inter-pixel light-shielding film 63-1 and an inter-pixel light-shielding film 63-2 for preventing crosstalk between adjacent pixels are formed in end portions of the pixel 51 and on the fixed charge film 66. Hereinafter, in a case where there is no need to distinguish the inter-pixel light-shielding film 63-1 and the inter-pixel light-shielding film 63-2, they are also simply referred to as inter-pixel light-shielding film(s) 63.

In this example, the light from the outside enters the substrate 61 via the on-chip lens 62. The inter-pixel light-shielding film 63 is formed not to cause the light incident from the outside to enter another pixel region provided adjacent to the pixel 51 in the substrate 61. That is, the light entering the on-chip lens 62 from the outside and directed to another pixel adjacent to the pixel 51 is shielded by the inter-pixel light-shielding film 63-1 or the inter-pixel light-shielding film 63-2 and is prevented from entering the another adjacent pixel.

Since the light-receiving element 1 is a back-illuminated CAPD sensor, the light incident surface of the substrate 61 is a so-called back surface, and no wiring layer including wiring and the like is formed on the back surface. Furthermore, the wiring layer in which wiring for driving a transistor and the like formed in the pixel 51 and wiring for reading a signal from the pixel 51 and the like are formed is stacked and formed on a surface opposite to the light incident surface of the substrate 61.

An oxide film 64, and a signal extraction portion 65-1 and a signal extraction portion 65-2 are formed in a portion inside a surface of the substrate 61, the surface being opposite to the light incident surface, that is, inside the lower surface in FIG. 2. The signal extraction portion 65-1 corresponds to the first tap TA described in FIG. 1, and the signal extraction portion 65-2 corresponds to the second tap TB described in FIG. 1.

In this example, the oxide film 64 is formed in a central portion of the pixel 51 near the surface opposite to the light incident surface of the substrate 61, and the signal extraction portion 65-1 and the signal extraction portion 65-2 are each formed in one of both ends of the oxide film 64.

Here, the signal extraction portion 65-1 includes an N+ semiconductor region 71-1 that is an N-type semiconductor region and an N− semiconductor region 72-1 having a lower donor impurity concentration than the N+ semiconductor region 71-1, and a P+ semiconductor region 73-1 that is a P-type semiconductor region and a P− semiconductor region 74-1 having a lower acceptor impurity concentration than the P+ semiconductor region 73-1. Here, examples of the donor impurity include elements belonging to Group 5 in the periodic table of elements such as phosphorus (P) and arsenic (As) for Si, and examples of the acceptor impurity include elements belonging to Group 3 in the periodic table of elements such as boron (B) for Si. An element that serves as a donor impurity is called donor element, and an element that serves as an acceptor impurity is called acceptor element.

In FIG. 2, the N+ semiconductor region 71-1 is formed at a position adjacent on the right side of the oxide film 64 in a portion inside a front surface of the substrate 61, the front surface being opposite to the light incident surface. Furthermore, the N-semiconductor region 72-1 is formed to cover (surround) the N+ semiconductor region 71-1 on the N+ semiconductor region 71-1 in FIG. 2.

Moreover, the P+ semiconductor region 73-1 is formed on the right side of the N+ semiconductor region 71-1. Furthermore, the P− semiconductor region 74-1 is formed to cover (surround) the P+ semiconductor region 73-1 on the P+ semiconductor region 73-1 in FIG. 2.

Moreover, the N+ semiconductor region 71-1 is formed on the right side of the P+ semiconductor region 73-1. Furthermore, the N− semiconductor region 72-1 is formed to cover (surround) the N+ semiconductor region 71-1 on the N+ semiconductor region 71-1 in FIG. 2.

Similarly, the signal extraction portion 65-2 includes an N+ semiconductor region 71-2 that is an N-type semiconductor region and an N− semiconductor region 72-2 having a lower donor impurity concentration than the N+ semiconductor region 71-2, and a P+ semiconductor region 73-2 that is a P-type semiconductor region and a P− semiconductor region 74-2 having a lower acceptor impurity concentration than the P+ semiconductor region 73-2.

In FIG. 2, the N+ semiconductor region 71-2 is formed at a position adjacent on the left side of the oxide film 64 in a portion inside the front surface of the substrate 61, the front surface being opposite to the light incident surface. Furthermore, the N− semiconductor region 72-2 is formed to cover (surround) the N+ semiconductor region 71-2 on the N+ semiconductor region 71-2 in FIG. 2.

Moreover, the P+ semiconductor region 73-2 is formed on the left side of the N+ semiconductor region 71-2. Furthermore, the P− semiconductor region 74-2 is formed to cover (surround) the P+ semiconductor region 73-2 on the P+ semiconductor region 73-2 in FIG. 2.

Moreover, the N+ semiconductor region 71-2 is formed on the left side of the P+ semiconductor region 73-2. Furthermore, the N− semiconductor region 72-2 is formed to cover (surround) the N+ semiconductor region 71-2 on the N+ semiconductor region 71-2 in FIG. 2.

An oxide film 64 similar to that in the central portion of the pixel 51 is formed in an end portion of the pixel 51 in the portion inside the front surface of the substrate 61, the front surface being opposite to the light incident surface.

Hereinafter, in a case where there is no need to distinguish the signal extraction portion 65-1 and the signal extraction portion 65-2, they are also simply referred to as signal extraction portion(s) 65.

Furthermore, hereinafter, in a case where there is no need to distinguish the N+ semiconductor region 71-1 and the N+ semiconductor region 71-2, they are also simply referred to as N+ semiconductor region(s) 71, and in a case where there is no need to distinguish the N− semiconductor region 72-1 and the N− semiconductor region 72-2, they are also simply referred to as N− semiconductor region(s) 72.

Moreover, hereinafter, in a case where there is no need to distinguish the P+ semiconductor region 73-1 and the P+ semiconductor region 73-2, they are also simply referred to as P+ semiconductor region(s) 73, and in a case where there is no need to distinguish the P− semiconductor region 74-1 and the P− semiconductor region 74-2, they are also simply referred to as P− semiconductor region(s) 74.

Furthermore, in the substrate 61, a separation portion 75-1 for separating the N+ semiconductor region 71-1 and the P+ semiconductor region 73-1 is formed using an oxide film and the like between the N+ semiconductor region 71-1 and the P+ semiconductor region 73-1. Similarly, a separation portion 75-2 for separating the N+ semiconductor region 71-2 and the P+ semiconductor region 73-2 is formed using an oxide film and the like between the N+ semiconductor region 71-2 and the P+ semiconductor region 73-2. Hereinafter, in a case where there is no need to distinguish the separation portion 75-1 and the separation portion 75-2, they are also simply referred to as separation portion(s) 75.

The N+ semiconductor region 71 provided in the substrate 61 functions as a charge detection portion for detecting the amount of light incident on the pixel 51 from the outside, that is, the amount of signal carriers generated by the photoelectric conversion by the substrate 61. Note that the N− semiconductor region 72 having a low donor impurity concentration in addition to the N+ semiconductor region 71 can be regarded as the charge detection portion. Furthermore, the P+ semiconductor region 73 functions as a voltage application portion for injecting a large number of carrier currents into the substrate 61, that is, for directly applying a voltage to the substrate 61 to generate an electric field in the substrate 61. Note that the P− semiconductor region 74 having a low acceptor impurity concentration in addition to the P+ semiconductor region 73 can be regarded as the voltage application portion.

In pixel 51, a floating diffusion (FD) portion (hereinafter, also referred to as FD portion A) that is a floating diffusion region (not illustrated) is directly connected to the N+ semiconductor region 71-1, and further, the FD portion A is connected to the vertical signal line 29 via an amplification transistor (not illustrated) and the like.

Similarly, another FD portion (hereinafter, also referred to as FD portion B) different from the FD portion A is directly connected to the N+ semiconductor region 71-2, and the FD portion B is connected to the vertical signal line 29 via an amplification transistor (not illustrated) and the like. Here, the FD portion A and the FD portion B are connected to the vertical signal lines 29 different from each other.

For example, in the case of measuring the distance to an object by the indirect ToF method, infrared light is emitted toward the object from the imaging device provided with the light-receiving element 1. Then, when the infrared light is reflected by the object and returning to the imaging device as reflected light, the substrate 61 of the light-receiving element 1 receives and photoelectrically converts the incident reflected light (infrared light). The tap drive unit 21 drives the first tap TA and the second tap TB of the pixel 51, and distributes a signal corresponding to a charge DET obtained by photoelectric conversion to the FD portion A and the FD portion B.

For example, at certain timing, the tap drive unit 21 applies a voltage to the two P+ semiconductor regions 73 via a contact or the like. Specifically, for example, the tap drive unit 21 applies the voltage of MIX0=1.5 V to the P+ semiconductor region 73-1 that is the first tap TA, and applies the voltage of MIX1=0 V to the P+ semiconductor region 73-2 that is the second tap TB.

Then, an electric field is generated between the two P+ semiconductor regions 73 in the substrate 61, and a current flows from the P+ semiconductor region 73-1 to the P+ semiconductor region 73-2. In this case, holes in the substrate 61 move in the direction of the P+ semiconductor region 73-2, and electrons move in the direction of the P+ semiconductor region 73-1.

Therefore, in such a state, when infrared light (reflected light) from the outside enters the substrate 61 through the on-chip lens 62, and the infrared light is photoelectrically converted into a pair of electrons and holes in the substrate 61, the obtained electrons are guided in the direction of the P+ semiconductor region 73-1 by the electric field between the P+ semiconductor regions 73 and move into the N+ semiconductor region 71-1.

In this case, the electrons generated by the photoelectric conversion are used as a signal carrier for detecting the signal corresponding to the amount of infrared light incident on the pixel 51, that is, the amount of received infrared light.

As a result, a charge corresponding to the electrons that have moved into the N+ semiconductor region 71-1 is accumulated in the N+ semiconductor region 71-1, and this charge is detected by the column processing unit 23 via the FD portion A, the amplification transistor, the vertical signal line 29, and the like.

That is, the accumulated charge DET0 in the N+ semiconductor region 71-1 is transferred to the FD portion A directly connected to the N+ semiconductor region 71-1, and the signal corresponding to the charge DET0 transferred to the FD portion A is read by the column processing unit 23 via the amplification transistor and the vertical signal line 29. Then, the column processing unit 23 applies processing such as AD conversion processing to the read signal, and a pixel signal obtained as a result of the processing is supplied to the signal processing unit 31.

The pixel signal is a signal indicating a charge amount according to the electrons detected by the N+ semiconductor region 71-1, that is, the amount of the charge DET0 accumulated in the FD portion A. In other words, the pixel signal can be said to be a signal indicating the amount of infrared light received by the pixel 51.

Note that, at this time, the pixel signal corresponding to the electrons detected in the N+ semiconductor region 71-2 may be appropriately used for distance measurement, similarly to the case of the N+ semiconductor region 71-1.

Furthermore, at the next timing, the tap drive unit 21 applies a voltage to the two P+ semiconductor regions 73 via a contact or the like so that an electric field is generated in the direction opposite to the electric field previously generated in the substrate 61. Specifically, for example, the tap drive unit 21 applies the voltage of MIX0=0 V to the P+ semiconductor region 73-1 that is the first tap TA, and applies the voltage of MIX1=1.5 V to the P+ semiconductor region 73-2 that is the second tap TB.

Thereby, an electric field is generated between the two P+ semiconductor regions 73 in the substrate 61, and a current flows from the P+ semiconductor region 73-2 to the P+ semiconductor region 73-1.

In such a state, when infrared light (reflected light) from the outside enters the substrate 61 through the on-chip lens 62, and the infrared light is photoelectrically converted into a pair of electrons and holes in the substrate 61, the obtained electrons are guided in the direction of the P+ semiconductor region 73-2 by the electric field between the P+ semiconductor regions 73 and move into the N+ semiconductor region 71-2.

As a result, a charge corresponding to the electrons that have moved into the N+ semiconductor region 71-2 is accumulated in the N+ semiconductor region 71-2, and this charge is detected by the column processing unit 23 via the FD portion B, the amplification transistor, the vertical signal line 29, and the like.

That is, the accumulated charge DET1 in the N+ semiconductor region 71-2 is transferred to the FD portion B directly connected to the N+ semiconductor region 71-2, and the signal corresponding to the charge DET1 transferred to the FD portion B is read by the column processing unit 23 via the amplification transistor and the vertical signal line 29. Then, the column processing unit 23 applies processing such as AD conversion processing to the read signal, and a pixel signal obtained as a result of the processing is supplied to the signal processing unit 31.

Note that, at this time, the pixel signal corresponding to the electrons detected in the N+ semiconductor region 71-1 may be appropriately used for distance measurement, similarly to the case of the N+ semiconductor region 71-2.

When the pixel signals obtained by the photoelectric conversion in periods different from each other are obtained in the same pixel 51, the signal processing unit 31 calculates distance information indicating the distance to the object on the basis of the pixel signals and outputs the distance information to the subsequent stage.

Such a method of distributing the signal carriers to the N+ semiconductor regions 71 different from each other and calculating the distance information on the basis of the signals according to the signal carriers is called indirect ToF method.

Figure 3:
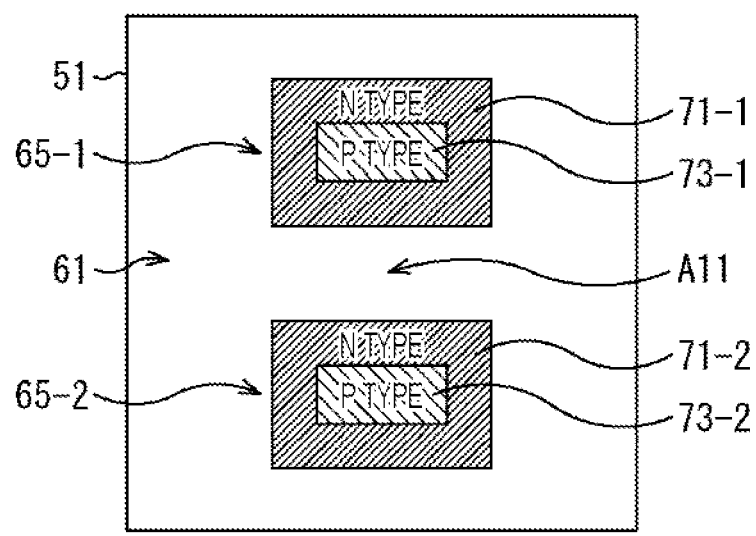
FIG. 3 is a view illustrating a configuration example of a signal extraction portion of a pixel.

When looking at the signal extraction portion 65 in the pixel 51 from a top-to-down direction in FIG. 2, that is, the direction perpendicular to the surface of the substrate 61, the signal extraction portion 65 has a structure in which the P+ semiconductor region 73 is surrounded by the N+ semiconductor region 71, as illustrated in FIG. 3, for example. Note that, in FIG. 3, a portion corresponding to the case in FIG. 2 is denoted by the same reference numeral, and description thereof is omitted as appropriate.

In the example illustrated in FIG. 3, the oxide film 64 (not illustrated) is formed in a central portion of the pixel 51, and the signal extraction portion 65 is formed in a portion on a slightly end side from the center of the pixel 51. In particular, here, the two signal extraction portions 65 are formed in the pixel 51.

Then, in each signal extraction portion 65, the P+ semiconductor region 73 is formed in a rectangular shape at a center position thereof, and a periphery of the P+ semiconductor region 73 as a center is surrounded by the N+ semiconductor region 71 having a rectangular shape, more specifically, a rectangular frame shape. That is, the N+ semiconductor region 71 is formed to surround the P+ semiconductor region 73.

Furthermore, in the pixel 51, the on-chip lens 62 is formed to condense the infrared light incident from the outside to the central portion of the pixel 51, that is, the portion indicated by the arrow A11. In other words, the infrared light incident on the on-chip lens 62 from the outside is condensed by the on-chip lens 62 at the position indicated by the arrow A11, that is, at an upper position in FIG. 2 of the oxide film 64 in FIG. 2.

Therefore, the infrared light is condensed at a position between the signal extraction portion 65-1 and the signal extraction portion 65-2. Thereby, it is possible to suppress the infrared light from entering the pixel adjacent to the pixel 51 and occurrence of crosstalk, and also suppress the infrared light from directly entering the signal extraction portion 65.

For example, if infrared light directly enters the signal extraction portion 65, the charge separation efficiency, that is, contrast between active and inactive taps (Cmod) and modulation contrast will decrease.

Here, the signal extraction portion 65 from which the signal according to the charge DET obtained by the photoelectric conversion is read, that is, the signal extraction portion 65 on which the charge DET obtained by the photoelectric conversion should be detected is also referred to as active tap.

On the contrary, basically, the signal extraction portion 65 from which the signal according to the charge DET obtained by the photoelectric conversion is not read, that is, the signal extraction portion 65 that is not the active tap is also referred to as inactive tap.

In the above-described example, the signal extraction portion 65 in which the voltage of 1.5 V is applied to the P+ semiconductor region 73 is the active tap, and the signal extraction portion 65 in which the voltage of 0 V is applied to the P+ semiconductor region 73 is the inactive tap.

The Cmod is calculated by the following expression (1), is an index representing what percentage of the charge generated by the photoelectric conversion of the incident infrared light can be detected in the N+ semiconductor region 71 of the signal extraction portion 65 that is the active tap, that is, whether the signal according to the charge can be extracted, and indicates the charge separation efficiency. In the expression (1), I0 represents the signal detected in one of the two charge detection portions (P+ semiconductor regions 73), and I1 represents the signal detected in the other charge detection portion.

$$Cmod = \{|I0-I1|/(I0+I1)\} \times 100 \quad (1)$$

Therefore, for example, when the infrared light incident from the outside enters the region of the inactive tap and is photoelectrically converted in the inactive tap, there is a high possibility that the electrons as the signal carrier generated by the photoelectric conversion move to the N+ semiconductor region 71 in the inactive tap. Then, the charge of some of the electrons obtained by the photoelectric conversion is not detected in the N+ semiconductor region 71 in the active tap, and the Cmod, that is, the charge separation efficiency decreases.

Therefore, in the pixel 51, the infrared light is condensed near the central portion of the pixel 51, the central portion being located at a substantially equal distance from the two signal extraction portions 65, whereby the probability that the infrared light incident from the outside is photoelectrically converted in the region of the inactive tap is reduced, and the charge separation efficiency can be improved. Furthermore, the modulation contrast can be improved in the pixel 51. In other words, the electrons obtained by the photoelectric conversion can be easily guided to the N+ semiconductor region 71 in the active tap.

According to the above light-receiving element 1, the following effects can be exerted.

That is, first, since the light-receiving element 1 is a back-illuminated type, the light-receiving element 1 can maximize quantum efficiency (QE)×an aperture ratio (fill factor (FF)) and can improve distance-measuring characteristics by the light-receiving element 1.

Figure 4:
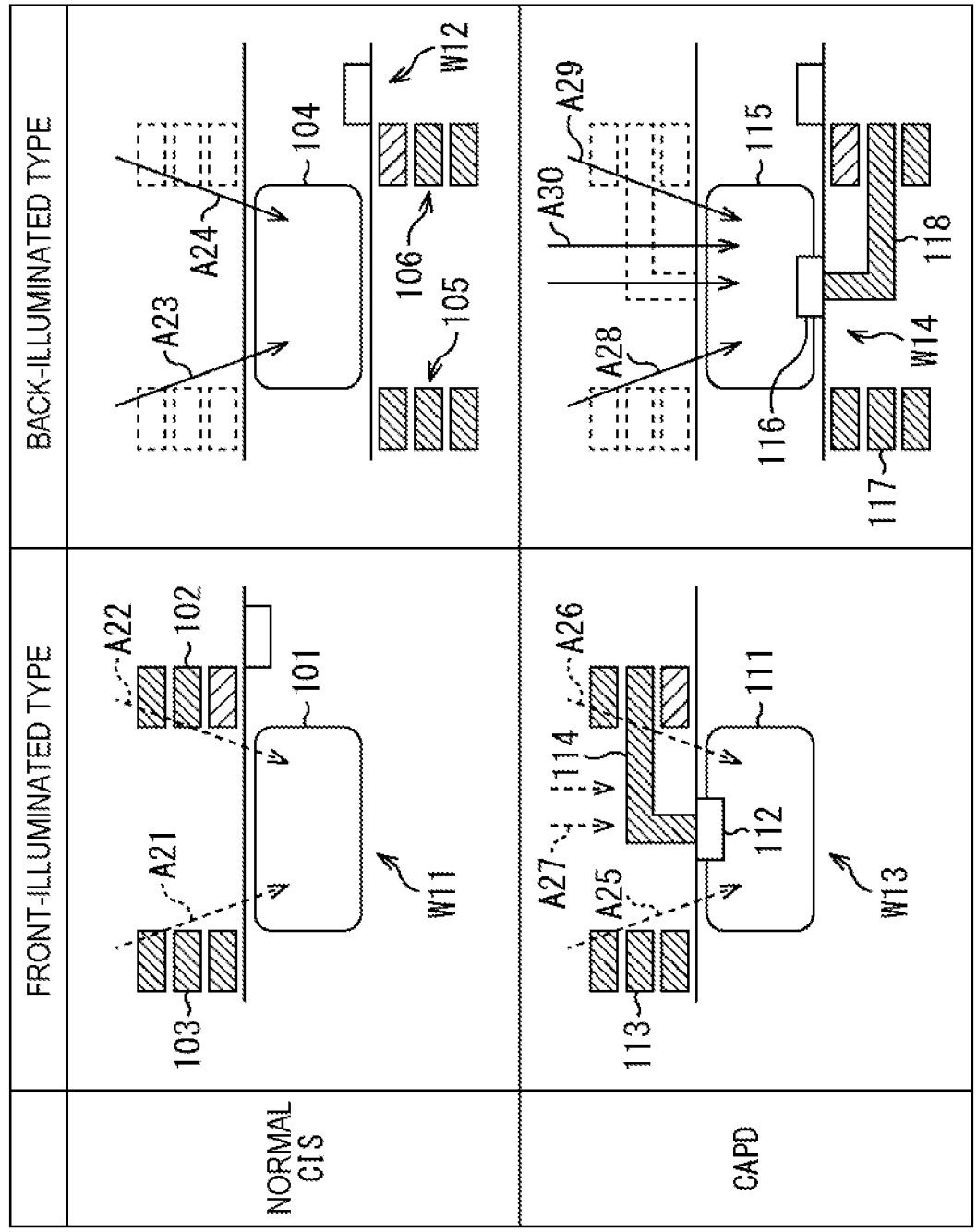
FIG. 4 is a diagram for describing sensitivity improvement.

For example, as illustrated by the arrow W11 in FIG. 4, a normal front-illuminated image sensor has a structure in which wiring 102 and wiring 103 are formed on a light incident surface side on which light from the outside is incident of a PD 101 as a photoelectric conversion unit.

Therefore, for example, some of light obliquely entering the PD 101 at certain angles as illustrated by the arrows A21 and A22 from the outside are blocked by the wiring 102 and the wiring 103 and do not enter the PD 101.

In contrast, a back-illuminated image sensor has a structure in which wiring 105 and wiring 106 are formed on a surface opposite to the light incident surface on which the light from the outside is incident of a PD 104 as a photoelectric conversion unit, as illustrated by the arrow W12, for example.

Therefore, a sufficient aperture ratio can be secured as compared with the case of the front-illuminated type. That is, for example, light obliquely entering the PD 104 at certain angles as illustrated by the arrows A23 and A24 from the outside enters the PD 104 without being blocked by the wiring. Thereby, more light can be received and the sensitivity of the pixel can be improved.

Such an effect of improving the pixel sensitivity, which is obtained by the back-illuminated type configuration, can also be obtained in the light-receiving element 1 that is the back-illuminated CAPD sensor.

Furthermore, in the front-illuminated CAPD sensor, for example, a signal extraction portion 112 called tap, more specifically, a P+ semiconductor region and an N+ semiconductor region of the tap, are formed inside a PD 111 as a photoelectric conversion unit on the light incident surface on which the light from the outside is incident, as illustrated by the arrow W13. Furthermore, the front-illuminated CAPD sensor has the structure in which the wiring 113, and the wiring 114 such as a contact or a metal connected to the signal extraction portion 112 are formed on the light incident surface.

Therefore, for example, some of light obliquely entering the PD 111 at certain angles as illustrated by the arrows A25 and A26 from the outside are blocked by the wiring 113 and the like and do not enter the PD 111, and in addition, the light perpendicularly entering the PD 111 as illustrated by the arrow A27 is also blocked by the wiring 114 and does not enter the PD 111.

In contrast, for example, the back-illuminated CAPD sensor has a structure in which a signal extraction portion 116 is formed in a surface portion in a PD 115 as a photoelectric conversion unit, the surface portion being opposite to the light incident surface on which the light from the outside is incident, as illustrated by the arrow W14. Furthermore, wiring 117, and wiring 118 such as a contact or a metal connected to a signal extraction portion 116 are formed on the surface opposite to the light incident surface of the PD 115.

Here, the PD 115 corresponds to the substrate 61 illustrated in FIG. 2, and the signal extraction portion 116 corresponds to the signal extraction portion 65 illustrated in FIG. 2.

The back-illuminated CAPD sensor having such a structure can secure a sufficient aperture ratio as compared with the case of the front-illuminated CAPD sensor. Therefore, the quantum efficiency (QE)×the aperture ratio (FF) can be maximized, and the distance-measuring characteristics can be improved.

That is, for example, light obliquely entering the PD 115 at certain angles as illustrated by the arrows A28 and A29 from the outside enters the PD 115 without being blocked by the wiring. Similarly, light perpendicularly entering the PD 115 enters the PD 115 without being blocked by the wiring or the like, as illustrated by the arrow A30.

As described above, the back-illuminated CAPD sensor can receive not only the light incident at a certain angle but also the light perpendicularly entering the PD 115, which is reflected by the wiring or the like connected to the signal extraction portion (tap) in the front-illuminated CAPD sensor. Thereby, more light can be received and the sensitivity of the pixel can be improved. In other words, the quantum efficiency (QE)×the aperture ratio (FF) can be maximized, and as a result, the distance-measuring characteristics can be improved.

In particular, in the case where the tap is arranged near the center of the pixel instead of an outer edge of the pixel, the front-illuminated CAPD sensor cannot secure a sufficient aperture ratio and the sensitivity of the pixel decreases, whereas the light-receiving element 1 that is the back-illuminated CAPD sensor can secure the sufficient aperture ratio regardless of the arrangement position of the tap and can improve the pixel sensitivity.

Furthermore, in the back-illuminated light-receiving element 1, the signal extraction portion 65 is formed near the surface opposite to the light incident surface on which the infrared light from the outside is incident, in the substrate 61. Therefore, occurrence of the photoelectric conversion for the infrared light in the inactive tap region can be reduced. Thereby, the Cmod, that is, the charge separation efficiency can be improved.

FIG. 5 illustrates cross-sectional views of front-illuminated and back-illuminated CAPD sensors of pixels.

In the front-illuminated CAPD sensor on the left side in FIG. 5, an upper side of a substrate 141 in FIG. 5 is the light incident surface, and a wiring layer 152 including wiring of a plurality of layers, an inter-pixel light-shielding portion 153, and an on-chip lens 154 are stacked on the light incident surface side of the substrate 141.

In the back-illuminated CAPD sensor on the right side in FIG. 5, the wiring layer 152 including wiring of a plurality of layers is formed on a lower side of a substrate 142, which is opposite to the light incident surface in FIG. 5, and the inter-pixel light-shielding portion 153 and the on-chip lens 154 are stacked on an upper side of the substrate 142 that is the light incident surface.

Note that the gray trapezoidal shapes in FIG. 5 illustrate regions with strong light intensity due to the on-chip lens 154 condensing the infrared light.

For example, the front-illuminated CAPD sensor has a region R11 in which an inactive tap and an active tap are present on the light incident surface of the substrate 141. Therefore, when a lot of components directly enter the inactive tap and are photoelectrically converted in the inactive tap region, the signal carrier obtained by the photoelectric conversion is not detected in the N+ semiconductor region of the active tap.

In the front-illuminated CAPD sensor, the intensity of the infrared light is strong in the region R11 near the light incident surface of the substrate 141, and thus a probability that the infrared light is photoelectrically converted in the region R11 is high. That is, since the amount of infrared light entering the vicinity of the inactive tap is large, signal carriers that cannot be detected in the active tap increases, and the charge separation efficiency decreases.

In contrast, the back-illuminated CAPD sensor has a region R12 in which an inactive tap and an active tap are present at a position distant from the light incident surface of the substrate 142, that is, a position near the surface opposite to the light incident surface. Here, the substrate 142 corresponds to the substrate 61 illustrated in FIG. 2.

In this example, the region R12 is located in a portion of the surface opposite to the light incident surface of the substrate 142, and is located at the position distant from the light incident surface. Therefore, the intensity of the incident infrared light is relatively weak near the region R12.

The signal carrier obtained by the photoelectric conversion in the region with strong intensity of the infrared light, such as the region near the center of the substrate 142 and the vicinity of the light incident surface, is guided to the active tap by an electric field generated in the substrate 142 and is detected in the N+ semiconductor region of the active tap.

Meanwhile, the intensity of the incident infrared light is relatively weak near the region R12 including the inactive tap, and thus the probability that the infrared light is photoelectrically converted in the region R12 is low. That is, since the amount of infrared light entering the vicinity of the inactive tap is small, the number of signal carriers (electrons) generated by the photoelectric conversion in the vicinity of the inactive tap and move to the N+ semiconductor region of the inactive tap becomes small, and the charge separation efficiency can be improved. As a result, the distance-measuring characteristics can be improved.

Moreover, in the back-illuminated light-receiving element 1, the substrate 61 can be thinned. Therefore, efficiency of extracting electrons (charges) as signal carriers can be improved.

Figure 6:
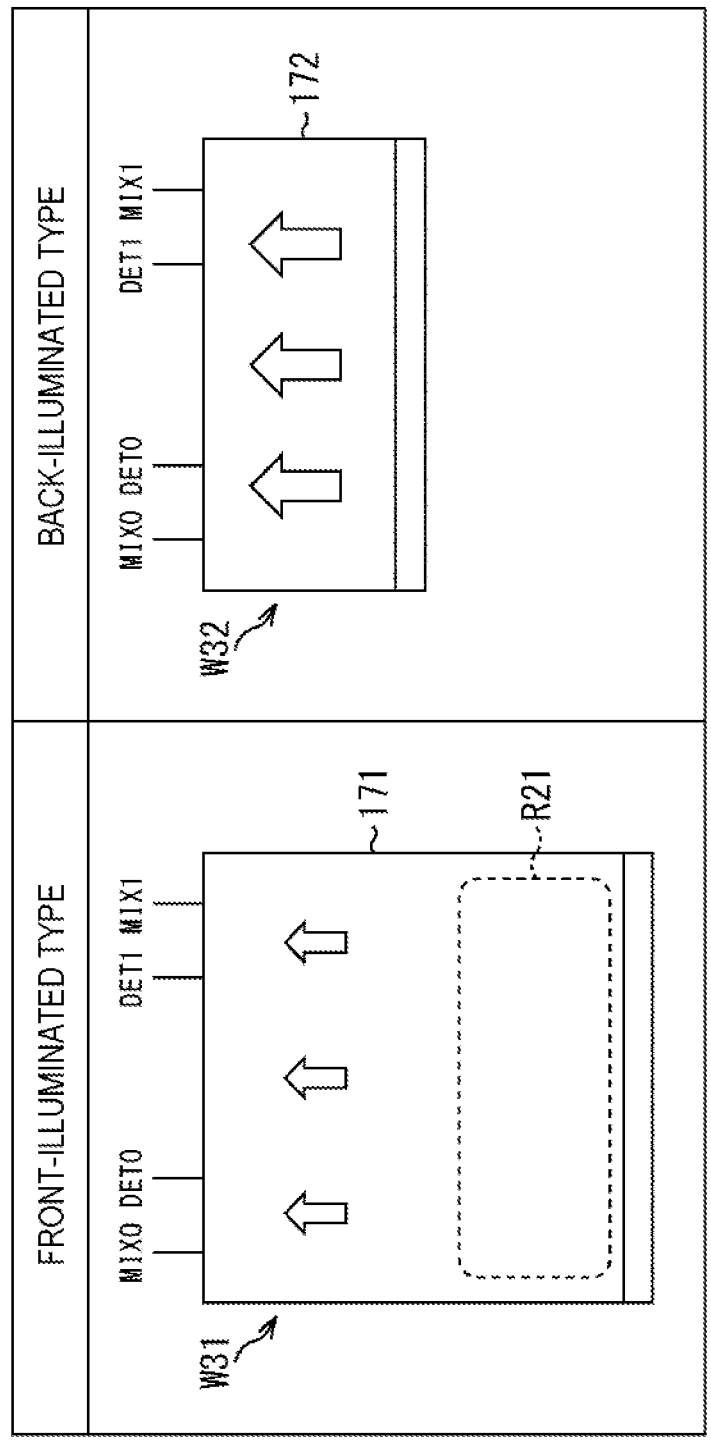
FIG. 6 is a view for describing improvement of electron extraction efficiency.

For example, since the front-illuminated CAPD sensor cannot sufficiently secure the aperture ratio, a substrate 171 needs to be thickened to some extent to secure higher quantum efficiency and suppress the decrease in the quantum efficiency×the aperture ratio, as illustrated by the arrow W31 in FIG. 6.

Then, inclination of a potential becomes gentle in the region of the substrate 171 near the surface opposite to the light incident surface, for example, in a region R21, and the electric field in the direction substantially perpendicular to the substrate 171 becomes weak. In this case, since a moving speed of the signal carrier becomes slow, the time required from the photoelectric conversion to the detection of the signal carrier in the N+ semiconductor region of the active tap becomes long. Note that, in FIG. 6, the arrows in the substrate 171 represent the electric field in the substrate 171 in the direction perpendicular to the substrate 171.

Furthermore, when the substrate 171 is thick, a moving distance of the signal carrier from the position distant from the active tap in the substrate 171 to the N+ semiconductor region in the active tap becomes long. Therefore, at the position distant from the active tap, the time required from the photoelectric conversion to the detection of the signal carrier in the N+ semiconductor region of the active tap becomes longer.

FIG. 7 illustrates a relationship between the position of the substrate 171 in a thickness direction and the moving speed of the signal carrier. The region R21 corresponds to a diffusion current region.

When the substrate 171 is thick in this manner, for example, the electrons generated at the position distant from the active tap such as the region R21 cannot be completely drawn into the N+ semiconductor region of the active tap when a drive frequency is high, that is, when switching of the active tap and the inactive tap of the signal extraction portion is performed at a high speed. That is, if the time in which the tap is active is short, the electrons (charges) generated in the region R21 or the like cannot be detected in the N+ semiconductor region of the active tap, and the electron extraction efficiency decreases.

In contrast, the back-illuminated CAPD sensor can secure the sufficient aperture ratio, and thus can secure the sufficient quantum efficiency×aperture ratio even if a substrate 172 is thinned, as illustrated by the arrow W32 in FIG. 6, for example. Here, the substrate 172 corresponds to the substrate 61 in FIG. 2, and the arrows in the substrate 172 represent the electric field in the direction perpendicular to the substrate 172.

Figure 8:
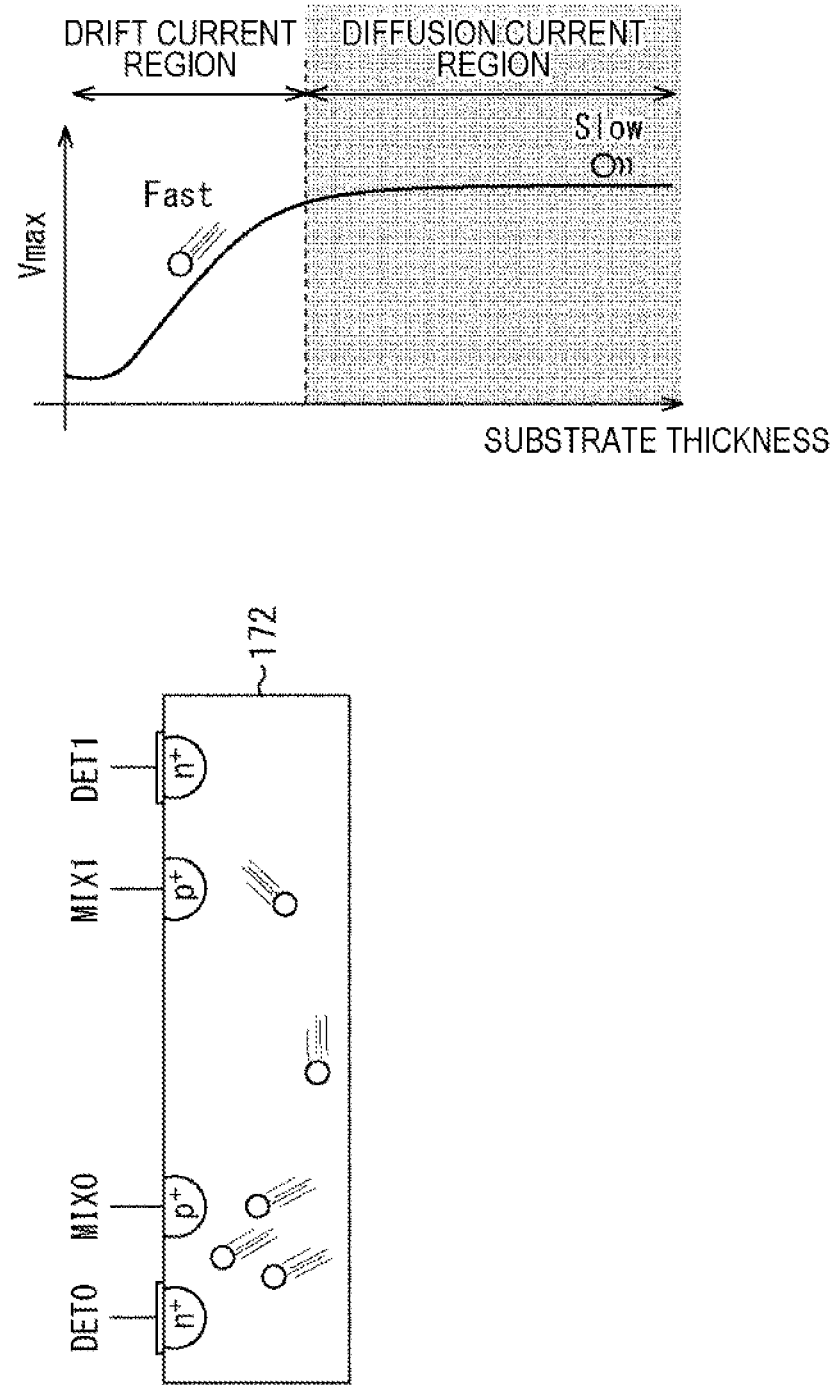
FIG. 8 is a diagram for describing a moving speed of a signal carrier in a back-illuminated type.

FIG. 8 illustrates a relationship between the position of the substrate 172 in the thickness direction and the moving speed of the signal carrier.

When the thickness of the substrate 172 in the direction perpendicular to the substrate 172 is thinned in this manner, the electric field in the direction perpendicular to the substrate 172 becomes substantially strong, and only the electrons (charges) only in a drift current region where the moving speed of the signal carrier is fast are used and the electrons in the diffusion current region where the moving speed of the signal carrier is slow are not used. By using only the electrons (charges) only in the drift current region, the time required from the photoelectric conversion to the detection of the signal carrier in the N+ semiconductor region of the active tap becomes short. Furthermore, the moving distance of the signal carrier to the N+ semiconductor region in the active tap becomes shorter as the thickness of the substrate 172 becomes thinner.

From the above facts, the back-illuminated CAPD sensor can sufficiently draw the signal carriers (electrons) generated in each region in the substrate 172 into the N+ semiconductor region of the active tap even if the drive frequency is high, and can improve the electron extraction efficiency.

Furthermore, the back-illuminated CAPD sensor can secure the electron extraction efficiency with the thinned substrate 172 even in the case of a high drive frequency and can improve high-speed drive resistance.

In particular, the back-illuminated CAPD sensor can directly apply the voltage to the substrate 172, that is, the substrate 61, and thus has a high response speed of switching the active tap and the inactive tap, and can be driven at a high drive frequency. Furthermore, since the back-illuminated CAPD sensor can directly apply the voltage to the substrate 61, a modifiable region in the substrate 61 becomes wide.

Moreover, since the back-illuminated light-receiving element 1 (CAPD sensor) can obtain the sufficient aperture ratio, the pixels can be miniaturized, and pixel miniaturization resistance can be improved.

In addition, by adopting the back-illuminated type for the light-receiving element 1, a back end of Line (BEOL) capacitance design can be liberalized, which can improve the design freedom of a saturation signal amount (Qs).

<Modification 1 of First Embodiment>
<Configuration Example of Pixel>

Note that, in the above description, the case where the signal extraction portion 65 in the substrate 61 has the rectangular N+ semiconductor region 71 and P+ semiconductor region 73 has been described as an example, as illustrated in FIG. 3. However, the shapes of the N+ semiconductor region 71 and the P+ semiconductor region 73 as viewed from the direction perpendicular to the substrate 61 can be any shapes.

Figure 9:
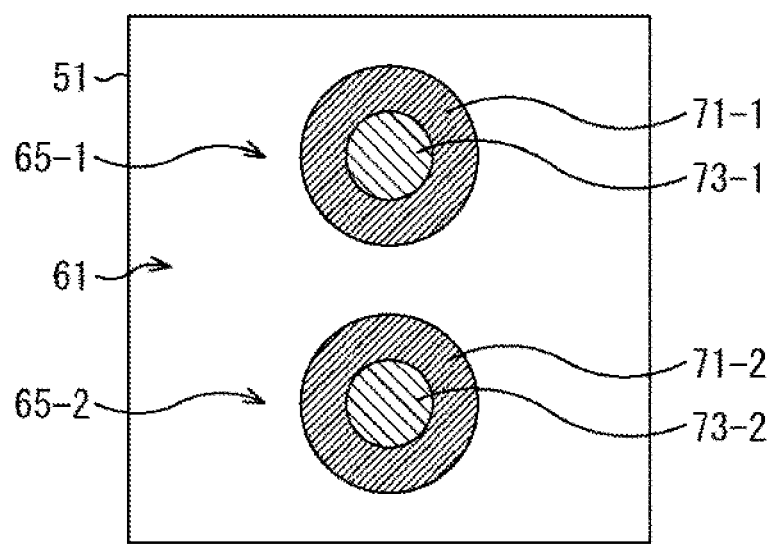
FIG. 9 is a view illustrating another configuration example of the signal extraction portion of a pixel.

Specifically, for example, as illustrated in FIG. 9, the N+ semiconductor region 71 and the P+ semiconductor region 73 can have circular shapes. Note that, in FIG. 9, a portion corresponding to the case in FIG. 3 is denoted by the same reference numeral, and description thereof is omitted as appropriate.

FIG. 9 illustrates the N+ semiconductor region 71 and the P+ semiconductor region 73 when the signal extraction portions 65 in the pixel 51 are viewed from the direction perpendicular to the substrate 61.

In the example, the oxide film 64 (not illustrated) is formed in the central portion of the pixel 51, and the signal extraction portion 65 is formed in a portion on a slightly end side from the center of the pixel 51. In particular, here, the two signal extraction portions 65 are formed in the pixel 51.

Then, in each signal extraction portion 65, the circular P+ semiconductor region 73 is formed at a center position thereof, and a periphery of the P+ semiconductor region 73 as a center is surrounded by the N+ semiconductor region 71 having a circular shape, more specifically, an annular shape.

Figure 10:
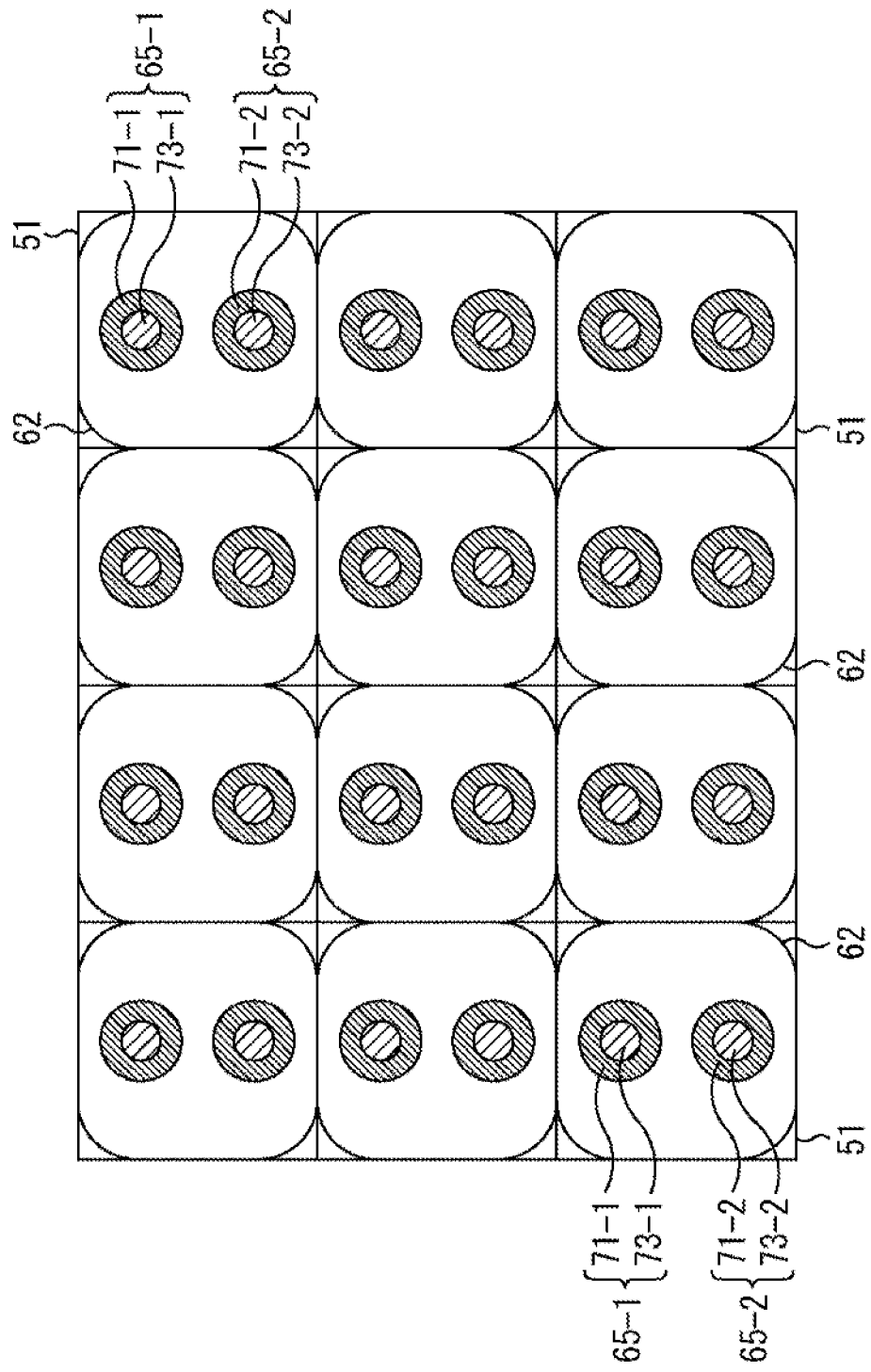
FIG. 10 is a view for describing a relationship between a pixel and an on-chip lens.

FIG. 10 is a plan view in which the on-chip lens 62 is superimposed on a part of the pixel array unit 20 having the pixels 51 each including the signal extraction portions 65 illustrated in FIG. 9 two-dimensionally arranged in a matrix.

The on-chip lens 62 is formed on a pixel basis as illustrated in FIG. 10. In other words, a unit region in which one on-chip lens 62 is formed corresponds to one pixel.

Note that, in FIG. 2, a separation portion 75 formed using an oxide film and the like is arranged between the N+ semiconductor region 71 and the P+ semiconductor region 73. However, the separation portion 75 may or may not be present.

<Modification 2 of First Embodiment>
<Configuration Example of Pixel>

Figure 11:
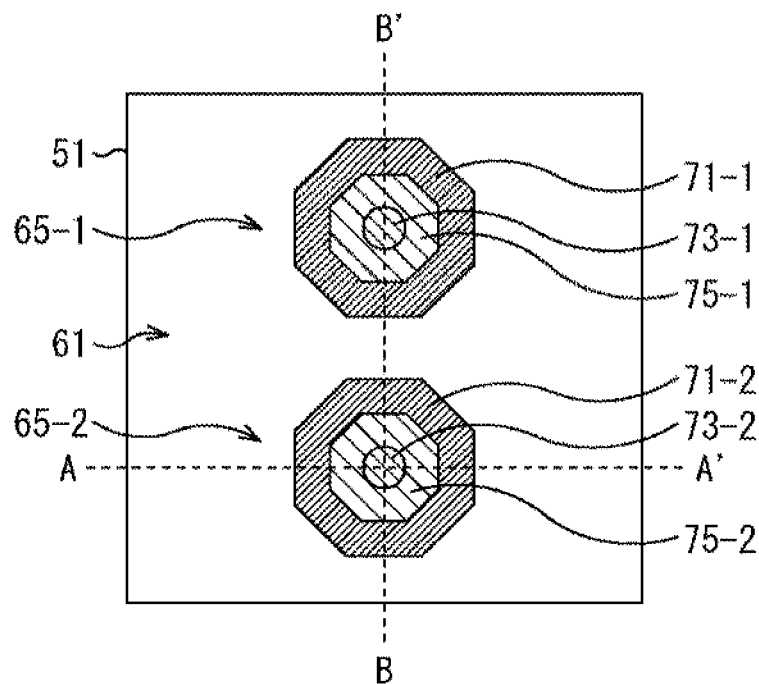
FIG. 11 is a view illustrating another configuration example of a signal extraction portion of a pixel.

FIG. 11 is a plan view illustrating a modification of the planar shape of the signal extraction portion 65 in the pixel 51.

The signal extraction portion 65 may have a shape obtained by forming the planar shape into a rectangular shape illustrated in FIG. 3, a circular shape illustrated in FIG. 9, or an octagonal shape illustrated in FIG. 11, for example.

Furthermore, FIG. 11 illustrates a plan view of a case where the separation portion 75 formed using an oxide film and the like is formed between the N+ semiconductor region 71 and the P+ semiconductor region 73.

The line A-A' illustrated in FIG. 11 represents the cross-sectional line in FIG. 37 to be described below, and the line B-B' represents the cross-sectional line in FIG. 36 to be described below.

Second Embodiment

<Configuration Example of Pixel>

Moreover, the configuration in which the P+ semiconductor region 73 is surrounded by the N+ semiconductor region 71 in the signal extraction portion 65 has been described as an example. However, an N+ semiconductor region may be surrounded by a P+ semiconductor region.

Figure 12:
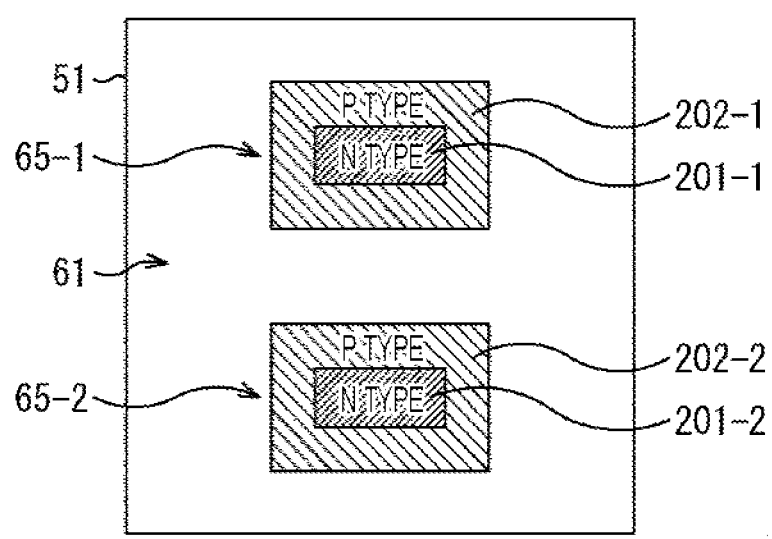
FIG. 12 is a view illustrating another configuration example of a signal extraction portion of a pixel.

In such a case, a pixel 51 is configured as illustrated in FIG. 12, for example. Note that, in FIG. 12, a portion corresponding to the case in FIG. 3 is denoted by the same reference numeral, and description thereof is omitted as appropriate.

FIG. 12 illustrates arrangement of the N+ semiconductor regions and the P+ semiconductor regions when signal extraction portions 65 in the pixel 51 are viewed from a direction perpendicular to a substrate 61.

In this example, an oxide film 64 (not illustrated) is formed in a central portion of the pixel 51, and a signal extraction portion 65-1 is formed in a slightly upper portion from the center of the pixel 51 and a signal extraction portion 65-2 is formed in a slightly lower portion from the center of the pixel 51. In particular, in this example, formation positions of the signal extraction portions 65 in the pixel 51 are the same position as in the case in FIG. 3.

In the signal extraction portion 65-1, a rectangular N+ semiconductor region 201-1 corresponding to the N+ semiconductor region 71-1 illustrated in FIG. 3 is formed in the center of the signal extraction portion 65-1. Then, the N+ semiconductor region 201-1 is surrounded by a P+ semiconductor region 202-1 having a rectangular shape, more specifically, a rectangular frame shape corresponding to the P+ semiconductor region 73-1 illustrated in FIG. 3. That is, the P+ semiconductor region 202-1 is formed to surround the N+ semiconductor region 201-1.

Similarly, in the signal extraction portion 65-2, a rectangular N+ semiconductor region 201-2 corresponding to the N+ semiconductor region 71-2 illustrated in FIG. 3 is formed in the center of the signal extraction portion 65-2. Then, the N+ semiconductor region 201-2 is surrounded by a P+ semiconductor region 202-2 having a rectangular shape, more specifically, a rectangular frame shape corresponding to the P+ semiconductor region 73-2 illustrated in FIG. 3.

Note that, hereinafter, in a case where there is no need to distinguish the N+ semiconductor region 201-1 and the N+ semiconductor region 201-2, they are also simply referred to as N+ semiconductor region(s) 201. Furthermore, hereinafter, in a case where there is no need to distinguish the P+ semiconductor region 202-1 and the P+ semiconductor region 202-2, they are also simply referred to as P+ semiconductor region(s) 202.

Even in the case where the signal extraction portions 65 have the configuration illustrated in FIG. 12, the N+ semiconductor region 201 functions as a charge detection portion for detecting an amount of signal carriers, and the P+ semiconductor region 202 functions as a voltage application portion for directly applying a voltage to the substrate 61 to generate an electric field, similarly to the case of the configuration illustrated in FIG. 3.

<Modification 1 of Second Embodiment>
<Configuration Example of Pixel>

Furthermore, similarly to the example illustrated in FIG. 9, the N+ semiconductor region 201 and the P+ semiconductor region 202 can have any shapes even in the case of the arrangement in which the N+ semiconductor region 201 is surrounded by the P+ semiconductor region 202.

Figure 13:
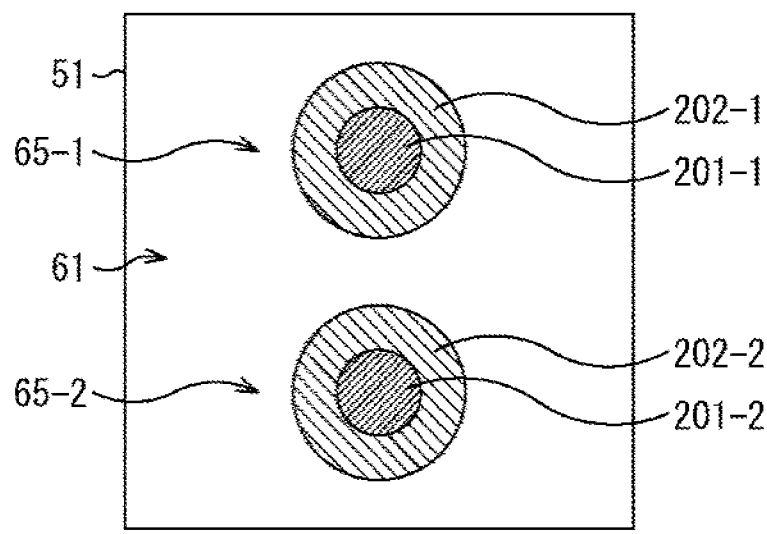
FIG. 13 is a view illustrating another configuration example of a signal extraction portion of a pixel.

That is, for example, as illustrated in FIG. 13, the N+ semiconductor region 201 and the P+ semiconductor region 202 can have circular shapes. Note that, in FIG. 13, a portion corresponding to the case in FIG. 12 is denoted by the same reference numeral, and description thereof is omitted as appropriate.

FIG. 13 illustrates an N+ semiconductor region 201 and a P+ semiconductor region 202 when signal extraction portions 65 in a pixel 51 are viewed from a direction perpendicular to a substrate 61.

In the example, the oxide film 64 (not illustrated) is formed in the central portion of the pixel 51, and the signal extraction portion 65 is formed in a portion on a slightly end side from the center of the pixel 51. In particular, here, the two signal extraction portions 65 are formed in the pixel 51.

Then, in each signal extraction portion 65, the circular N+ semiconductor region 201 is formed at a center position thereof, and a periphery of the N+ semiconductor region 201 as a center is surrounded by the P+ semiconductor region 202 having a circular shape, more specifically, an annular shape.

Third Embodiment

<Configuration Example of Pixel>

Moreover, an N+ semiconductor region and a P+ semiconductor region formed in a signal extraction portion 65 may have a line shape (rectangular shape).

Figure 14:
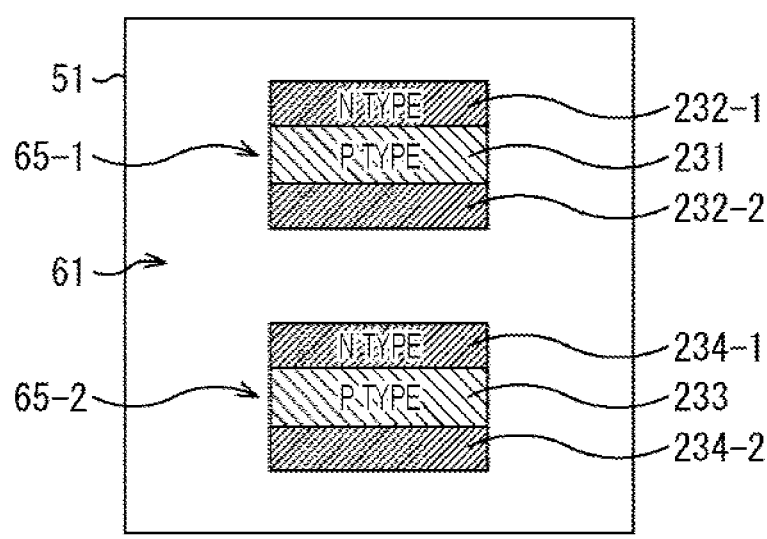
FIG. 14 is a view illustrating another configuration example of a signal extraction portion of a pixel.

In such a case, for example, a pixel 51 is configured as illustrated in FIG. 14. Note that, in FIG. 14, a portion corresponding to the case in FIG. 3 is denoted by the same reference numeral, and description thereof is omitted as appropriate.

FIG. 14 illustrates arrangement of the N+ semiconductor regions and the P+ semiconductor regions when signal extraction portions 65 in the pixel 51 are viewed from a direction perpendicular to a substrate 61.

In this example, an oxide film 64 (not illustrated) is formed in a central portion of the pixel 51, and a signal extraction portion 65-1 is formed in a slightly upper portion from the center of the pixel 51 and a signal extraction portion 65-2 is formed in a slightly lower portion from the center of the pixel 51. In particular, in this example, formation positions of the signal extraction portions 65 in the pixel 51 are the same position as in the case in FIG. 3.

In the signal extraction portion 65-1, a P+ semiconductor region 231 having a line shape corresponding to the P+ semiconductor region 73-1 illustrated in FIG. 3 is formed in the center of the signal extraction portion 65-1. Then, an N+ semiconductor region 232-1 and an N+ semiconductor region 232-2 having a line shape corresponding to the N+ semiconductor region 71-1 illustrated in FIG. 3 are formed around the P+ semiconductor region 231 to sandwich the P+ semiconductor region 231. That is, the P+ semiconductor region 231 is formed at a position sandwiched by the N+ semiconductor region 232-1 and the N+ semiconductor region 232-2.

Note that, hereinafter, in a case where there is no need to distinguish the N+ semiconductor region 232-1 and the N+ semiconductor region 232-2, they are also simply referred to as N+ semiconductor region(s) 232.

FIG. 3 illustrates the example of the structure in which the P+ semiconductor region 73 is surrounded by the N+ semiconductor region 71. However, FIG. 14 illustrates an example of a structure in which the P+ semiconductor region 231 is sandwiched by the adjacently provided two N+ semiconductor regions 232.

Similarly, In the signal extraction portion 65-2, a P+ semiconductor region 233 having a line shape corresponding to the P+ semiconductor region 73-2 illustrated in FIG. 3 is formed in the center of the signal extraction portion 65-2. Then, an N+ semiconductor region 234-1 and an N+ semiconductor region 234-2 having a line shape corresponding to the N+ semiconductor region 71-2 illustrated in FIG. 3 are formed around the P+ semiconductor region 233 to sandwich the P+ semiconductor region 233.

Note that, hereinafter, in a case where there is no need to distinguish the N+ semiconductor region 234-1 and the N+ semiconductor region 234-2, they are also simply referred to as N+ semiconductor region(s) 234.

In the signal extraction portions 65 in FIG. 14, the P+ semiconductor region 231 and the P+ semiconductor region 233 function as voltage application portions corresponding to the P+ semiconductor regions 73 illustrated in FIG. 3, and the N+ semiconductor regions 232 and the N+ semiconductor regions 234 function as charge detection portions corresponding to the N+ semiconductor regions 71 illustrated in FIG. 3. In this case, for example, both the N+ semiconductor region 232-1 and the N+ semiconductor region 232-2 are connected to an FD portion A.

Furthermore, each of the P+ semiconductor region 231, the N+ semiconductor regions 232, the P+ semiconductor region 233, and the N+ semiconductor regions 234 having the line shape may have any length in a cross direction in FIG. 14, or each of these regions may not have the same length.

Fourth Embodiment

<Configuration Example of Pixel>

Moreover, in the example illustrated in FIG. 14, the structure in which the P+ semiconductor region 231 and the P+ semiconductor region 233 are sandwiched by the N+ semiconductor regions 232 and the N+ semiconductor regions 234 has been described as an example. However, conversely, an N+ semiconductor region may be sandwiched by P+ semiconductor regions.

Figure 15:
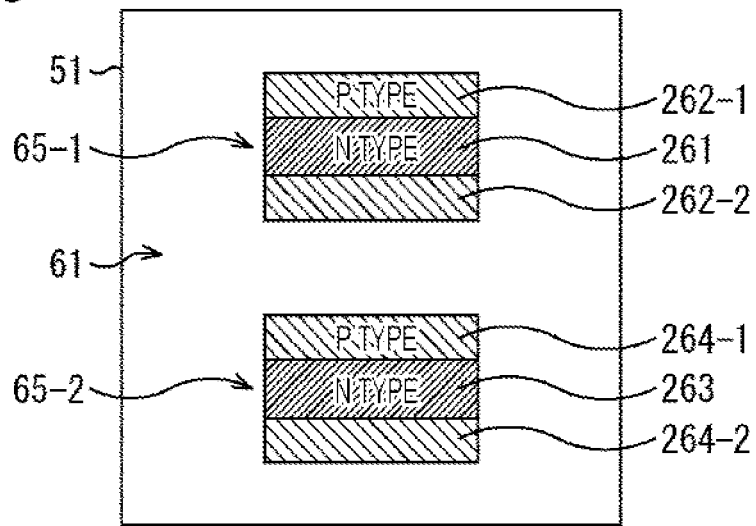
FIG. 15 is a view illustrating another configuration example of a signal extraction portion of a pixel.

In such a case, for example, a pixel 51 is configured as illustrated in FIG. 15. Note that, in FIG. 15, a portion corresponding to the case in FIG. 3 is denoted by the same reference numeral, and description thereof is omitted as appropriate.

FIG. 15 illustrates arrangement of the N+ semiconductor regions and the P+ semiconductor regions when signal extraction portions 65 in a pixel 51 are viewed from a direction perpendicular to a substrate 61.

In the example, the oxide film 64 (not illustrated) is formed in the central portion of the pixel 51, and the signal extraction portion 65 is formed in a portion on a slightly end side from the center of the pixel 51. In particular, in this example, formation positions of each of the two signal extraction portions 65 in the pixel 51 are the same position as in the case in FIG. 3.

In a signal extraction portion 65-1, an N+ semiconductor region 261 having a line shape corresponding to the N+ semiconductor region 71-1 illustrated in FIG. 3 is formed in the center of the signal extraction portion 65-1. Then, a P+ semiconductor region 262-1 and a P+ semiconductor region 262-2 having a line shape corresponding to the P+ semiconductor region 73-1 illustrated in FIG. 3 are formed around the N+ semiconductor region 261 to sandwich the N+ semiconductor region 261. That is, the N+ semiconductor region 261 is formed at a position sandwiched by the P+ semiconductor region 262-1 and the P+ semiconductor region 262-2.

Note that, hereinafter, in a case where there is no need to distinguish the P+ semiconductor region 262-1 and the P+ semiconductor region 262-2, they are also simply referred to as P+ semiconductor region(s) 262.

Similarly, in a signal extraction portion 65-2, an N+ semiconductor region 263 having a line shape corresponding to the N+ semiconductor region 71-2 illustrated in FIG. 3 is formed in the center of the signal extraction portion 65-2. Then, a P+ semiconductor region 264-1 and a P+ semiconductor region 264-2 having a line shape corresponding to the P+ semiconductor region 73-2 illustrated in FIG. 3 are formed around the N+ semiconductor region 263 to sandwich the N+ semiconductor region 263.

Note that, hereinafter, in a case where there is no need to distinguish the P+ semiconductor region 264-1 and the P+ semiconductor region 264-2, they are also simply referred to as P+ semiconductor region(s) 264.

In the signal extraction portions 65 in FIG. 15, the P+ semiconductor region 262 and the P+ semiconductor region 264 function as voltage application portions corresponding to the P+ semiconductor regions 73 illustrated in FIG. 3, and the N+ semiconductor regions 261 and the N+ semiconductor regions 263 function as charge detection portions corresponding to the N+ semiconductor regions 71 illustrated in FIG. 3. Note that, each of the N+ semiconductor region 261, the P+ semiconductor regions 262, the N+ semiconductor region 263, and the P+ semiconductor regions 264 having the line shape may have any length in a cross direction in FIG. 15, or each of these regions may not have the same length.

Fifth Embodiment

<Configuration Example of Pixel>

Moreover, in the above description, the examples in which two signal extraction portions 65 are provided in each pixel constituting the pixel array unit 20 have been described. However, the number of signal extraction portions provided in a pixel may be one, or may be three or more.

Figure 16:
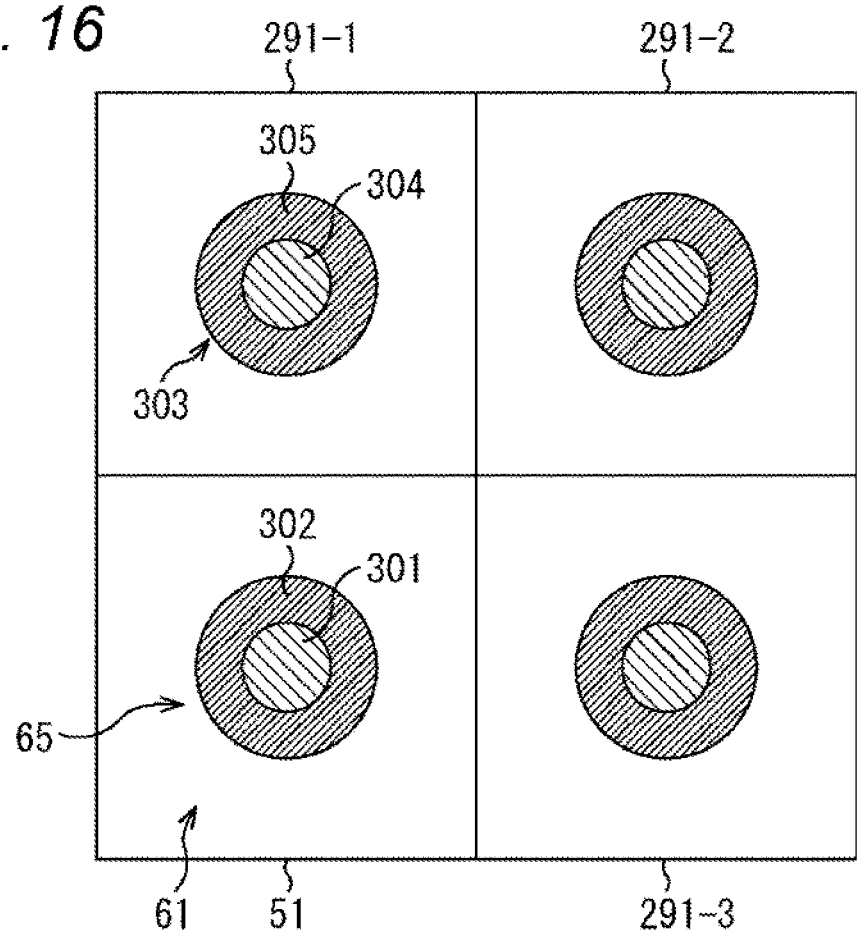
FIG. 16 is a view illustrating another configuration example of the pixel.

In a case where one signal extraction portion is formed in a pixel 51, for example, the pixel is configured as illustrated in FIG. 16 or the like. Note that, in FIG. 16, a portion corresponding to the case in FIG. 3 is denoted by the same reference numeral, and description thereof is omitted as appropriate.

FIG. 16 illustrates arrangement of N+ semiconductor regions and P+ semiconductor regions when signal extraction portions in some pixels provided in a pixel array unit 20 are viewed from a direction perpendicular to a substrate.

In this example, the pixel 51 provided in the pixel array unit 20, and pixels 291-1 to 291-3 distinguishably denoted as pixels 51 adjacent to the aforementioned pixel 51, and one signal extraction portion is formed in each pixel.

That is, in the pixel 51, one signal extraction portion 65 is formed in a central portion of the pixel 51. Then, in the signal extraction portion 65, a circular P+ semiconductor region 301 is formed at a center position thereof, and a periphery of the P+ semiconductor region 301 as a center is surrounded by an N+ semiconductor region 302 having a circular shape, more specifically, an annular shape.

Here, the P+ semiconductor region 301 corresponds to the P+ semiconductor region 73 illustrated in FIG. 3 and functions as a voltage application portion. Furthermore, the N+ semiconductor region 302 corresponds to the N+ semiconductor region 71 illustrated in FIG. 3 and functions as a charge detection portion. Note that the P+ semiconductor region 301 and the N+ semiconductor region 302 may have any shapes.

Furthermore, the pixels 291-1 to 291-3 around the pixel 51 have a similar structure to the pixel 51.

That is, for example, one signal extraction portion 303 is formed in the central portion of the pixel 291-1. Then, in the signal extraction portion 303, a circular P+ semiconductor region 304 is formed at a center position thereof, and a periphery of the P+ semiconductor region 304 as a center is surrounded by an N+ semiconductor region 305 having a circular shape, more specifically, an annular shape.

The P+ semiconductor region 304 and N+ semiconductor region 305 correspond to the P+ semiconductor region 301 and the N+ semiconductor region 302, respectively.

Note that, hereinafter, in a case where there is no need to distinguish the pixels 291-1 to 291-3, they are also simply referred to as pixel(s) 291.

In the case where one signal extraction portion (tap) is formed for each pixel in this way, distance information is calculated on the basis of pixel signals obtained for some pixels adjacent to one another when trying to measure the distance to an object by an indirect ToF method.

Focusing on the pixel 51, for example, in a state where the signal extraction portion 65 of the pixel 51 is an active tap, some pixels 291 adjacent to the pixel 51, including, for example, the pixel 291-1, are each driven such that the signal extraction portions 303 of the pixels 291 serve as inactive taps.

As an example, the signal extraction portions of the pixels 51 adjacent above, below, right, or left in FIG. 16, such as the pixel 291-1 and the pixel 291-3, are driven to serve as the inactive taps.

Thereafter, when a voltage to be applied is switched to set the signal extraction portion 65 of the pixel 51 to be the inactive tap, then next, the signal extraction portions 303 of some pixels 291 adjacent to the pixel 51, including the pixel 291-1, are driven to serve as the active taps.

Then, the distance information is calculated on the basis of a pixel signal read from the signal extraction portion 65 in the state where the signal extraction portion 65 is the active tap, and a pixel signal read from the signal extraction portion 303 in the state where the signal extraction portion 303 is the active tap.

Even in the case where the number of signal extraction portions (taps) provided in the pixel is one, the distance can be measured by the indirect ToF method using the pixels adjacent to one another.

Sixth Embodiment

<Configuration Example of Pixel>

Furthermore, three or more signal extraction portions (taps) may be provided in each pixel, as described above.

Figure 17:
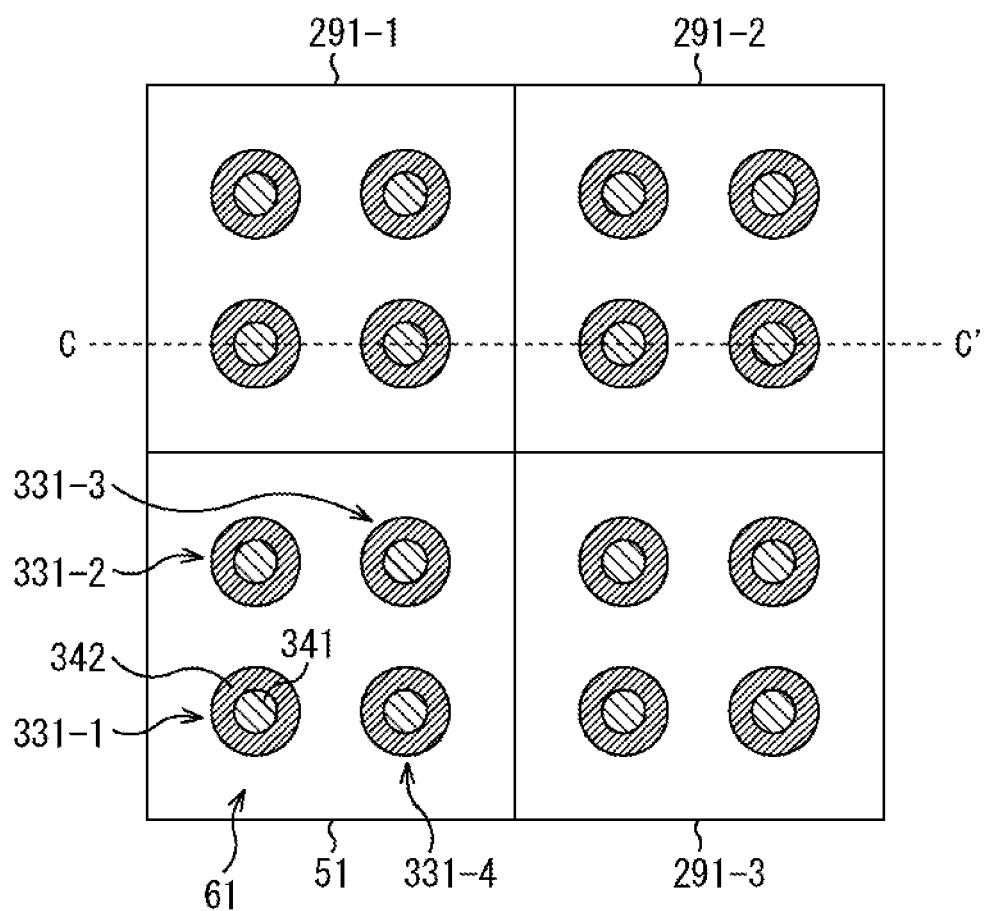
FIG. 17 is a view illustrating another configuration example of the pixel.

In a case where four signal extraction portions (taps) are provided in a pixel, for example, each pixel in a pixel array unit 20 is configured as illustrated in FIG. 17. Note that, in FIG. 17, a portion corresponding to the case in FIG. 16 is denoted by the same reference numeral, and description thereof is omitted as appropriate.

FIG. 17 illustrates arrangement of N+ semiconductor regions and P+ semiconductor regions when signal extraction portions in some pixels provided in the pixel array unit 20 are viewed from a direction perpendicular to a substrate.

Figure 36:
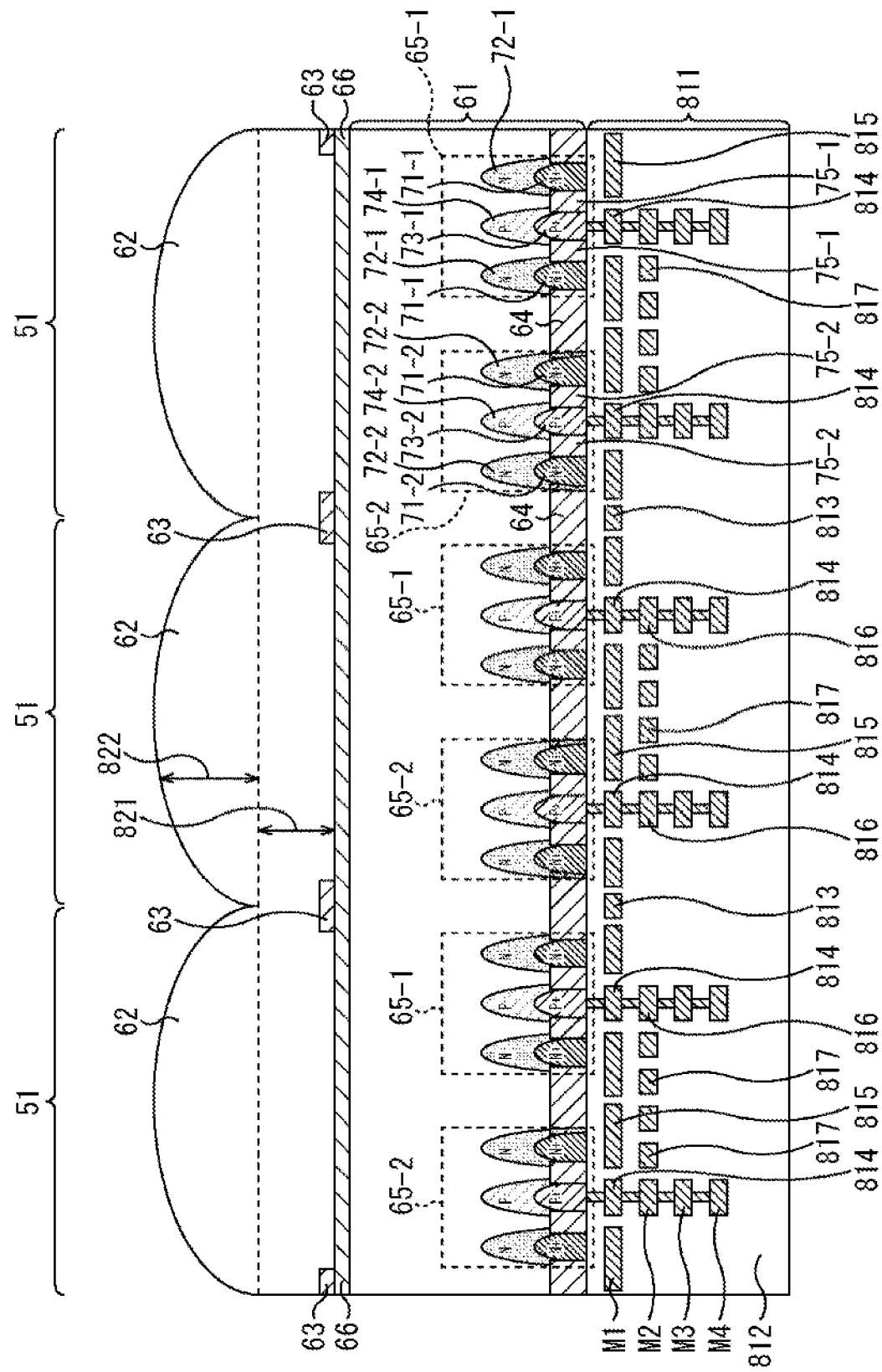
FIG. 36 is a cross-sectional view of a plurality of pixels in a fourteenth embodiment.

The cross-sectional view cut by the line C-C' illustrated in FIG. 17 is as illustrated in FIG. 36 to be described below.

In this example, a pixel 51 and pixels 291 provided in the pixel array unit 20 are illustrated, and four signal extraction portions are formed in each of the pixels.

That is, in pixel 51, a signal extraction portion 331-1, a signal extraction portion 331-2, a signal extraction portion 331-3, and a signal extraction portion 331-4 are formed at positions between a center of the pixel 51 and end portions of the pixel 51, that is, at a lower left position, an upper left position, an upper right position, and a lower right position with respect to the center of the pixel 51 in FIG. 17.

These signal extraction portions 331-1 to 331-4 correspond to the signal extraction portions 65 illustrated in FIG. 16.

For example, in the signal extraction portion 331-1, a circular P+ semiconductor region 341 is formed at a center position thereof, and a periphery of the P+ semiconductor region 341 as a center is surrounded by an N+ semiconductor region 342 having a circular shape, more specifically, an annular shape.

Here, the P+ semiconductor region 341 corresponds to the P+ semiconductor region 301 illustrated in FIG. 16 and functions as a voltage application portion. Furthermore, the N+ semiconductor region 342 corresponds to the N+ semiconductor region 302 illustrated in FIG. 16 and functions as a charge detection portion. Note that the P+ semiconductor region 341 and the N+ semiconductor region 342 may have any shapes.

Furthermore, the signal extraction portions 331-2 to 331-4 have a configuration similar to the signal extraction portion 331-1, and each includes the P+ semiconductor region that functions as a voltage application portion and the N+ semiconductor region that functions as a charge detection portion. Moreover, the pixels 291 formed around the pixel 51 have a similar structure to the pixel 51.

Note that, hereinafter, in a case where there is no need to distinguish the signal extraction portions 331-1 to 331-4, they are also simply referred to as signal extraction portion(s) 331.

In the case where four signal extraction portions are provided in each pixel, as described above, distance information is calculated using the four signal extraction portions in the pixel at the time of measuring a distance by an indirect ToF method, for example.

Focusing on the pixel 51 as an example, in a state where the signal extraction portions 331-1 and 331-3 are active taps, the pixel 51 is driven such that the signal extraction portions 331-2 and 331-4 serve as inactive taps.

Thereafter, a voltage to be applied to each signal extraction portion 331 is switched. That is, the pixel 51 is driven such that the signal extraction portions 331-1 and 331-3 serve as inactive taps, and the signal extraction portions 331-2 and 331-4 serve as active taps.

Then, the distance information is calculated on the basis of pixel signals read from the signal extraction portions 331-1 and 331-3 in the state where the signal extraction portions 331-1 and 331-3 are the active taps, and pixel signals read from the signal extraction portions 331-2 and 331-4 in the state where the signal extraction portions 331-2 and 331-4 are the active taps.

Seventh Embodiment

<Configuration Example of Pixel>

Moreover, a signal extraction portion (tap) may be shared between pixels adjacent to each other of a pixel array unit 20.

Figure 18:
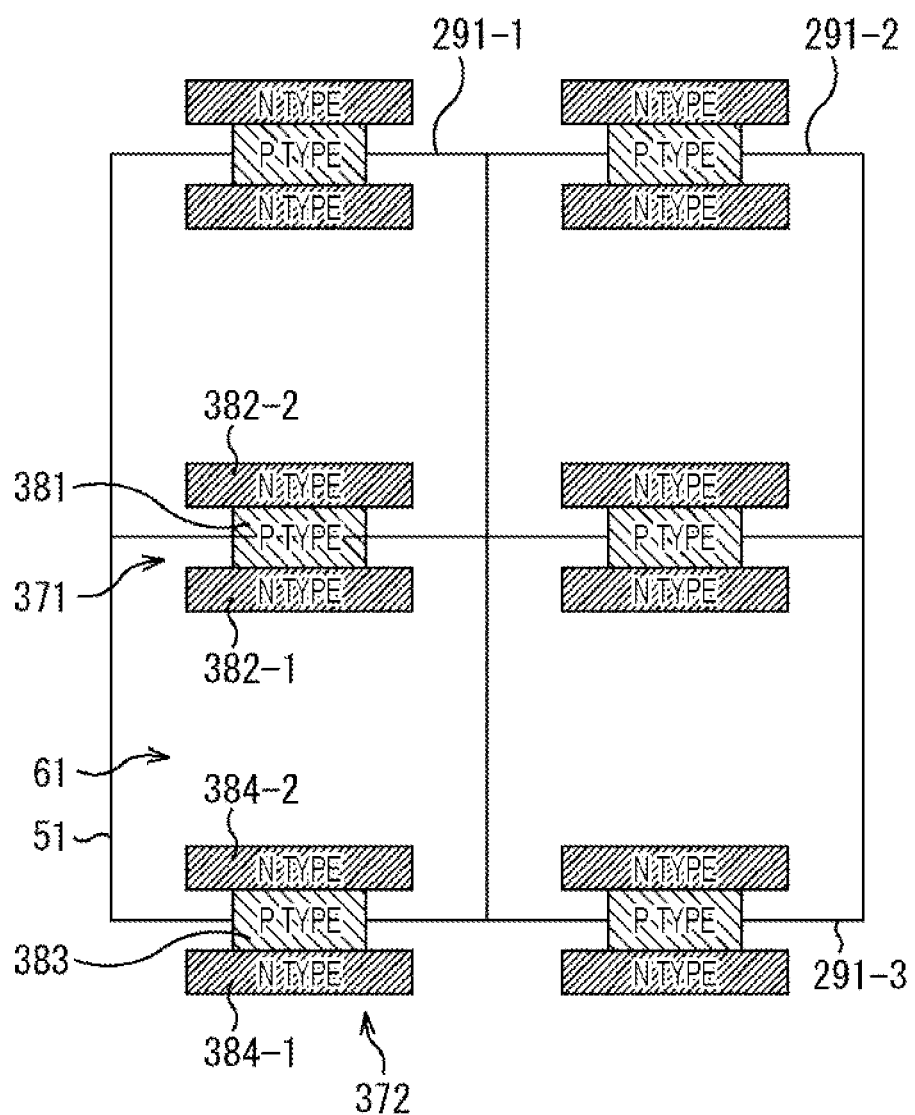
FIG. 18 is a view illustrating another configuration example of the pixel.

In such a case, each pixel in the pixel array unit 20 is configured as illustrated in FIG. 18, for example. Note that, in FIG. 18, a portion corresponding to the case in FIG. 16 is denoted by the same reference numeral, and description thereof is omitted as appropriate.

FIG. 18 illustrates arrangement of N+ semiconductor regions and P+ semiconductor regions when signal extraction portions in some pixels provided in the pixel array unit 20 are viewed from a direction perpendicular to a substrate.

In this example, a pixel 51 and pixels 291 provided in the pixel array unit 20 are illustrated, and two signal extraction portions are formed in each of the pixels.

For example, in the pixel 51, a signal extraction portion 371 is formed in an upper end portion in FIG. 18 of the pixel 51, and a signal extraction portion 372 is formed in a lower end portion in FIG. 18 of the pixel 51.

The signal extraction portion 371 is shared by the pixel 51 and the pixel 291-1. That is, the signal extraction portion 371 is used as a tap of the pixel 51 and is also used as a tap of the pixel 291-1. Furthermore, the signal extraction portion 372 is shared by the pixel 51 and a lower pixel (not illustrated) adjacent to the pixel 51 in FIG. 18.

A P+ semiconductor region 381 having a line shape corresponding to the P+ semiconductor region 231 illustrated in FIG. 14 is formed in a center position in the signal extraction portion 371. Then, an N+ semiconductor region 382-1 and an N+ semiconductor region 382-2 having a line shape corresponding to the N+ semiconductor regions 232 illustrated in FIG. 14 are formed at upper and lower positions in FIG. 18 of the P+ semiconductor region 381 to sandwich the P+ semiconductor region 381.

In particular, in this example, the P+ semiconductor region 381 is formed at a boundary portion between the pixel 51 and the pixel 291-1. Furthermore, the N+ semiconductor region 382-1 is formed in the region in the pixel 51, and the N+ semiconductor region 382-2 is formed in the region in the pixel 291-1.

Here, the P+ semiconductor region 381 functions as a voltage application portion, and the N+ semiconductor region 382-1 and the N+ semiconductor region 382-2 function as charge detection portions. Note that, hereinafter, in a case where there is no need to distinguish the N+ semiconductor region 382-1 and the N+ semiconductor region 382-2, they are also simply referred to as N+ semiconductor region(s) 382.

Furthermore, the P+ semiconductor region 381 and the N+ semiconductor region 382 may have any shapes. Further, the N+ semiconductor region 382-1 and the N+ semiconductor region 382-2 may be connected to the same FD portion or may be connected to different FD portions.

A P+ semiconductor region 383, an N+ semiconductor region 384-1, and an N+ semiconductor region 384-2 having a line shape are formed in the signal extraction portion 372.

The P+ semiconductor region 383, N+ semiconductor region 384-1, and N+ semiconductor region 384-2 correspond to the P+ semiconductor region 381, the N+ semiconductor region 382-1, and the N+ semiconductor region 382-2, respectively, and have similar arrangement, shapes, and functions. Note that, hereinafter, in a case where there is no need to distinguish the N+ semiconductor region 384-1 and the N+ semiconductor region 384-2, they are also simply referred to as N+ semiconductor region(s) 384.

As described above, even in the case where the signal extraction portion (tap) is shared between adjacent pixels, the distance can be measured by an indirect ToF method, by an operation similar to the example illustrated in FIG. 3.

In the case where the signal extraction portion is shared between pixels as illustrated in FIG. 18, the distance between a pair of P+ semiconductor regions for generating an electric field, that is, a current, such as the distance between the P+ semiconductor region 381 and the P+ semiconductor region 383, becomes long. In other words, the distance between the P+ semiconductor regions can be maximized by causing the pixels to share the signal extraction portion.

Thereby, the current is less easily flow between the P+ semiconductor regions, and thus power consumption of the pixel can be reduced, and the pixel can be advantageously miniaturized.

Note that, here, the example in which one signal extraction portion is shared by the two pixels adjacent to each other has been described. However, one signal extraction portion may be shared by three or more pixels adjacent to one another. Furthermore, in the case where the signal extraction portion is shared by two or more pixels adjacent to one another, only the charge detection portion for detecting a signal carrier may be shared or only the voltage application portion for generating an electric field of the signal extraction portion may be shared.

Eighth Embodiment

<Configuration Example of Pixel>

Moreover, an on-chip lens and an inter-pixel light-shielding portion provided in each pixel such as a pixel 51 of a pixel array unit 20 may not be particularly provided.

Figure 19:
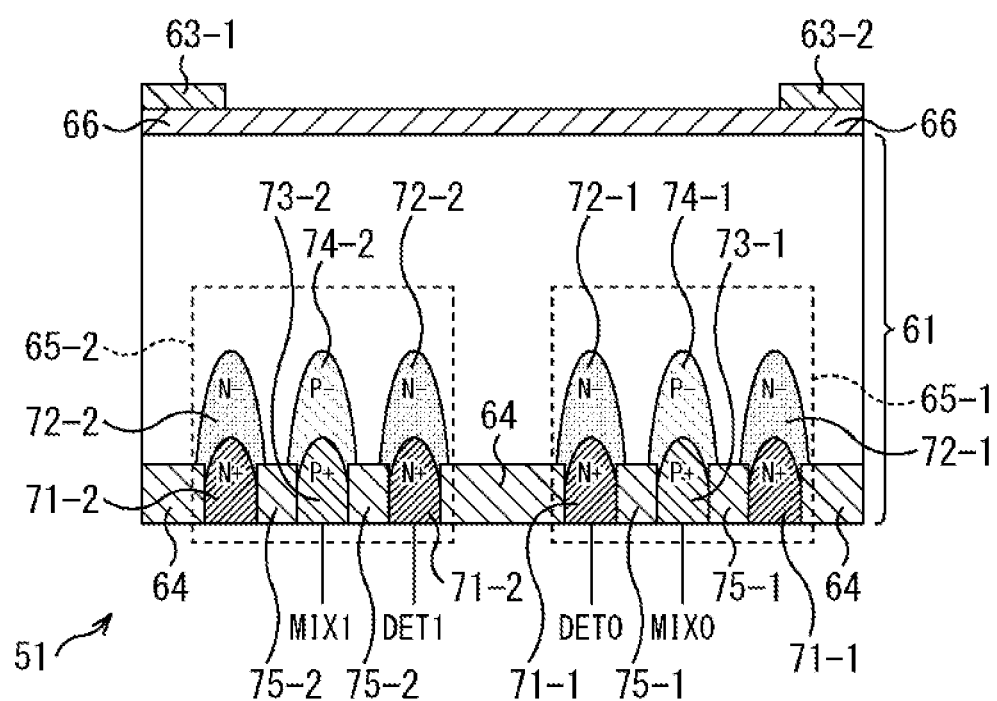
FIG. 19 is a view illustrating another configuration example of the pixel.

Specifically, for example, the pixel 51 can be configured as illustrated in FIG. 19. Note that, in FIG. 19, a portion corresponding to the case in FIG. 2 is denoted by the same reference numeral, and description thereof is omitted as appropriate.

The configuration of the pixel 51 illustrated in FIG. 19 is different from that of the pixel 51 illustrated in FIG. 2 in that no on-chip lens 62 is provided, and is the same as that of the pixel 51 in FIG. 2 in the other points.

Since the on-chip lens 62 is not provided on a light incident surface of a substrate 61 in the pixel 51 illustrated in FIG. 19, attenuation of infrared light entering the substrate 61 from an outside can be further reduced. Thereby, the amount of infrared light receivable by the substrate 61 increases, and sensitivity of the pixel 51 can be improved.

<Modification 1 of Eighth Embodiment>
<Configuration Example of Pixel>

Figure 20:
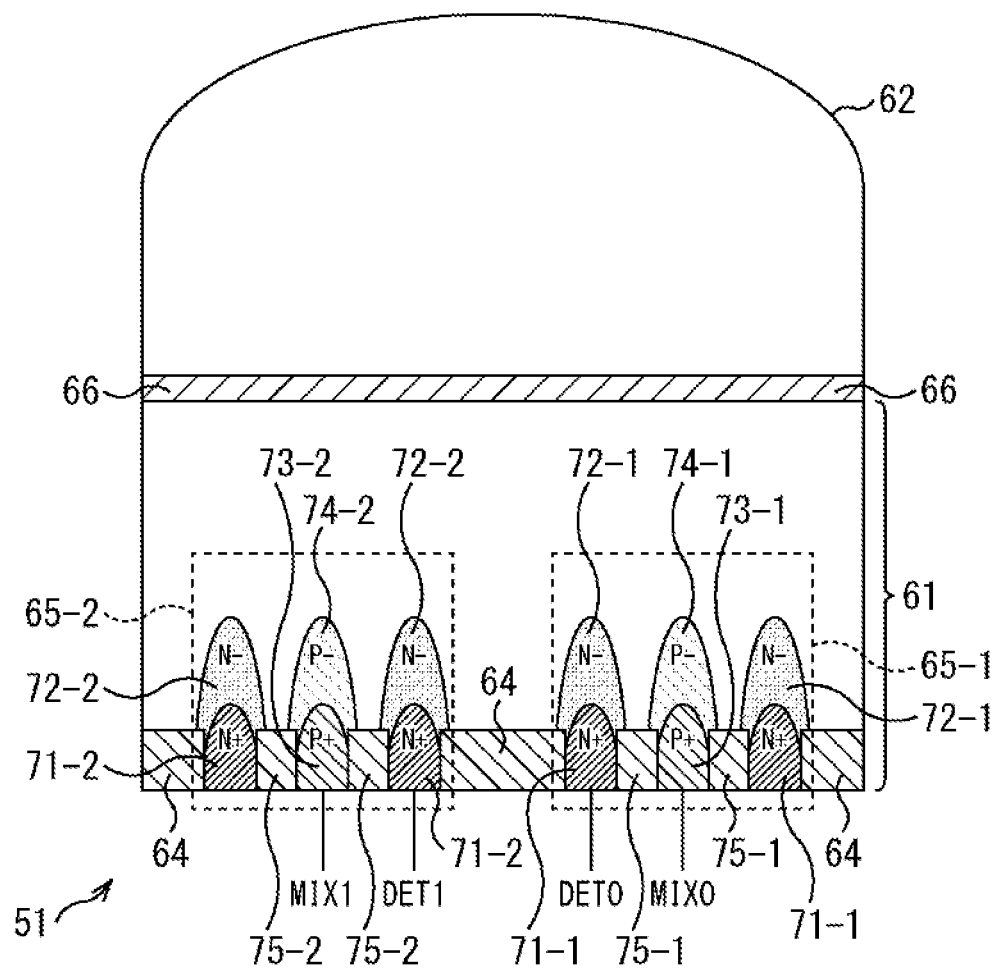
FIG. 20 is a view illustrating another configuration example of the pixel.

Furthermore, the pixel 51 may be configured as illustrated in FIG. 20, for example. Note that, in FIG. 20, a portion corresponding to the case in FIG. 2 is denoted by the same reference numeral, and description thereof is omitted as appropriate.

The configuration of the pixel 51 illustrated in FIG. 20 is different from that of the pixel 51 illustrated in FIG. 2 in that no inter-pixel light-shielding film 63-1 and inter-pixel light-shielding film 63-2 are provided, and is the same as that of the pixel 51 in FIG. 2 in the other points.

In the example illustrated in FIG. 20, crosstalk suppression effect is reduced because the inter-pixel light-shielding films 63 are not provided on the light incident surface of the substrate 61 but the infrared light, which is shielded by the inter-pixel light-shielding films 63, becomes incident on the substrate 61 and thus the sensitivity of the pixel 51 can be improved.

Note that neither on-chip lens 62 nor inter-pixel light-shielding films 63 may be provided in the pixel 51.

<Modification 2 of Eighth Embodiment>
<Configuration Example of Pixel>

Figure 21:
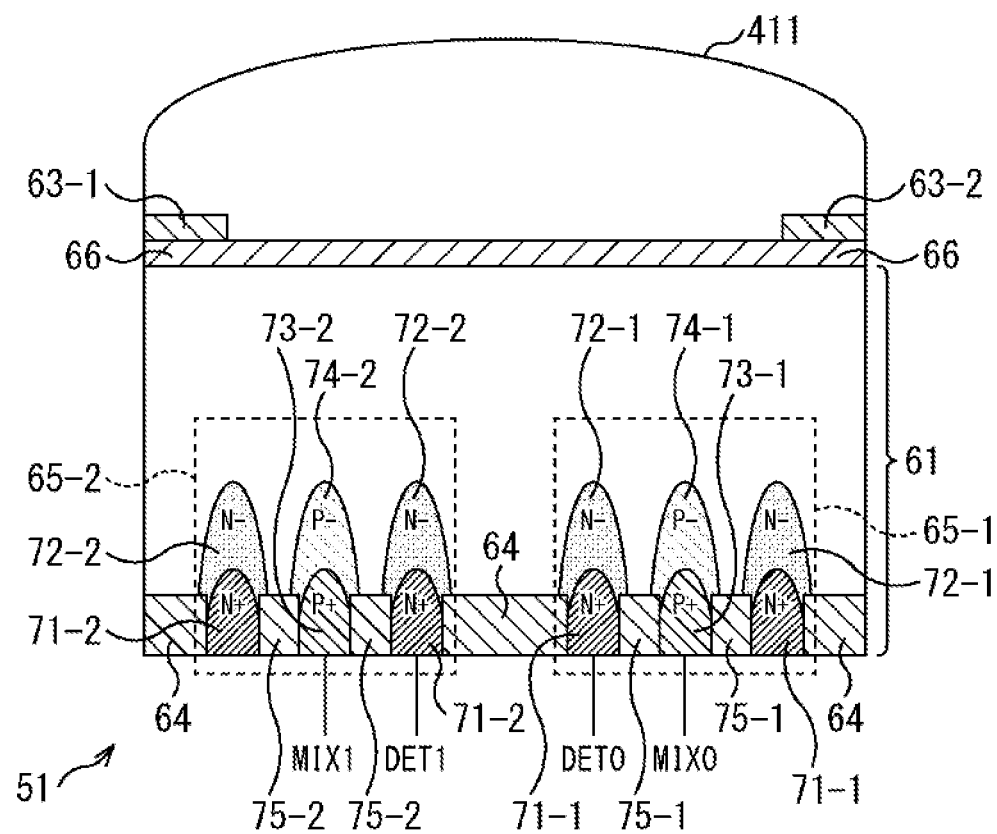
FIG. 21 is a view illustrating another configuration example of the pixel.

In addition, the thickness of the on-chip lens in an optical axis direction may be optimized, as illustrated in FIG. 21, for example. Note that, in FIG. 21, a portion corresponding to the case in FIG. 2 is denoted by the same reference numeral, and description thereof is omitted as appropriate.

The configuration of the pixel 51 illustrated in FIG. 21 is different from that of the pixel 51 illustrated in FIG. 2 in that an on-chip lens 411 is provided instead of the on-chip lens 62, and is the same as that of the pixel 51 in FIG. 2 in the other points.

In the pixel 51 illustrated in FIG. 21, the on-chip lens 411 is formed on the light incident surface of the substrate 61, that is, on an upper side in FIG. 21. The on-chip lens 411 is smaller in thickness in the optical axis direction than the on-chip lens 62 illustrated in FIG. 2, that is, the on-chip lens 411 is thin in the vertical direction in FIG. 21.

In general, the thicker the on-chip lens provided on the surface of the substrate 61, the more advantageous for condensing light entering the on-chip lens. However, by making the on-chip lens 411 thinner, transmittance becomes high and can improve the sensitivity of the pixel 51. Therefore, the thickness of the on-chip lens 411 can be appropriately determined according to the thickness of the substrate 61, the position to which the infrared light is condensed, or the like.

Ninth Embodiment

<Configuration Example of Pixel>

Moreover, a separation region for improving separation characteristics between adjacent pixels and suppressing crosstalk may be provided between pixels formed in a pixel array unit 20.

Figure 22:
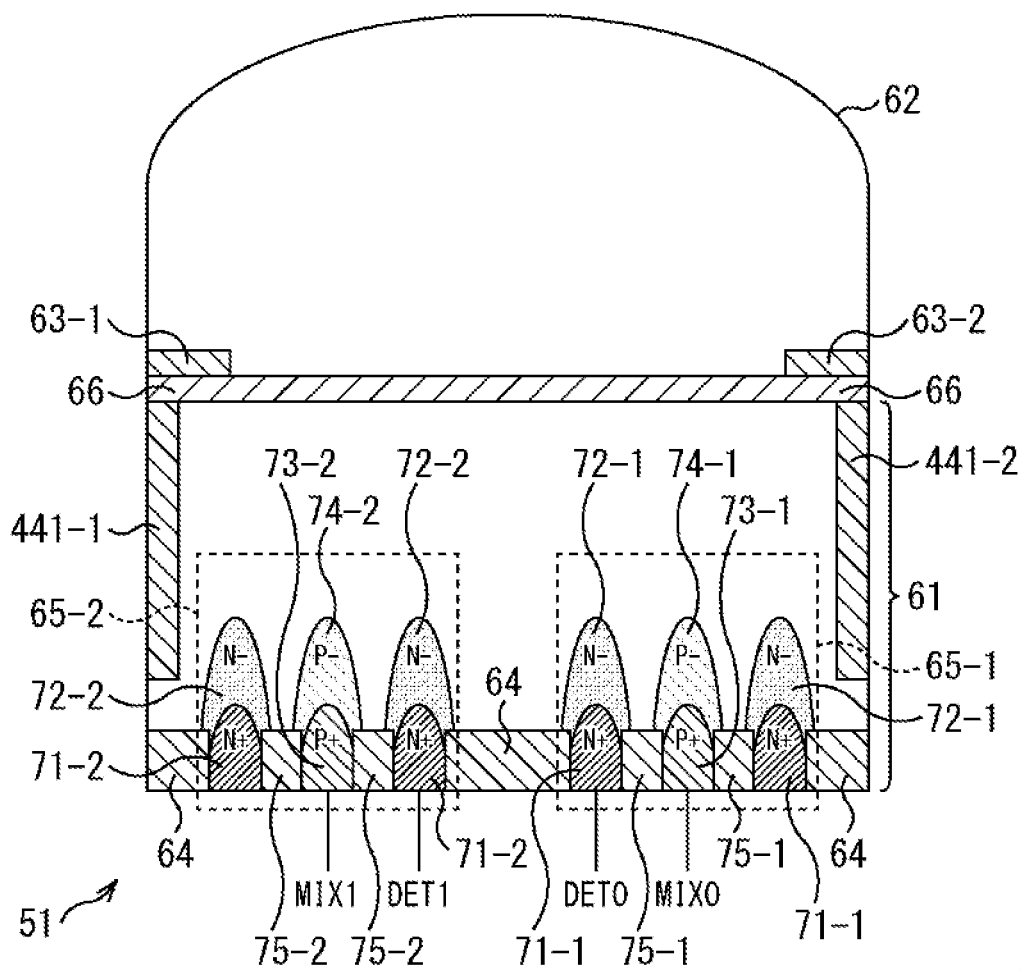
FIG. 22 is a view illustrating another configuration example of the pixel.

In such a case, a pixel 51 is configured as illustrated in FIG. 22, for example. Note that, in FIG. 22, a portion corresponding to the case in FIG. 2 is denoted by the same reference numeral, and description thereof is omitted as appropriate.

The configuration of the pixel 51 illustrated in FIG. 22 is different from that of the pixel 51 illustrated in FIG. 2 in that a separation region 441-1 and a separation region 441-2 are provided in a substrate 61, and is the same as that of the pixel 51 in FIG. 2 in the other points.

In the pixel 51 illustrated in FIG. 22, the separation region 441-1 and the separation region 441-2 for separating adjacent pixels are formed using a light-shielding film and the like in a boundary portion in the substrate 61 between the pixel 51 and another pixel adjacent to the pixel 51, that is, in right and left end portions in FIG. 22 of the pixel 51. Note that, hereinafter, in a case where there is no need to distinguish the separation region 441-1 and the separation region 441-2, they are also simply referred to as separation region(s) 441.

For example, at the time of forming the separation region 441, a long groove (trench) is formed in the substrate 61 with a predetermined depth downward (a direction perpendicular to a surface of the substrate 61) in FIG. 22 from a light incident surface of the substrate 61, that is, from an upper surface in FIG. 22, and a light-shielding film is embedded in the groove portion to form the separation region 441. This separation region 441 functions as a pixel separation region that shields infrared light entering the substrate 61 from the light incident surface and heading to another pixel adjacent to the pixel 51.

By forming the embedded separation region 441 in this way, the separation characteristics of infrared light between pixels can be improved, and occurrence of crosstalk can be suppressed.

<Modification 1 of Ninth Embodiment>
<Configuration Example of Pixel>

Figure 23:
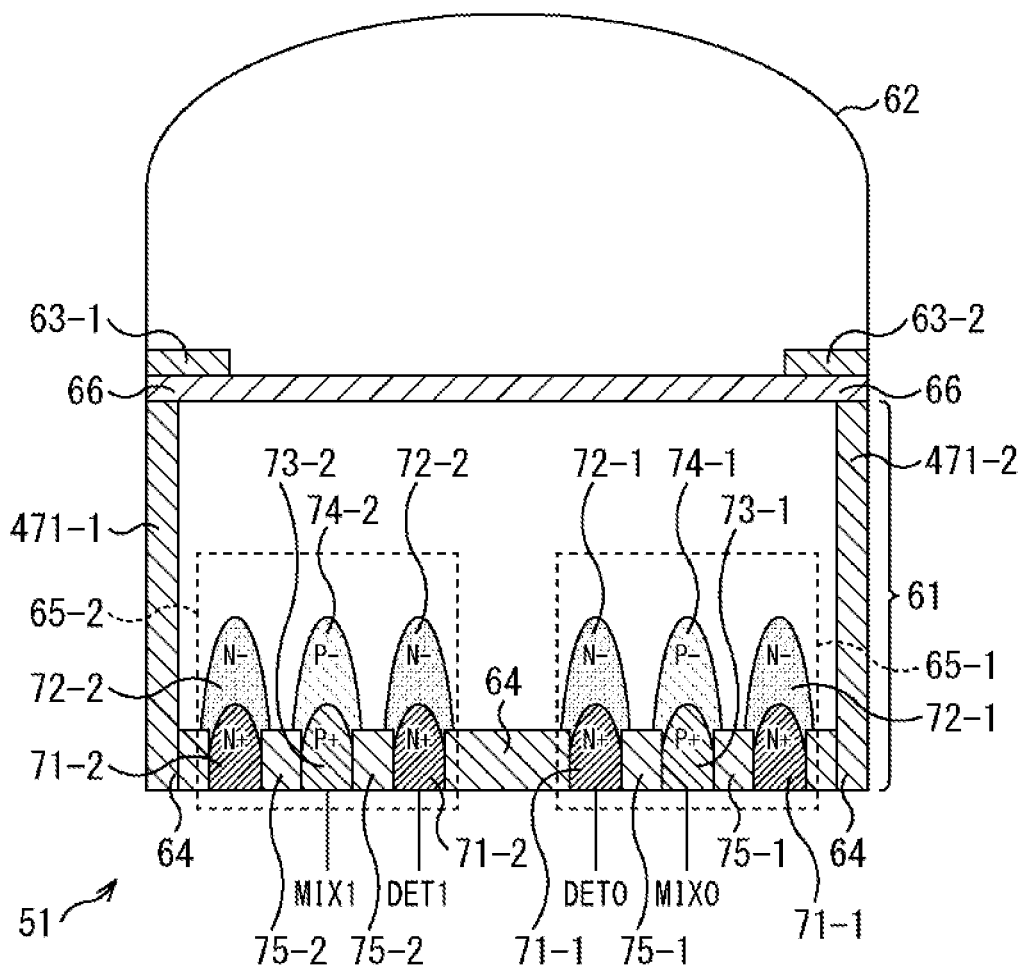
FIG. 23 is a view illustrating another configuration example of the pixel.

Moreover, in the case of forming the embedded separation region in the pixel 51, a separation region 471-1 and a separation region 471-2 penetrating the entire substrate 61 may be provided, as illustrated in FIG. 23, for example. Note that, in FIG. 23, a portion corresponding to the case in FIG. 2 is denoted by the same reference numeral, and description thereof is omitted as appropriate.

The configuration of the pixel 51 illustrated in FIG. 23 is different from that of the pixel 51 illustrated in FIG. 2 in that a separation region 471-1 and a separation region 471-2 are provided in the substrate 61, and is the same as that of the pixel 51 in FIG. 2 in the other points. That is, the pixel 51 illustrated in FIG. 23 has a configuration in which the separation region 471-1 and the separation region 471-2 are provided in place of the separation regions 441 of the pixel 51 illustrated in FIG. 22.

In the pixel 51 illustrated in FIG. 23, the separation region 471-1 and the separation region 471-2 penetrating the entire substrate 61 are formed using a light-shielding film and the like in a boundary portion in the substrate 61 between the pixel 51 and another pixel adjacent to the pixel 51, that is, in right and left end portions in FIG. 22 of the pixel 51. Note that, hereinafter, in a case where there is no need to distinguish the separation region 471-1 and the separation region 471-2, they are also simply referred to as separation region(s) 471.

For example, at the time of forming the separation region 471, a long groove (trench) is formed upward from a surface opposite to the light incident surface of the substrate 61, that is, from a lower surface in FIG. 23. At this time, the grooves are formed to penetrate the substrate 61 until the grooves reach the light incident surface of the substrate 61. Then, a light-shielding film is embedded in the groove portion thus formed to form the separation region 471.

Even with such an embedded type separation region 471, the separation characteristics of infrared light between pixels can be improved, and occurrence of crosstalk can be suppressed.

Tenth Embodiment

<Configuration Example of Pixel>

Moreover, the thickness of a substrate in which a signal extraction portion 65 is formed can be determined according to, for example, various characteristics of pixels.

Figure 24:
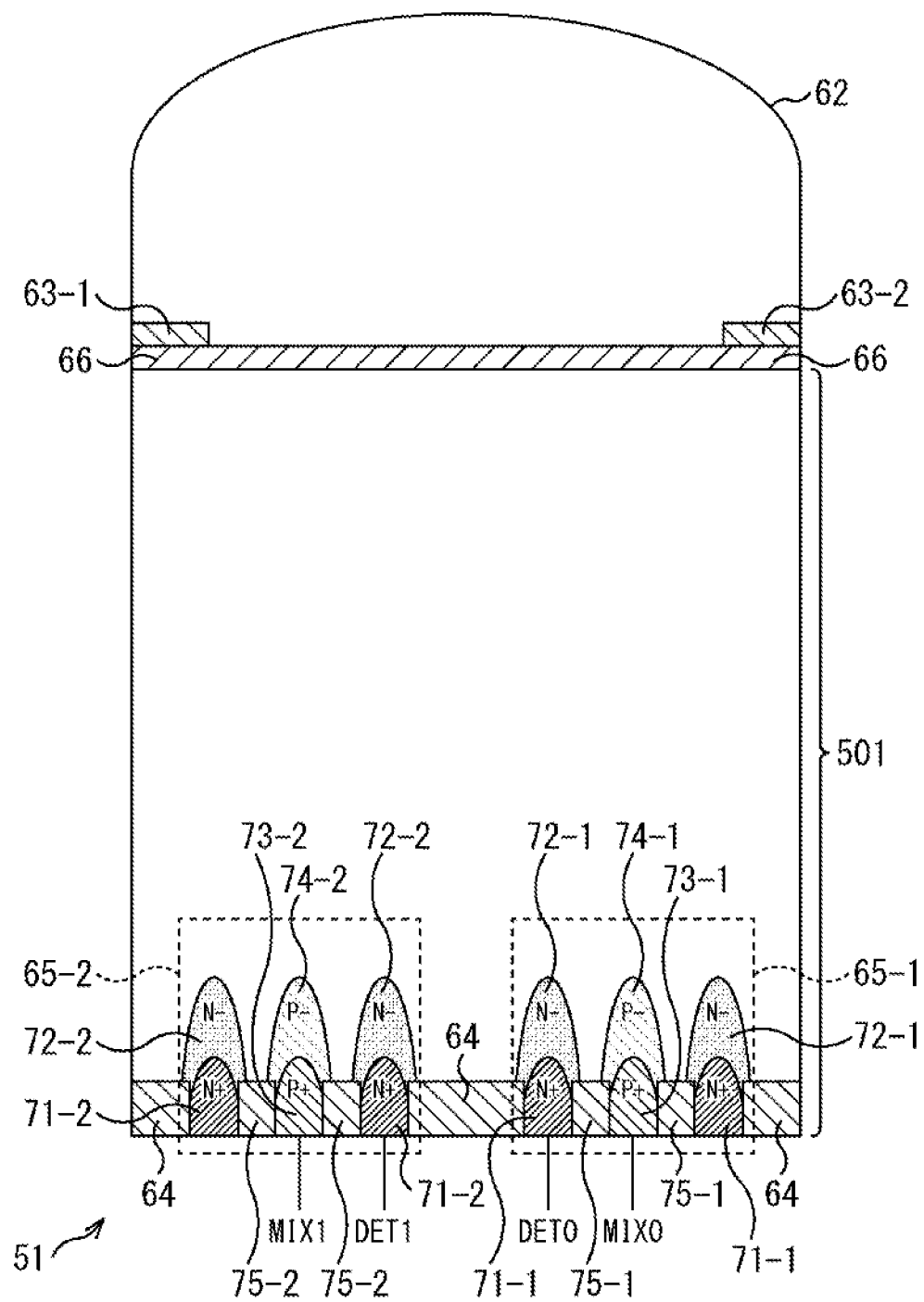
FIG. 24 is a view illustrating another configuration example of the pixel.

Therefore, as illustrated in FIG. 24, a substrate 501 constituting a pixel 51 can be made thicker than the substrate 61 illustrated in FIG. 2, for example. Note that, in FIG. 24, a portion corresponding to the case in FIG. 2 is denoted by the same reference numeral, and description thereof is omitted as appropriate.

The configuration of the pixel 51 illustrated in FIG. 24 is different from that of the pixel 51 illustrated in FIG. 2 in that the substrate 501 is provided instead of the substrate 61, and is the same as that of the pixel 51 in FIG. 2 in the other points.

That is, in the pixel 51 illustrated in FIG. 24, an on-chip lens 62, a fixed charge film 66, and inter-pixel light-shielding films 63 are formed on a light incident surface side of the substrate 501. Furthermore, an oxide film 64, signal extraction portions 65, and separation portions 75 are formed near a front surface of the substrate 501, the front surface being opposite to the light incident surface side.

The substrate 501 is formed using, for example, a P-type semiconductor substrate with a thickness of 20 μm or more. The substrate 501 and the substrate 61 are different only in the thickness of the substrate, and the positions at which the oxide film 64, the signal extraction portions 65, and the separation portions 75 are formed are the same position between the substrate 501 and the substrate 61.

Note that the thicknesses of the various layers (films) appropriately formed on the light incident surface side and the like of the substrate 501 and the substrate 61 may be optimized according to the characteristics of the pixel 51 and the like.

Eleventh Embodiment

<Configuration Example of Pixel>

Figure 25:
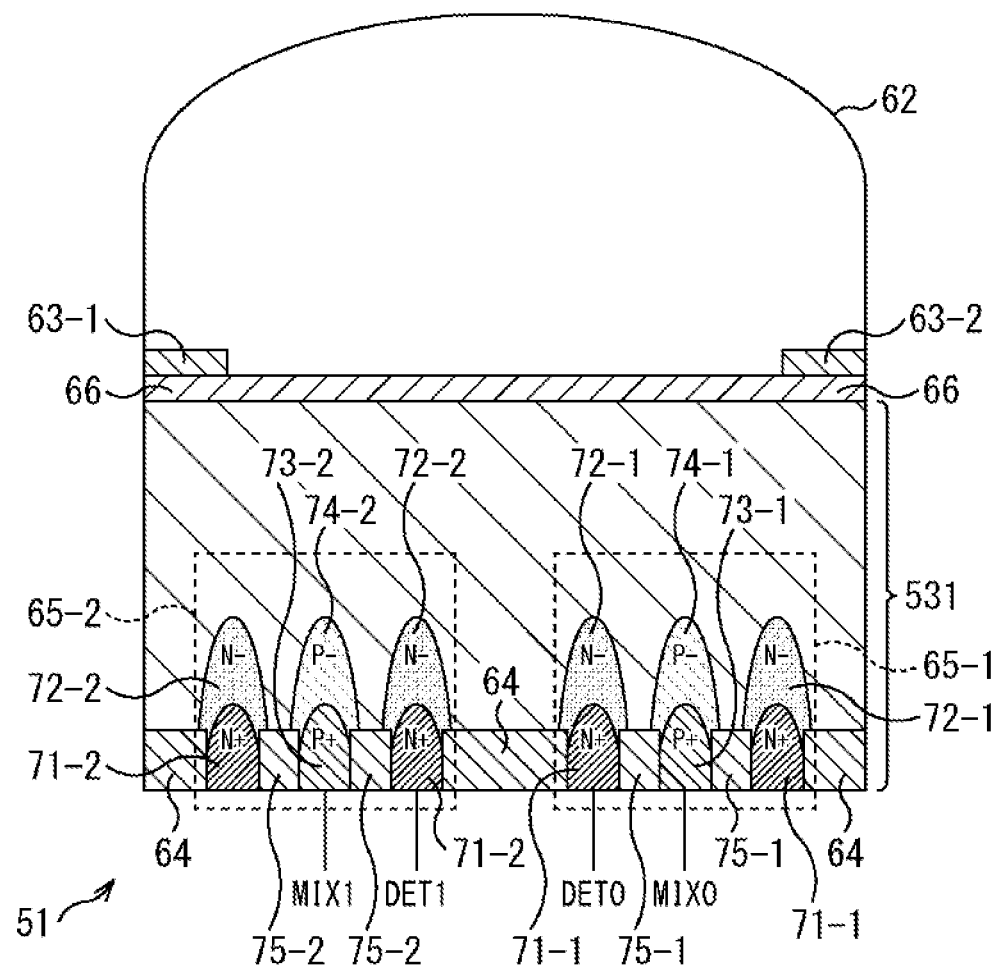
FIG. 25 is a view illustrating another configuration example of the pixel.

Moreover, in the above description, the example in which the substrate constituting the pixel 51 is formed using a P-type semiconductor substrate has been described. However, the substrate may be formed using an N-type semiconductor substrate, as illustrated in FIG. 25, for example. Note that, in FIG. 25, a portion corresponding to the case in FIG. 2 is denoted by the same reference numeral, and description thereof is omitted as appropriate.

The configuration of the pixel 51 illustrated in FIG. 25 is different from that of the pixel 51 illustrated in FIG. 2 in that a substrate 531 is provided instead of the substrate 61, and is the same as that of the pixel 51 in FIG. 2 in the other points.

In the pixel 51 illustrated in FIG. 25, an on-chip lens 62, a fixed charge film 66, and inter-pixel light-shielding films 63 are formed on a light incident surface side of the substrate 531 formed using an N-type semiconductor layer such as a silicon substrate.

Furthermore, an oxide film 64, signal extraction portions 65, and separation portions 75 are formed near a front surface of the substrate 531, the front surface being opposite to the light incident surface side. The positions at which the oxide film 64, the signal extraction portions 65, and the separation portions 75 are formed are the same position between the substrate 531 and the substrate 61, and the configuration of the signal extraction portion 65 is the same between the substrate 531 and the substrate 61.

For example, in the substrate 531, the thickness in a vertical direction in FIG. 25, that is, the thickness in a direction perpendicular to a surface of the substrate 531, is 20 μm or less.

Furthermore, the substrate 531 is, for example, a high-resistance N-Epi substrate having a substrate concentration of 1E+13 order or less, and the resistance (resistivity) of the substrate 531 is, for example, 500 [Ωcm] or more. As a result, the power consumption of the pixel 51 can be reduced.

Here, the relationship between the substrate concentration and the resistance of the substrate 531 is, for example, the resistance of 2000 [Ωcm] when the substrate concentration is 2.15E+12 [cm$^3$], the resistance of 1000 [Ωcm] when the substrate concentration is 4.30E+12 [cm$^3$], the resistance of 500 [Ωcm] when the substrate concentration is 8.61E+12 [cm$^3$], the resistance of 100 [Ωcm] when the substrate concentration is 4.32E+13 [cm$^3$], and the like.

As described above, even if the N-type semiconductor substrate is used for the substrate 531 of the pixel 51, similar effects can be obtained by a similar operation to the example illustrated in FIG. 2.

Twelfth Embodiment

<Configuration Example of Pixel>

Moreover, the thickness of an N-type semiconductor substrate can be determined according to various characteristics of pixels and the like, similarly to the example described with reference to FIG. 24.

Figure 26:
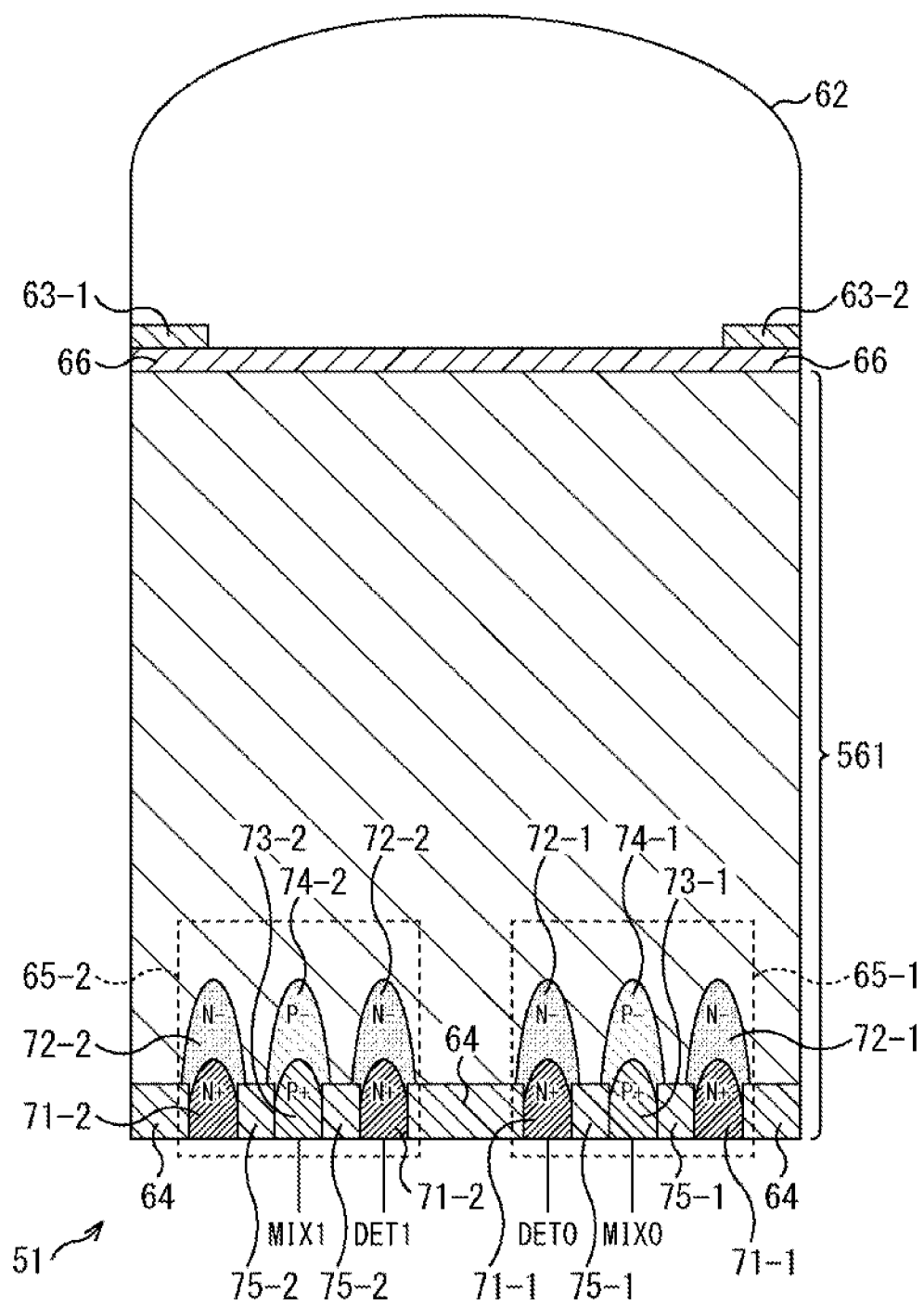
FIG. 26 is a view illustrating another configuration example of the pixel.

Therefore, as illustrated in FIG. 26, a substrate 561 constituting a pixel 51 can be made thicker than the substrate 531 illustrated in FIG. 25, for example. Note that, in FIG. 26, a portion corresponding to the case in FIG. 25 is denoted by the same reference numeral, and description thereof is omitted as appropriate.

The configuration of the pixel 51 illustrated in FIG. 26 is different from that of the pixel 51 illustrated in FIG. 25 in that the substrate 561 is provided instead of the substrate 531, and is the same as that of the pixel 51 in FIG. 25 in the other points.

That is, in the pixel 51 illustrated in FIG. 26, an on-chip lens 62, a fixed charge film 66, and inter-pixel light-shielding films 63 are formed on a light incident surface side of the substrate 561. Furthermore, an oxide film 64, signal extraction portions 65, and separation portions 75 are formed near a front surface of the substrate 561, the front surface being opposite to the light incident surface side.

The substrate 561 is formed using, for example, an N-type semiconductor substrate with a thickness of 20 μm or more. The substrate 561 and the substrate 531 are different only in the thickness of the substrate, and the positions at which the oxide film 64, the signal extraction portions 65, and the separation portions 75 are formed are the same position between the substrate 561 and the substrate 531.

Thirteenth Embodiment

<Configuration Example of Pixel>

Further, for example, by biasing a light incident surface side of a substrate 61, an electric field in the substrate 61 in a direction perpendicular to a surface of the substrate 61 (hereinafter, also referred to as a Z direction) may be strengthened.

Figure 27:
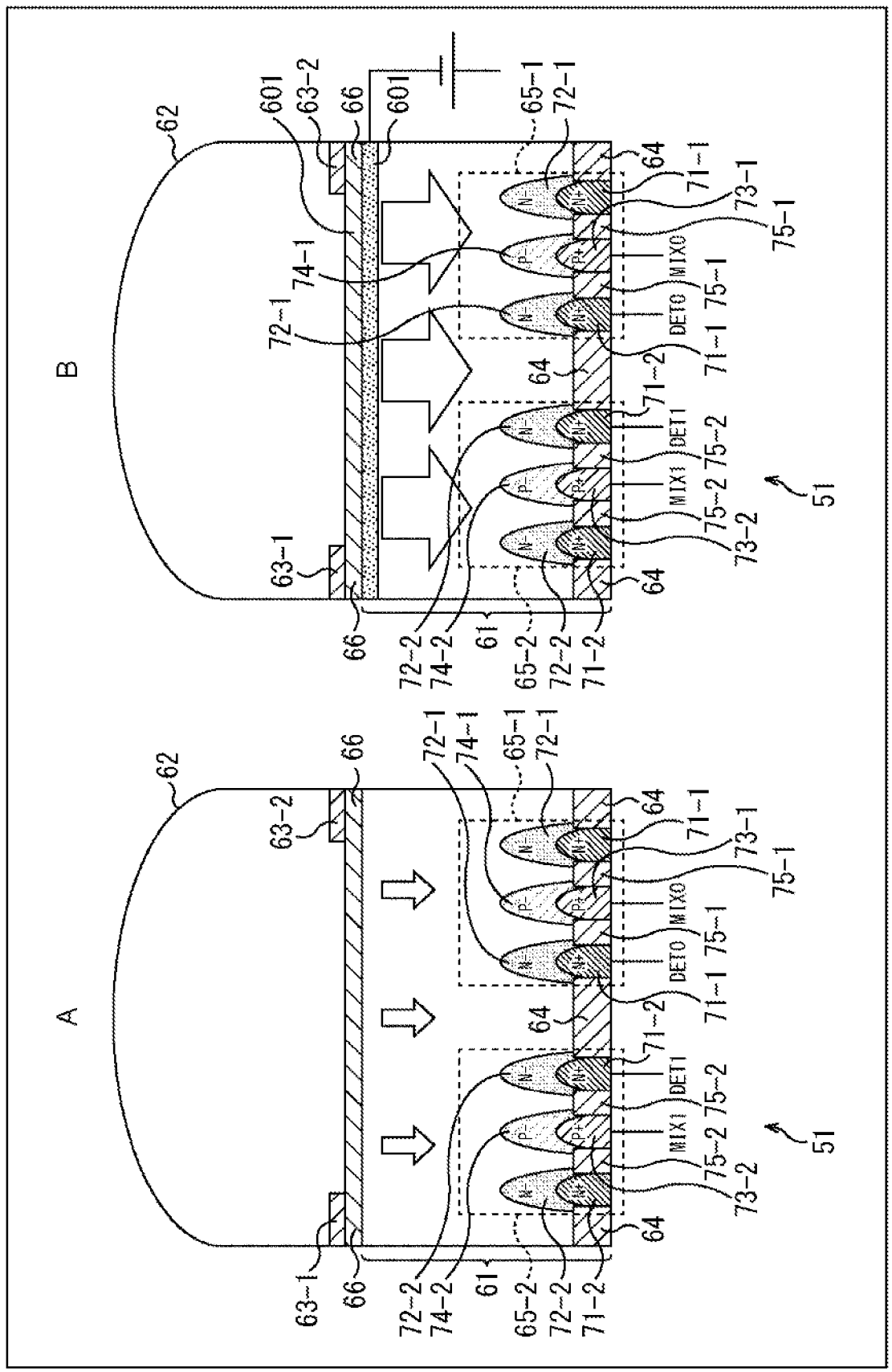
FIG. 27 is a view illustrating another configuration example of the pixel.

In such a case, a pixel 51 is configured as illustrated in FIG. 27, for example. Note that, in FIG. 27, a portion corresponding to the case in FIG. 2 is denoted by the same reference numeral, and description thereof is omitted as appropriate.

A in FIG. 27 illustrates the pixel 51 illustrated in FIG. 2, and the arrows in the substrate 61 of the pixel 51 represent the strength of the electric field in the Z direction in the substrate 61.

In contrast, B in FIG. 27 illustrates a configuration of the pixel 51 in a case of biasing (applying a voltage to) the light incident surface of the substrate 61. The configuration of the pixel 51 in B in FIG. 27 is basically the same as the configuration of the pixel 51 illustrated in FIG. 2, but a P+ semiconductor region 601 is newly added to an interface on the light incident surface of the substrate 61.

A voltage (negative bias) of 0 V or less is applied to the P+ semiconductor region 601 formed at the interface on the light incident surface side of the substrate 61 from inside or outside of a pixel array unit 20, so that the electric field in the Z direction is strengthened. The arrows in the substrate 61 of the pixel 51 in B in FIG. 27 represent the strength of the electric field in the Z direction in the substrate 61. The arrow drawn in the substrate 61 in B in FIG. 27 is thicker in the thickness than the arrow of the pixel 51 in A in FIG. 27, and the electric field in the Z direction is stronger in B in FIG. 27 than that in A in FIG. 27. By applying a negative bias to the P+ semiconductor region 601 formed on the light incident surface side of the substrate 61, the electric field in the Z direction can be strengthened and electron extraction efficiency in signal extraction portions 65 can be improved.

Note that the configuration for applying the voltage to the light incident surface side of the substrate 61 is not limited to the configuration provided with the P+ semiconductor region 601, and any configuration can be adopted. For example, a transparent electrode film may be stacked between the light incident surface of the substrate 61 and an on-chip lens 62, and a negative bias may be applied by applying a voltage to the transparent electrode film.

Fourteenth Embodiment

<Configuration Example of Pixel>

Moreover, to improve sensitivity of a pixel 51 to infrared light, a large-area reflective member may be provided on a surface of a substrate 61, the surface being opposite to a light incident surface.

Figure 28:
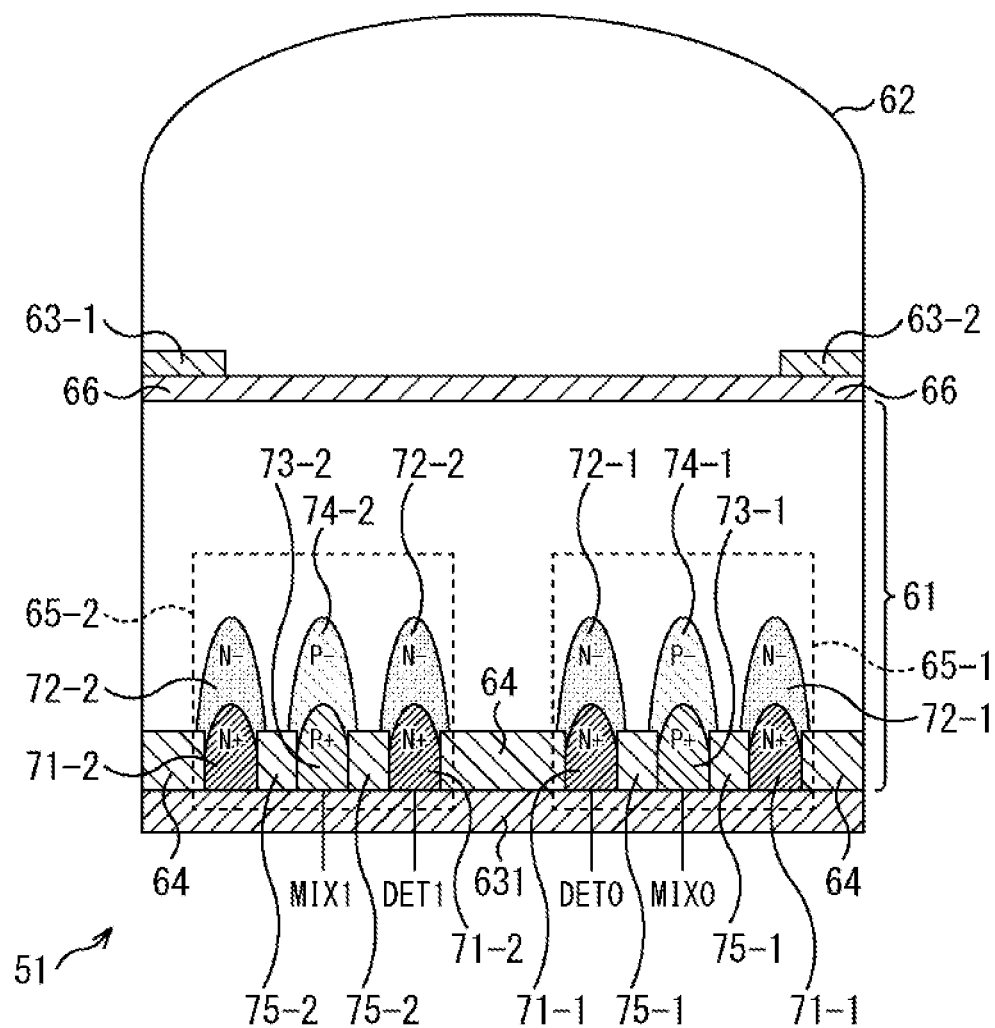
FIG. 28 is a view illustrating another configuration example of the pixel.

In such a case, a pixel 51 is configured as illustrated in FIG. 28, for example. Note that, in FIG. 28, a portion corresponding to the case in FIG. 2 is denoted by the same reference numeral, and description thereof is omitted as appropriate.

The configuration of the pixel 51 illustrated in FIG. 28 is different from that of the pixel 51 in FIG. 2 in that a reflective member 631 is provided on the surface of the substrate 61, the surface being opposite to the light incident surface, and is the same as that of the pixel 51 in FIG. 2 in the other points.

In the example illustrated in FIG. 28, the reflective member 631 that reflects the infrared light is provided to cover the entire surface of the substrate 61, the surface being opposite to the light incident surface.

The reflective member 631 may be any member as long as the member has high reflectance of infrared light. For example, a metal such as copper or aluminum provided in a multilayer wiring layer stacked on the surface of the substrate 61, the surface being opposite to the light incident surface, may be used as the reflective member 631, or a reflective structure of polysilicon, an oxide film, or the like may be formed on the surface of the substrate 61, the surface being opposite to the light incident surface, to form the reflective member 631.

By providing the reflecting member 631 in the pixel 51 in this way, the infrared light entering the substrate 61 from the light incident surface via the on-chip lens 62 and transmitted through the substrate 61 without being photoelectrically converted in the substrate 61 can be reflected by the reflective member 631 to re-enter the substrate 61. As a result, the amount of infrared light photoelectrically converted in the substrate 61 can be increased, and quantum efficiency (QE), that is, the sensitivity of the pixel 51 to infrared light can be improved.

Fifteenth Embodiment

<Configuration Example of Pixel>

Moreover, to suppress erroneous detection of light in a nearby pixel, a large-area light-shielding member may be provided on a surface of a substrate 61, the surface being opposite to a light incident surface.

In such a case, a pixel 51 can have a configuration in which the reflective member 631 illustrated in FIG. 28 is replaced with the light-shielding member, for example. That is, the reflective member 631 that covers the entire surface opposite to the light incident surface of the substrate 61 in the pixel 51 illustrated in FIG. 28 is replaced with a light-shielding member 631' that shields infrared light. The reflective member 631 of pixel 51 in FIG. 28 is used as the light-shielding member 631'.

The light-shielding member 631' may be any member as long as the member has a high light-shielding rate of infrared light. For example, a metal such as copper or aluminum provided in a multilayer wiring layer stacked on the surface of the substrate 61, the surface being opposite to the light incident surface, may be used as the light-shielding member 631', or a light-shielding structure of polysilicon, an oxide film, or the like may be formed on the surface of the substrate 61, the surface being opposite to the light incident surface, to form the light-shielding member 631'.

By providing the light-shielding member 631' in the pixel 51 in this way, the infrared light having entered the substrate 61 from the light incident surface via an on-chip lens 62 and transmitted through the substrate 61 without being photoelectrically converted in the substrate 61 can be suppressed from being scattered in a wiring layer and entering a nearby pixel. Thereby, the erroneous detection of light in the nearby pixel can be prevented.

Note that the light-shielding member 631' can also be used as the reflective member 631 by being formed using a material including metal, for example.

Sixteenth Embodiment

<Configuration Example of Pixel>

Moreover, a P-well region including a P-type semiconductor region may be provided instead of an oxide film 64 in a substrate 61 of a pixel 51.

Figure 29:
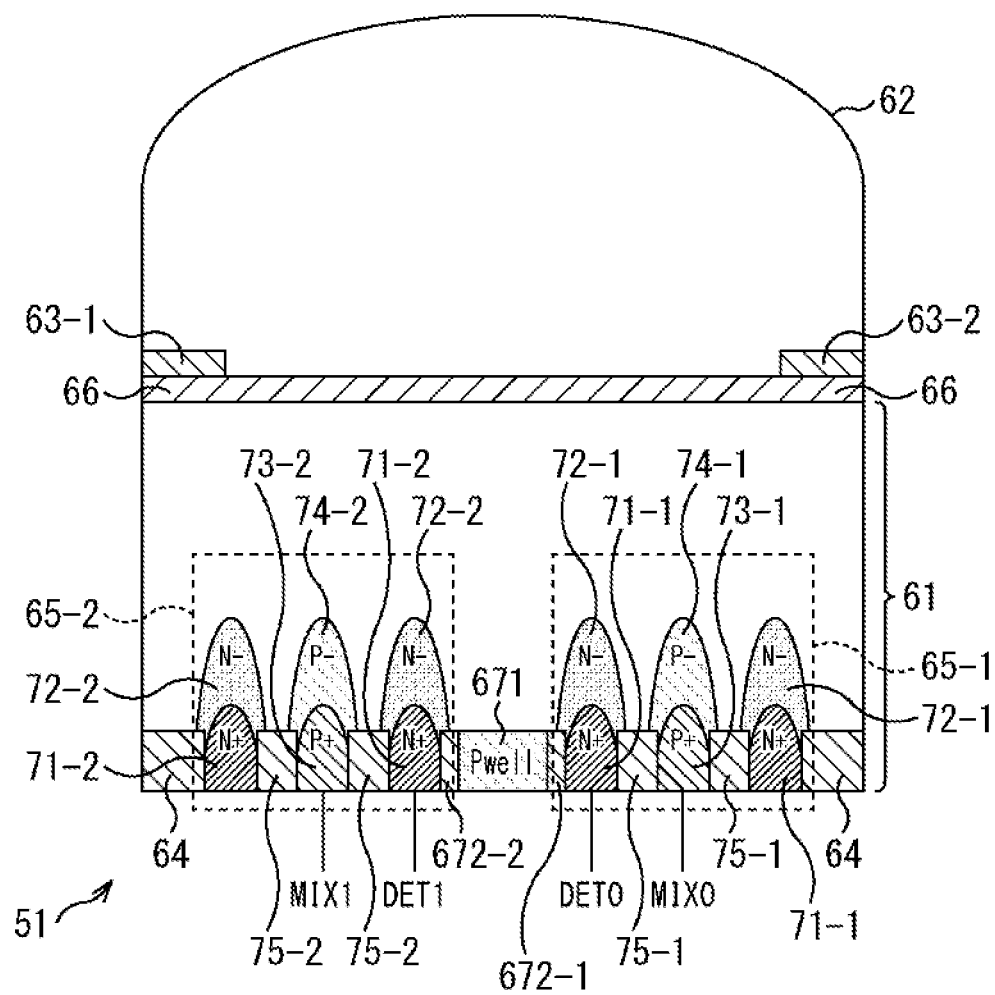
FIG. 29 is a view illustrating another configuration example of the pixel.

In such a case, the pixel 51 is configured as illustrated in FIG. 29, for example. Note that, in FIG. 29, a portion corresponding to the case in FIG. 2 is denoted by the same reference numeral, and description thereof is omitted as appropriate.

The configuration of the pixel 51 illustrated in FIG. 29 is different from that of the pixel 51 illustrated in FIG. 2 in that a P-well region 671, a separation portion 672-1, and a separation portion 672-2 are provided instead of the oxide film 64, and is the same as that of the pixel 51 in FIG. 2 in the other points.

In the example illustrated in FIG. 29, the P-well region 671 including the P-type semiconductor region is formed in a central portion inside the surface of the substrate 61, the surface being opposite to the light incident surface, that is, inside the lower surface in FIG. 29. Furthermore, a separation portion 672-1 for separating the P-well region 671 and an N+ semiconductor region 71-1 is formed using an oxide film and the like between the P-well region 671 and the N+ semiconductor region 71-1. Similarly, a separation portion 672-2 for separating the P-well region 671 and an N+ semiconductor region 71-2 is formed using an oxide film and the like between the P-well region 671 and the N+ semiconductor region 71-2. In the pixel 51 illustrated in FIG. 29, a P− semiconductor region 74 has a larger region upward in FIG. 29 than an N− semiconductor region 72.

Seventeenth Embodiment

<Configuration Example of Pixel>

Furthermore, a P-well region including a P-type semiconductor region may be further provided in addition to an oxide film 64 in a substrate 61 of a pixel 51.

Figure 30:
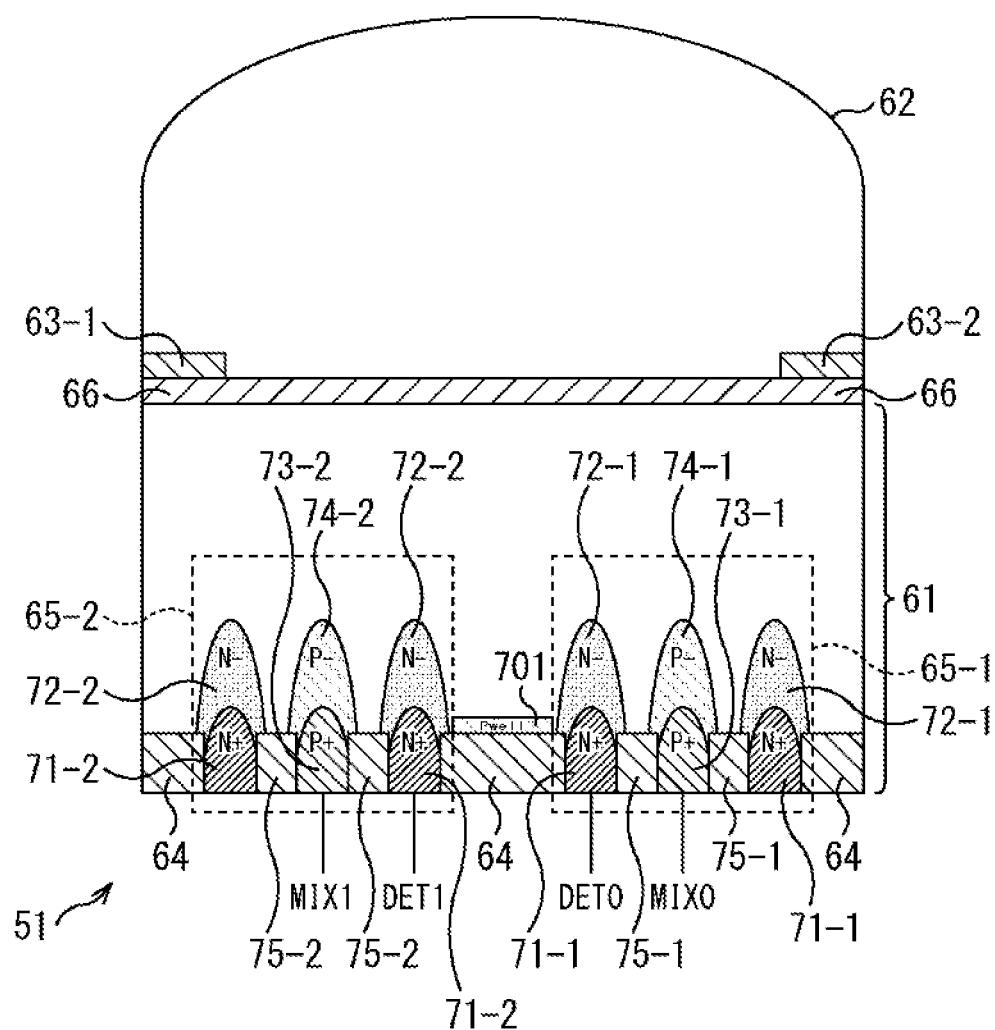
FIG. 30 is a view illustrating another configuration example of the pixel.

In such a case, the pixel 51 is configured as illustrated in FIG. 30, for example. Note that, in FIG. 30, a portion corresponding to the case in FIG. 2 is denoted by the same reference numeral, and description thereof is omitted as appropriate.

The configuration of the pixel 51 illustrated in FIG. 30 is different from that of the pixel 51 illustrated in FIG. 2 in that a P-well region 701 is newly provided, and is the same as that of the pixel 51 in FIG. 2 in the other points. That is, the P-well region 701 including a P-type semiconductor region is formed on an upper side of an oxide film 64 in a substrate 61 in the example illustrated in FIG. 30.

As described above, according to the present technology, a CAPD sensor has a back-illuminated configuration, thereby improving characteristics such as pixel sensitivity.

<Configuration Example of Equivalent Circuit of Pixel>

Figure 31:
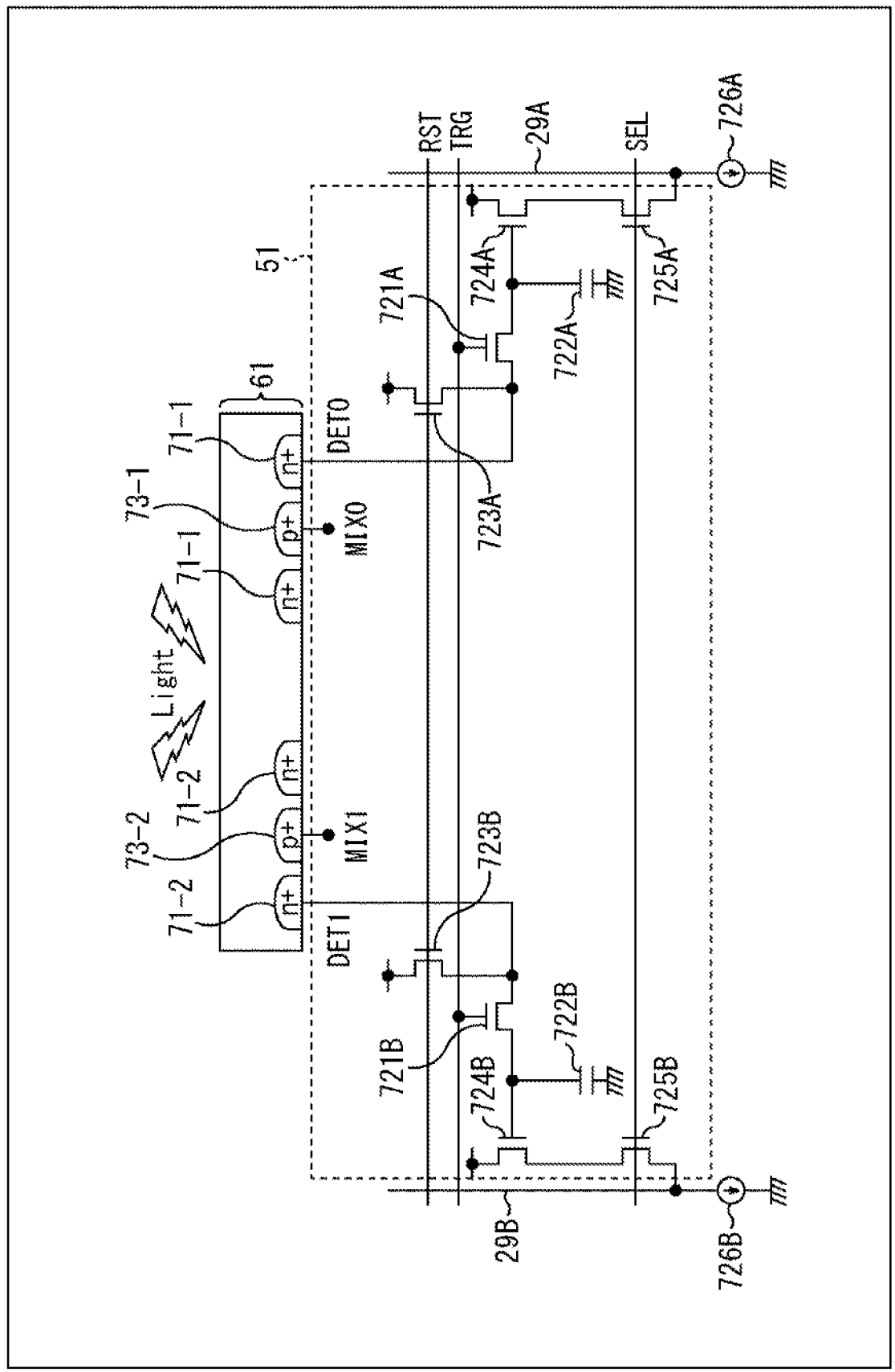
FIG. 31 is a diagram illustrating an equivalent circuit of a pixel.

FIG. 31 illustrates an equivalent circuit of the pixel 51.

The pixel 51 includes a transfer transistor 721A, an FD 722A, a reset transistor 723A, an amplification transistor 724A, and a selection transistor 725A for a signal extraction portion 65-1 including an N+ semiconductor region 71-1, a P+ semiconductor region 73-1, and the like.

Furthermore, the pixel 51 includes a transfer transistor 721B, an FD 722B, a reset transistor 723B, an amplification transistor 724B, and a selection transistor 725B for a signal extraction portion 65-2 including an N+ semiconductor region 71-2, a P+ semiconductor region 73-2, and the like.

A tap drive unit 21 applies a predetermined voltage MIX0 (first voltage) to the P+ semiconductor region 73-1, and applies a predetermined voltage MIX1 (second voltage) to the P+ semiconductor region 73-2. In the above example, one of the voltages MIX0 and MIX1 is 1.5 V and the other is 0 V. The P+ semiconductor regions 73-1 and 73-2 are voltage application portions to which the first voltage or the second voltage is applied.

The N+ semiconductor regions 71-1 and 71-2 are charge detection portions that detect and accumulate charges generated by photoelectrically converting the light having entered the substrate 61.

The transfer transistor 721A becomes conductive in response to an active state of a drive signal TRG supplied to a gate electrode, thereby transferring the charge accumulated in the N+ semiconductor region 71-1 to the FD 722A. The transfer transistor 721B becomes conductive in response to an active state of a drive signal TRG supplied to a gate electrode, thereby transferring the charge accumulated in the N+ semiconductor region 71-2 to the FD 722B.

The FD 722A temporarily retains a charge DET0 supplied from the N+ semiconductor region 71-1. The FD 722B temporarily retains a charge DET1 supplied from the N+ semiconductor region 71-2. The FD 722A corresponds to the FD portion A described with reference to FIG. 2, and the FD 722B corresponds to the FD portion B in FIG. 2.

The reset transistor 723A becomes conductive in response to an active state of a drive signal RST supplied to a gate electrode, thereby resetting a potential of the FD 722A to a predetermined level (power supply voltage VDD). The reset transistor 723B becomes conductive in response to an active state of a drive signal RST supplied to a gate electrode, thereby resetting a potential of the FD 722B to a predetermined level (power supply voltage VDD). Note that the transfer transistors 721A and 721B become active at the same time with the reset transistors 723A 723B becoming active.

The amplification transistor 724A has a source electrode connected to a vertical signal line 29A via the selection transistor 725A to configure a source-follower circuit with a load MOS of a constant current source circuit 726A connected to one end of the vertical signal line 29A. The amplification transistor 724B has a source electrode connected to a vertical signal line 29B via the selection transistor 725B to configure a source-follower circuit with a load MOS of a constant current source circuit 726B connected to one end of the vertical signal line 29B.

The selection transistor 725A is connected between the source electrode of the amplification transistor 724A and the vertical signal line 29A. The selection transistor 725A becomes conductive in response to an active state of a selection signal SEL supplied to a gate electrode, thereby outputting a pixel signal output from the amplification transistor 724A to the vertical signal line 29A.

The selection transistor 725B is connected between the source electrode of the amplification transistor 724B and the vertical signal line 29B. The selection transistor 725B becomes conductive in response to an active state of a selection signal SEL supplied to a gate electrode, thereby outputting a pixel signal output from the amplification transistor 724B to the vertical signal line 29B.

The transfer transistors 721A and 721B of pixel 51, the reset transistors 723A and 723B, the amplification transistors 724A and 724B, and the selection transistors 725A and 725B of the pixel 51 are controlled by, for example, a vertical drive unit 22.

<Configuration Example of Another Equivalent Circuit of Pixel>

Figure 32:
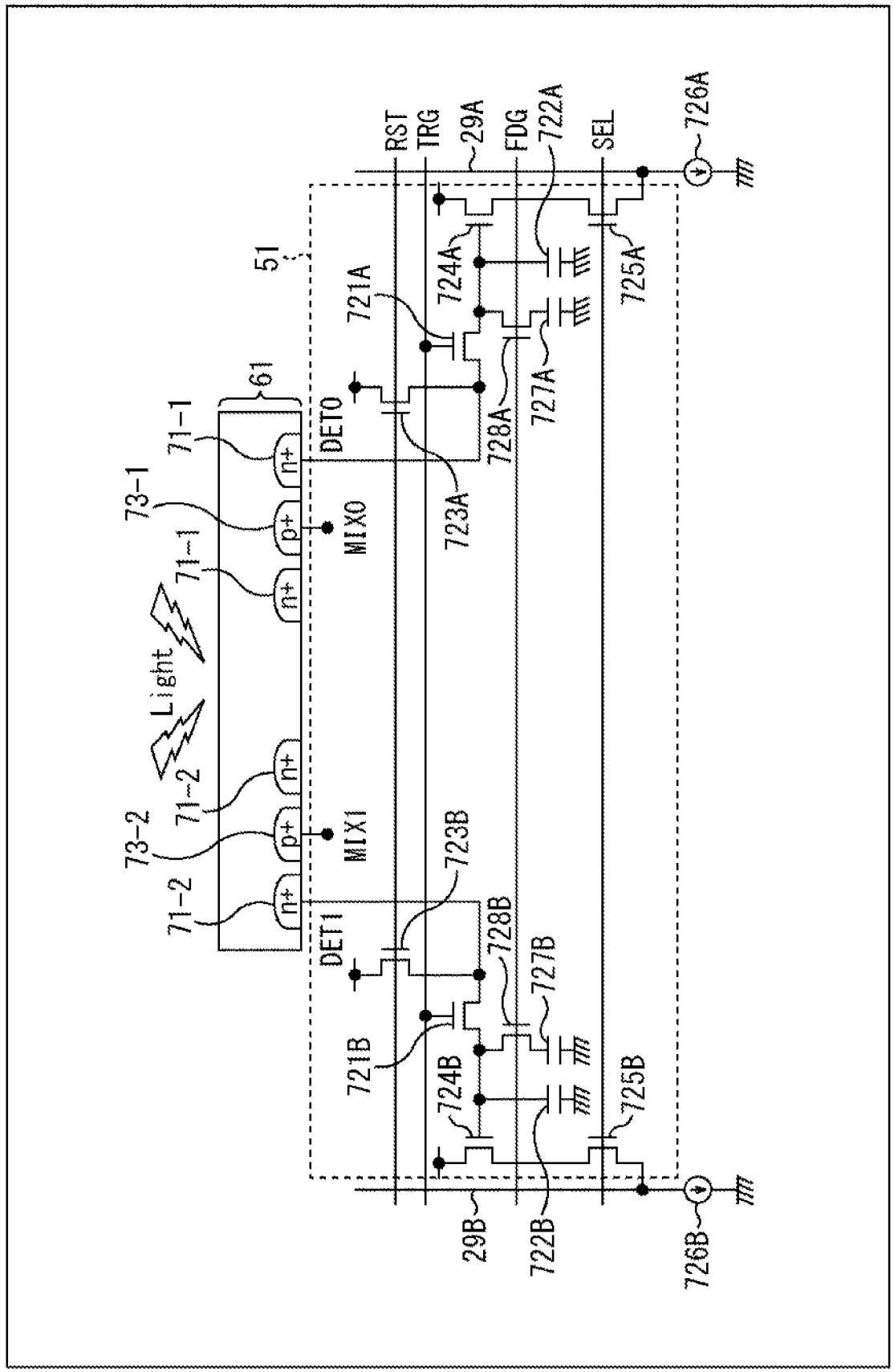
FIG. 32 is a diagram illustrating another equivalent circuit of the pixel.

FIG. 32 illustrates another equivalent circuit of the pixel 51.

Note that, in FIG. 32, a portion corresponding to FIG. 31 is denoted by the same reference numeral, and description thereof is omitted as appropriate.

In the equivalent circuit in FIG. 32, an additional capacitance 727 and a switching transistor 728 for controlling the connection of the additional capacitance 727 are added to both signal extraction portions 65-1 and 65-2 with respect to the equivalent circuit in FIG. 31.

Specifically, an additional capacitance 727A is connected between the transfer transistor 721A and the FD 722A via a switching transistor 728A, and an additional capacitance 727B is connected between the transfer transistor 721B and the FD 722B via a switching transistor 728B.

The switching transistor 728A becomes conductive in response to an active state of a drive signal FDG supplied to a gate electrode, thereby connecting the additional capacitance 727A to the FD 722A. The switching transistor 728B becomes conductive in response to an active state of a drive signal FDG supplied to a gate electrode, thereby connecting the additional capacitance 727B to the FD 722B.

For example, the vertical drive unit 22 connects the FD 722A and the additional capacitance 727A and connects the FD 722B and the additional capacitance 727B with the switching transistors 728A and 728B in the active state when the amount of incident light is high and illuminance is high. Thereby, more charges can be accumulated at the high illuminance.

Meanwhile, when the amount of incident light is low and the illuminance is low, the vertical drive unit 22 sets the switching transistors 728A and 728B to an inactive state and disconnects the additional capacitances 727A and 727B from the FD 722A and 722B, respectively.

Although the additional capacitances 727 may be omitted as in the equivalent circuit in FIG. 31, a high dynamic range can be ensured by providing the additional capacitances 727 and using the additional capacitances 727 properly according to the amount of incident light.

<Arrangement Example of Voltage Supply Line>

Next, arrangement of voltage supply lines for applying the predetermined voltage MIX0 or MIX1 to the P+ semiconductor regions 73-1 and 73-2 as voltage application portions of the signal extraction portions 65 of each pixel 51 will be described with reference to FIGS. 33 to 35. Voltage supply lines 741 illustrated in FIGS. 33 and 34 correspond to voltage supply lines 30 illustrated in FIG. 1.

Figure 33:
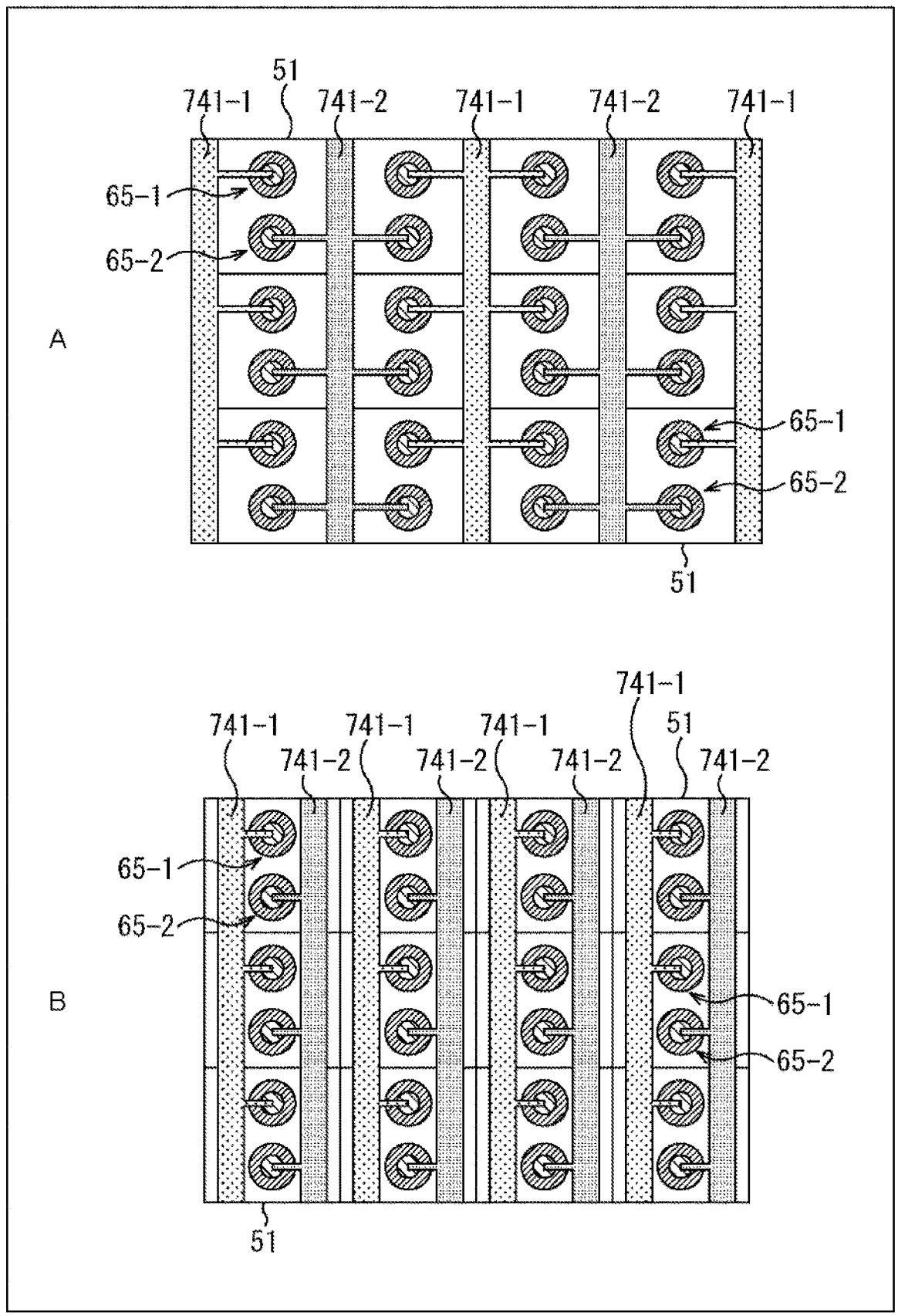
FIG. 33 is views illustrating arrangement examples of voltage supply lines adopting Periodic arrangement.
Figure 34:
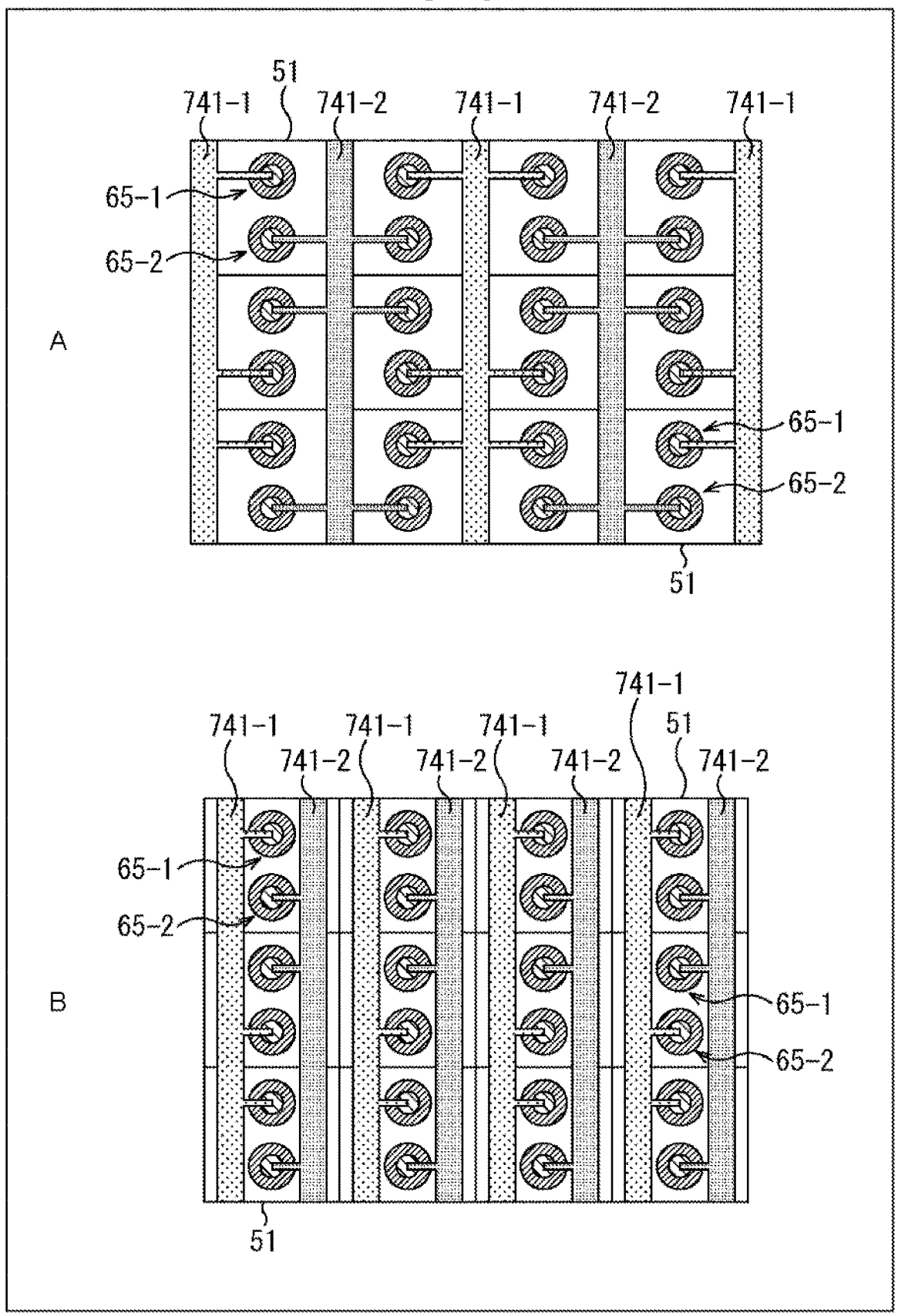
FIG. 34 is views illustrating arrangement examples of voltage supply lines adopting Mirror arrangement.

Note that, in FIGS. 33 and 34, the circular configuration illustrated in FIG. 9 is adopted as the configuration of the signal extraction portion 65 of each pixel 51, but it goes without saying that another configuration may be used.

A in FIG. 33 is a plan view illustrating a first arrangement example of voltage supply lines.

In the first arrangement example, the voltage supply line 741-1 or 741-2 is wired along a vertical direction (in a boundary) between two pixels adjacent in a horizontal direction in a plurality of pixels 51 two-dimensionally arranged in a matrix.

The voltage supply line 741-1 is connected to the P+ semiconductor region 73-1 of the signal extraction portion 65-1 that is one of the two signal extraction portions 65 in the pixel 51. The voltage supply line 741-2 is connected to the P+ semiconductor region 73-2 of the signal extraction portion 65-2 that is the other of the two signal extraction portions 65 in the pixel 51.

In the first arrangement example, the two voltage supply lines 741-1 and 741-2 are arranged for two columns of pixels, so that the number of voltage supply lines 741 arranged in a pixel array unit 20 becomes nearly equal to the number of columns of the pixels 51.

B in FIG. 33 is a plan view illustrating a second arrangement example of voltage supply lines.

In the second arrangement example, the two voltage supply lines 741-1 and 741-2 are wired along the vertical direction for one pixel column in a plurality of pixels 51 two-dimensionally arranged in a matrix.

The voltage supply line 741-1 is connected to the P+ semiconductor region 73-1 of the signal extraction portion 65-1 that is one of the two signal extraction portions 65 in the pixel 51. The voltage supply line 741-2 is connected to the P+ semiconductor region 73-2 of the signal extraction portion 65-2 that is the other of the two signal extraction portions 65 in the pixel 51.

In the second arrangement example, the two voltage supply lines 741-1 and 741-2 are wired for one pixel column, so that four voltage supply lines 741 are arranged for two pixel columns. In the pixel array unit 20, the number of arrayed voltage supply lines 741 is about twice the number of columns of the pixels 51.

Both the arrangement examples in A and B in FIG. 33 are Periodic arrangement in which the configuration in which the voltage supply line 741-1 is connected to the P+ semiconductor region 73-1 of the signal extraction portion 65-1 and the voltage supply line 741-2 is connected to the P+ semiconductor region 73-2 of the signal extraction portion 65-2 is periodically repeated with respect to the pixels arranged in the vertical direction.

In the first arrangement example in A in FIG. 33, the number of voltage supply lines 741-1 and 741-2 to be wired to the pixel array unit 20 can be reduced.

In the second arrangement example in B in FIG. 33, the number of voltage supply lines to be wired is larger than that in the first arrangement example, but the number of signal extraction portions 65 connected to one voltage supply line 741 is ½. Therefore, a wiring load can be reduced, which is effective for high-speed driving and when the total number of pixels of the pixel array unit 20 is large.

A in FIG. 34 is a plan view illustrating a third arrangement example of voltage supply lines.

The third arrangement example is an example in which the two voltage supply lines 741-1 and 741-2 are arranged for two columns of pixels, similarly to the first arrangement example in A in FIG. 33.

The difference of the third arrangement example from the first arrangement example in A in FIG. 33 is that connection destinations of the signal extraction portions 65-1 and 65-2 are different in the two pixels arranged in the vertical direction.

Specifically, for example, in a certain pixel 51, the voltage supply line 741-1 is connected to the P+ semiconductor region 73-1 of the signal extraction portion 65-1, and the voltage supply line 741-2 is connected to the P+ semiconductor region 73-2 of the signal extraction portion 65-2. In a pixel 51 above or below the aforementioned pixel 51, the voltage supply line 741-1 is connected to the P+ semiconductor region 73-2 of the signal extraction portion 65-2, and the voltage supply line 741-2 is connected to the P+ semiconductor region 73-1 of the signal extraction portion 65-1.

B in FIG. 34 is a plan view illustrating a fourth arrangement example of voltage supply lines.

The fourth arrangement example is an example in which the two voltage supply lines 741-1 and 741-2 are arranged for two columns of pixels, similarly to the second arrangement example in B in FIG. 33.

The difference of the fourth arrangement example from the second arrangement example in B in FIG. 33 is that connection destinations of the signal extraction portions 65-1 and 65-2 are different in the two pixels arranged in the vertical direction.

Specifically, for example, in a certain pixel 51, the voltage supply line 741-1 is connected to the P+ semiconductor region 73-1 of the signal extraction portion 65-1, and the voltage supply line 741-2 is connected to the P+ semiconductor region 73-2 of the signal extraction portion 65-2. In a pixel 51 above or below the aforementioned pixel 51, the voltage supply line 741-1 is connected to the P+ semiconductor region 73-2 of the signal extraction portion 65-2, and the voltage supply line 741-2 is connected to the P+ semiconductor region 73-1 of the signal extraction portion 65-1.

In the third arrangement example in A in FIG. 34, the number of voltage supply lines 741-1 and 741-2 to be wired to the pixel array unit 20 can be reduced.

In the fourth arrangement example in B in FIG. 34, the number of voltage supply lines to be wired is larger than that in the third arrangement example, but the number of signal extraction portions 65 connected to one voltage supply line 741 is ½. Therefore, a wiring load can be reduced, which is effective for high-speed driving and when the total number of pixels of the pixel array unit 20 is large.

Both the arrangement examples in A and B in FIG. 34 are Mirror arrangement in which the connection destinations of two pixels adjacent in an up-down direction (vertical direction) are mirror-inverted.

In the Periodic arrangement, the voltage to be applied to the two signal extraction portions 65 adjacent across the pixel boundary are different, and thus charges are exchanged between the adjacent pixels, as illustrated in A in FIG. 35. Therefore, the charge transfer efficiency is better in the Periodic arrangement than the Mirror arrangement, but the crosstalk characteristics of adjacent pixels are inferior in the Periodic arrangement to the Mirror arrangement.

Meanwhile, in the Mirror arrangement, the voltage to be applied to the two signal extraction portions 65 adjacent across the pixel boundary are the same, and thus exchange of charges between the adjacent pixels is suppressed, as illustrated in B in FIG. 35. Therefore, the charge transfer efficiency is inferior in the Mirror arrangement to the Periodic arrangement, but the crosstalk characteristics of adjacent pixels are better in the Mirror arrangement than the Periodic arrangement.

<Cross-Sectional Configuration of Plurality of Pixels According to Fourteenth Embodiment>

In the cross-sectional configuration of the pixel illustrated in FIG. 2 or the like, illustration of the multilayer wiring layer formed on the front surface side opposite to the light incident surface of the substrate 61 has been omitted.

Therefore, hereinafter, cross-sectional views of a plurality of adjacent pixels will be illustrated in a form not omitting the multilayer wiring layer, for some of the above-described embodiments.

Figure 37:
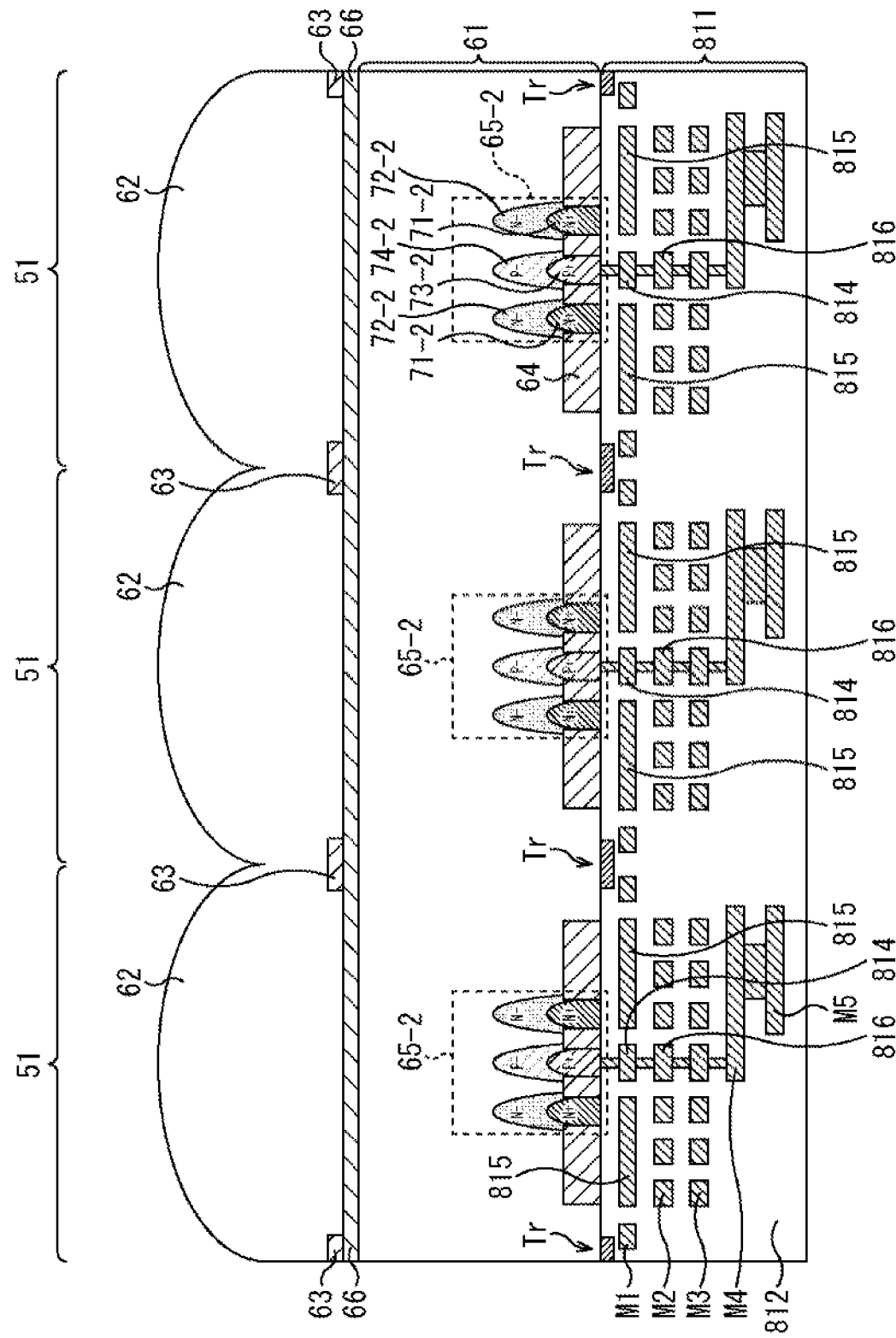
FIG. 37 is a cross-sectional view of a plurality of pixels in the fourteenth embodiment.

First, FIGS. 36 and 37 illustrate cross-sectional views of a plurality of the pixels according to the fourteenth embodiment illustrated in FIG. 28.

The fourteenth embodiment illustrated in FIG. 28 has the pixel configuration provided with the large-area reflective member 631 on the opposite side of the light incident surface of the substrate 61.

FIG. 36 corresponds to a cross-sectional view taken along the line B-B' in FIG. 11, and FIG. 37 corresponds to a cross-sectional view taken along the line A-A' in FIG. 11. Furthermore, the cross-sectional view taken along the line C-C' in FIG. 17 can also be illustrated as in FIG. 36.

As illustrated in FIG. 36, in each pixel 51, the oxide film 64 is formed in the central portion, and the signal extraction portion 65-1 and the signal extraction portion 65-2 are formed on both sides of the oxide film 64.

In the signal extraction portion 65-1, the N+ semiconductor region 71-1 and the N− semiconductor region 72-1 are formed to surround the P+ semiconductor region 73-1 and the P− semiconductor region 74-1 centered on the P+ semiconductor region 73-1 and the P− semiconductor region 74-1. The P+ semiconductor region 73-1 and the N+ semiconductor region 71-1 are in contact with a multilayer wiring layer 811. The P− semiconductor region 74-1 is arranged above the P+ semiconductor region 73-1 (on the on-chip lens 62 side) to cover the P+ semiconductor region 73-1, and the N− semiconductor region 72-1 is arranged above the N+ semiconductor region 71-1 (on the on-chip lens 62 side) to cover the N+ semiconductor region 71-1. In other words, the P+ semiconductor region 73-1 and the N+ semiconductor region 71-1 are arranged in the substrate 61 on the multilayer wiring layer 811 side, and the N− semiconductor region 72-1 and the P− semiconductor region 74-1 are arranged in the substrate 61 on the on-chip lens 62 side. Furthermore, the separation portion 75-1 for separating the N+ semiconductor region 71-1 and the P+ semiconductor region 73-1 is formed using oxide film or the like between the N+ semiconductor region 71-1 and the P+ semiconductor region 73-1.

In the signal extraction portion 65-2, the N+ semiconductor region 71-2 and the N− semiconductor region 72-2 are formed to surround the P+ semiconductor region 73-2 and the P− semiconductor region 74-2 centered on the P+ semiconductor region 73-2 and the P− semiconductor region 74-2. The P+ semiconductor region 73-2 and the N+ semiconductor region 71-2 are in contact with the multilayer wiring layer 811. The P− semiconductor region 74-2 is arranged above the P+ semiconductor region 73-2 (on the on-chip lens 62) to cover the P+ semiconductor region 73-2, and the N− semiconductor region 72-2 is arranged above the N+ semiconductor region 71-2 (on the on-chip lens 62 side) to cover the N+ semiconductor region 71-2. In other words, the P+ semiconductor region 73-2 and the N+ semiconductor region 71-2 are arranged in the substrate 61 on the multilayer wiring layer 811 side, and the N− semiconductor region 72-2 and the P− semiconductor region 74-2 are arranged in the substrate 61 on the on-chip lens 62 side. Furthermore, a separation portion 75-2 for separating the N+ semiconductor region 71-2 and the P+ semiconductor region 73-2 is formed using an oxide film and the like between the N+ semiconductor region 71-2 and the P+ semiconductor region 73-2.

The oxide film 64 is formed between the N+ semiconductor region 71-1 of the signal extraction portion 65-1 of a predetermined pixel 51 and the N+ semiconductor region 71-2 of the signal extraction portion 65-2 of a pixel 51 adjacent to the predetermined pixel 51, in a boundary region between the adjacent pixels 51.

The fixed charge film 66 is formed in the interface of the substrate 61 on the light incident surface side (upper side in FIGS. 36 and 37).

As illustrated in FIG. 36, when the on-chip lens 62 formed on the light incident surface side of the substrate 61 for each pixel is divided into a raised portion 821 in which the thickness is uniformly raised in a height direction in the entire region in the pixel, and a curved portion 822 in which the thickness is different depending on the position in the pixel, the thickness of the raised portion 821 is formed to be thinner than the thickness of the curved portion 822. Since the oblique incident light is more likely to be reflected by the inter-pixel light-shielding film 63 as the raised portion 821 becomes thicker, the oblique incident light can be taken into the substrate 61 by forming the raised portion 821 to be thinner in thickness. Furthermore, the incident light can be condensed to the pixel center as the curved portion 822 is formed to be thicker.

The multilayer wiring layer 811 is formed on the side of the substrate 61, the side being opposite to the light incident surface side on which the on-chip lens 62 is formed for each pixel. In other words, the substrate 61 that is a semiconductor layer is arranged between the on-chip lens 62 and the multilayer wiring layer 811. The multilayer wiring layer 811 includes five-layer metal films M1 to M5 and an interlayer insulating film 812 therebetween. Note that, in FIG. 36, the outermost metal film M5 among the five-layer metal films M1 to M5 of the multilayer wiring layer 811 is not illustrated because M5 is out of sight, but M5 is illustrated in FIG. 37 that is a cross-sectional view from a direction different from the cross-sectional view in FIG. 36.

As illustrated in FIG. 37, a pixel transistor Tr is formed in a pixel boundary region of an interface portion of the multilayer wiring layer 811 with the substrate 61. The pixel transistor Tr is one of the transfer transistor 721, the reset transistor 723, the amplification transistor 724, and the selection transistor 725 illustrated in FIGS. 31 and 32.

The metal film M1 closest to the substrate 61 among the five-layer metal films M1 to M5 of the multilayer wiring layer 811 includes a power supply line 813 for supplying a power supply voltage, voltage application wiring 814 for applying a predetermined voltage to the P+ semiconductor region 73-1 or 73-2, and a reflective member 815 that is a member that reflects the incident light. In the metal film M1 in FIG. 36, the wiring other than the power supply line 813 and the voltage application wiring 814 is the reflective member 815, but some reference numerals are omitted to prevent complication of the drawing. The reflective member 815 is dummy wiring provided for the purpose of reflecting incident light, and corresponds to the reflective member 631 illustrated in FIG. 28. The reflective member 815 is arranged below the N+ semiconductor regions 71-1 and 71-2 that are charge detection portions to overlap with the N+ semiconductor regions 71-1 and 71-2 in plan view. Note that, in a case where the light-shielding member 631' in the fifteenth embodiment is provided instead of the reflective member 631 in the fourteenth embodiment illustrated in FIG. 28, the reflective member 815 in FIG. 36 becomes the light-shielding member 631'.

Furthermore, in the metal film M1, charge extraction wiring (not illustrated in FIG. 36) connecting the N+ semiconductor region 71 and the transfer transistor 721 is also formed in order to transfer the charge accumulated in the N+ semiconductor region 71 to the FD 722.

Note that, in this example, the reflective member 815 (reflective member 631) and the charge extraction wiring are arranged in the same layer of the metal film M1. However, the arrangement is not necessarily limited to the arrangement in the same layer.

In the second-layer metal film M2 from the substrate 61 side, for example, voltage application wiring 816 connected to the voltage application wiring 814 of the metal film M1, a control line 817 for transmitting the drive signal TRG, the drive signal RST, the selection signal SEL, the drive signal FDG, and the like, and a ground line are formed. Furthermore, in the metal film M2, the FD 722B and the additional capacitance 727A are formed.

In the third-layer metal film M3 from the substrate 61 side, the vertical signal line 29, a VSS wire for shielding, and the like are formed, for example.

In the fourth-layer metal film M4 and the fifth-layer metal film M5 from the substrate 61 side, the voltage supply lines 741-1 and 741-2 (FIGS. 33 and 34) for applying the predetermined voltage MIX0 or MIX1 to the P+ semiconductor regions 73-1 and 73-2 that are voltage application portions of the signal extraction portions 65 are formed, for example.

Note that the planar arrangement of the five-layer metal films M1 to M5 of the multilayer wiring layer 811 will be described below with reference to FIGS. 42 and 43.

<Cross-Sectional Configuration of Plurality of Pixels According to Ninth Embodiment>

Figure 38:
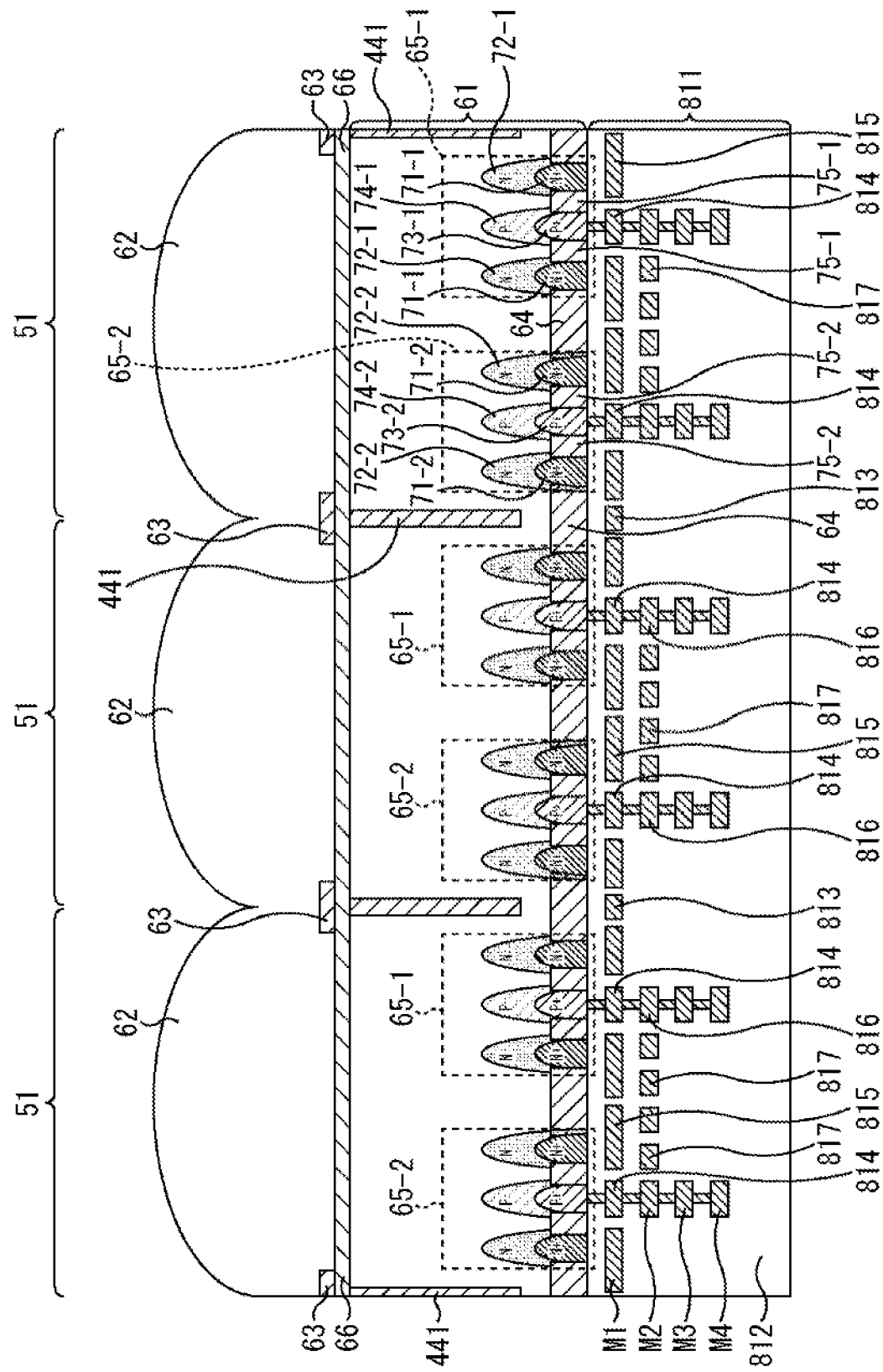
FIG. 38 is a cross-sectional view of a plurality of pixels in a ninth embodiment.

FIG. 38 is a cross-sectional view illustrating a pixel structure according to the ninth embodiment illustrated in FIG. 22, for a plurality of pixels without omitting the multilayer wiring layer.

The ninth embodiment illustrated in FIG. 22 has the pixel configuration provided with the separation region 441 in the pixel boundary portion in the substrate 61, the separation region 441 being obtained by forming a long groove (trench) up to the predetermined depth from the back surface (light incident surface) side of the substrate 61 and embedding the light-shielding film.

The other configurations including, for example, the signal extraction portions 65-1 and 65-2 and the five-layer metal films M1 to M5 of the multilayer wiring layer 811 are similar to the configuration illustrated in FIG. 36.

<Cross-Sectional Configuration of Plurality of Pixels According to Modification 1 of Ninth Embodiment>

Figure 39:
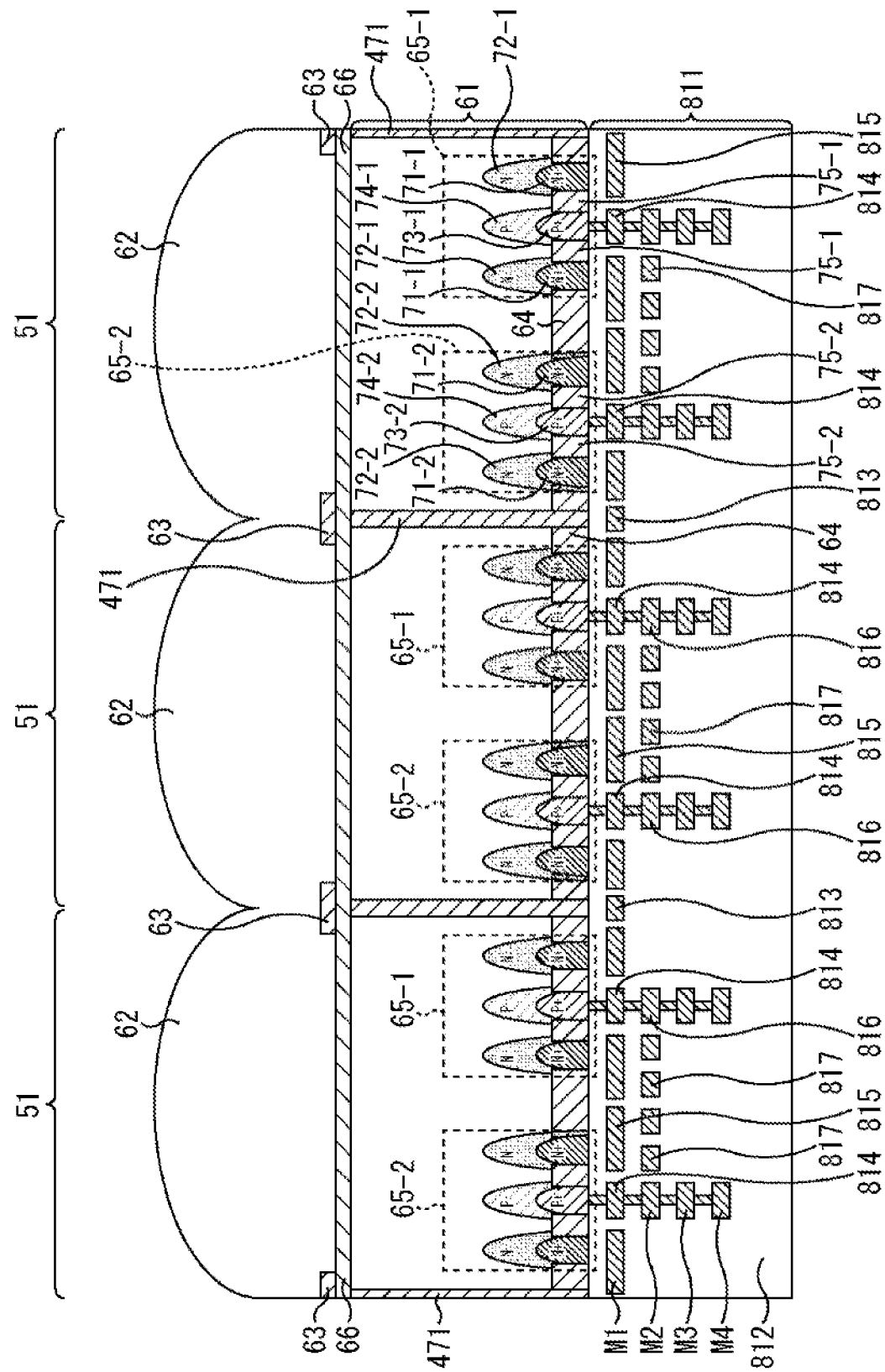
FIG. 39 is a cross-sectional view of a plurality of pixels in a modification 1 of the ninth embodiment.

FIG. 39 is a cross-sectional view illustrating a pixel structure according to Modification 1 of the ninth embodiment illustrated in FIG. 23, for a plurality of pixels without omitting the multilayer wiring layer.

Modification 1 of the ninth embodiment illustrated in FIG. 23 has the pixel configuration provided with the separation region 471 penetrating the entire substrate 61 in the pixel boundary portion in the substrate 61.

The other configurations including, for example, the signal extraction portions 65-1 and 65-2 and the five-layer metal films M1 to M5 of the multilayer wiring layer 811 are similar to the configuration illustrated in FIG. 36.

<Cross-Sectional Configuration of Plurality of Pixels According to Sixteenth Embodiment>

Figure 40:
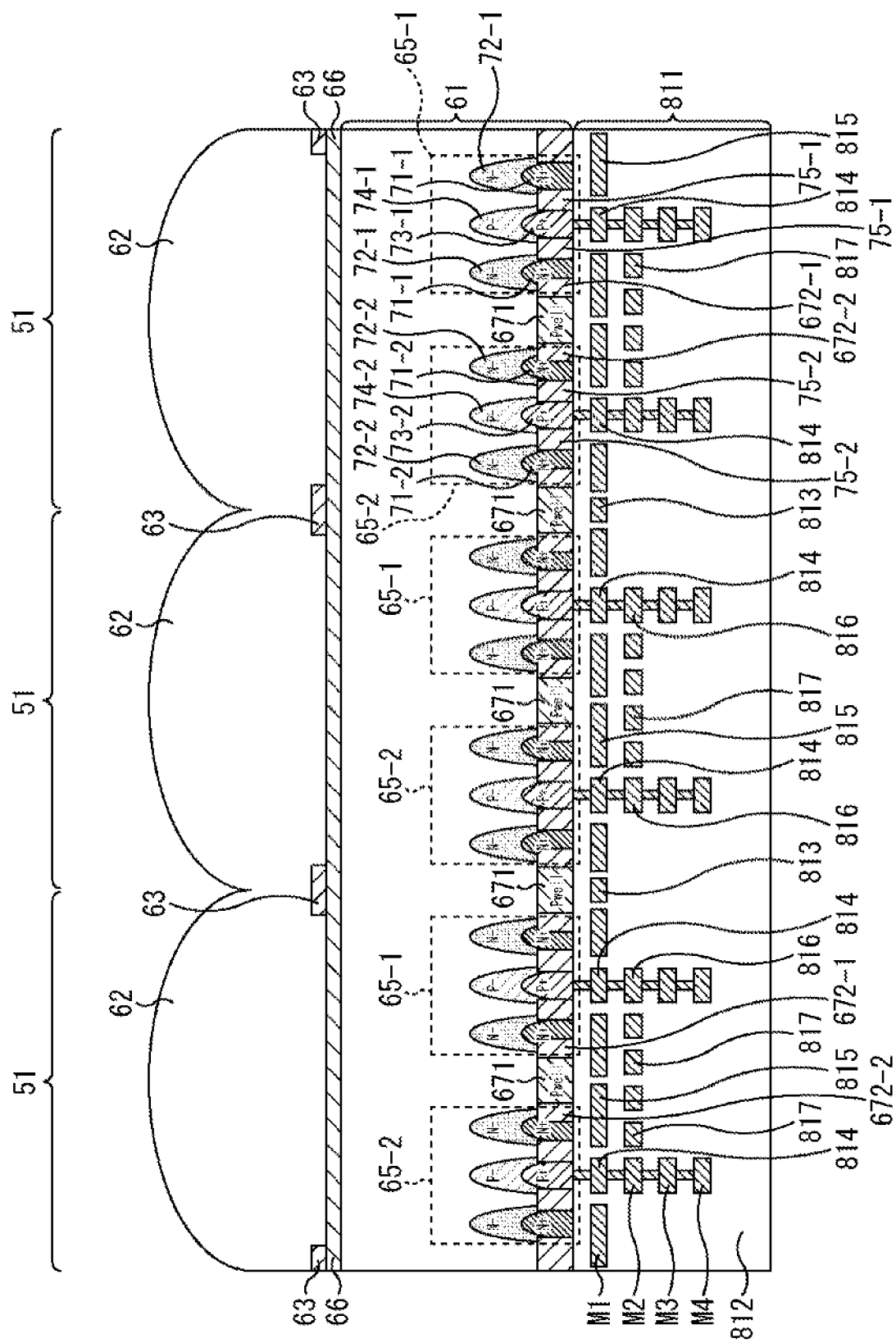
FIG. 40 is a cross-sectional view of a plurality of pixels in a fifteenth embodiment.

FIG. 40 is a cross-sectional view illustrating a pixel structure according to the sixteenth embodiment illustrated in FIG. 29, for a plurality of pixels without omitting the multilayer wiring layer.

The sixteenth embodiment illustrated in FIG. 29 has a configuration provided with the P-well region 671 in the central portion inside the surface of the substrate 61, the surface being opposite to the light incident surface, that is, inside the lower surface in FIG. 29. Furthermore, the separation portion 672-1 is formed using an oxide film and the like between the P-well region 671 and the N+ semiconductor region 71-1. Similarly, the separation portion 672-2 is formed using an oxide film and the like between the P-well region 671 and the N+ semiconductor region 71-2. The P-well region 671 is also formed in a pixel boundary portion of the lower surface of the substrate 61.

The other configurations including, for example, the signal extraction portions 65-1 and 65-2 and the five-layer metal films M1 to M5 of the multilayer wiring layer 811 are similar to the configuration illustrated in FIG. 36.

<Cross-Sectional Configuration of Plurality of Pixels According to Tenth Embodiment>

Figure 41:
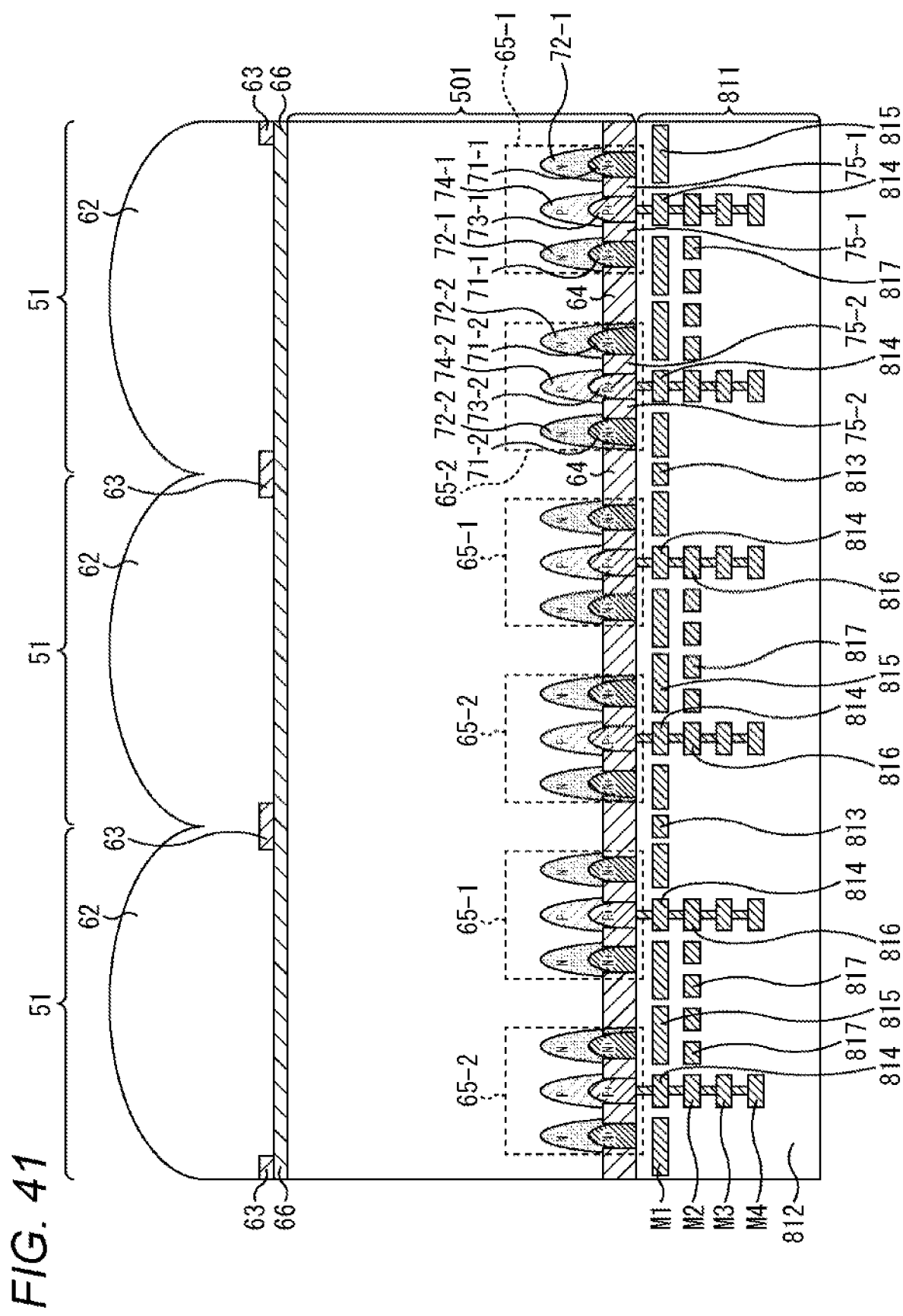
FIG. 41 is a cross-sectional view of a plurality of pixels in a tenth embodiment.

FIG. 41 is a cross-sectional view illustrating a pixel structure according to the tenth embodiment illustrated in FIG. 24, for a plurality of pixels without omitting the multilayer wiring layer.

The tenth embodiment illustrated in FIG. 24 has the pixel configuration provided with the substrate 501 having a thick substrate instead of the substrate 61.

The other configurations including, for example, the signal extraction portions 65-1 and 65-2 and the five-layer metal films M1 to M5 of the multilayer wiring layer 811 are similar to the configuration illustrated in FIG. 36.

<Planar Arrangement Example of Five-layer Metal Films M1 to M5>

Next, the planar arrangement example of the five-layer metal films M1 to M5 of the multilayer wiring layer 811 illustrated in FIGS. 36 to 41 will be described with reference to FIGS. 42 and 43.

Figure 42:
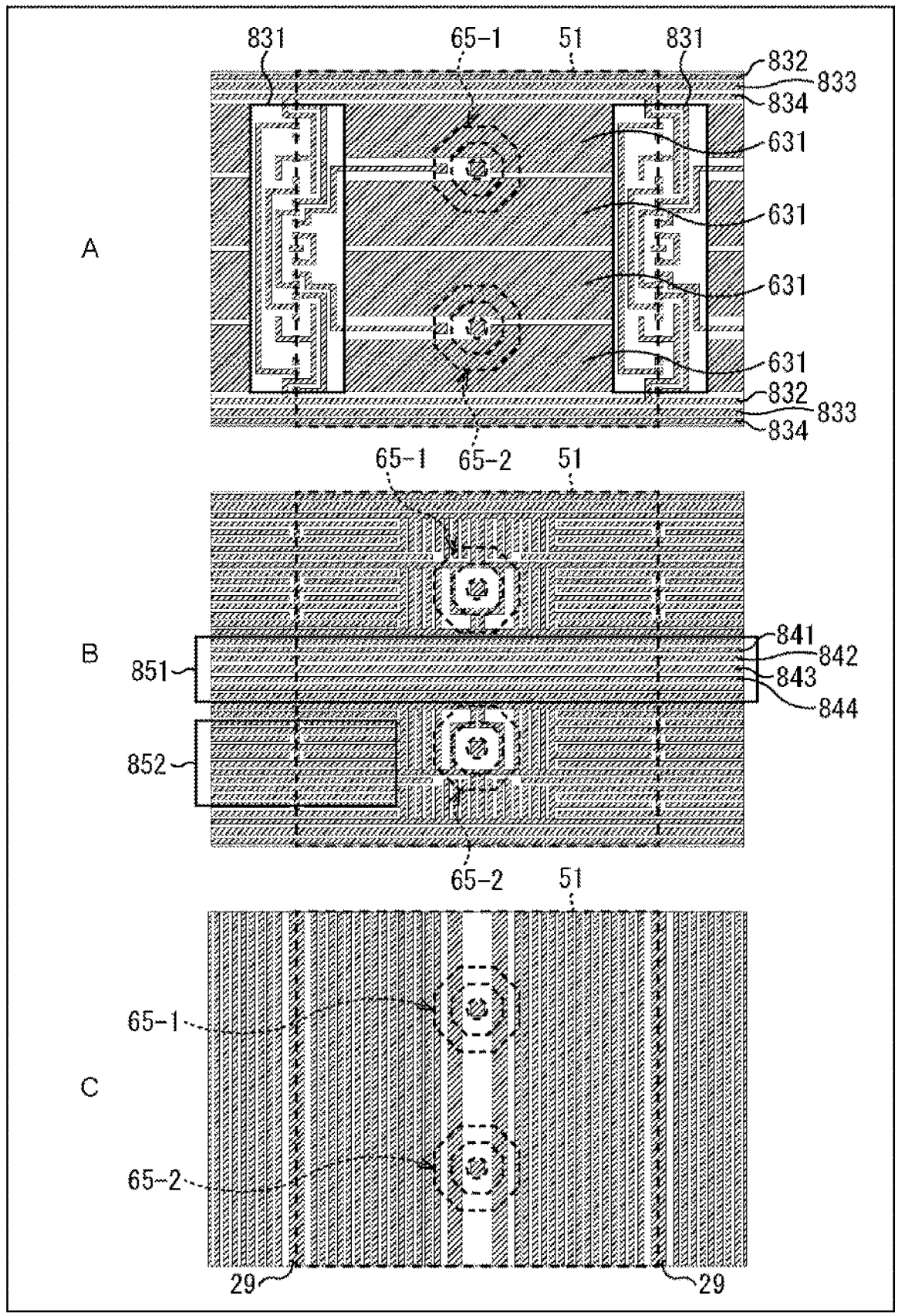
FIG. 42 is views for describing a five-layer metal film of a multilayer wiring layer.

A in FIG. 42 illustrates the planar arrangement example of the metal film M1 as the first layer among the five-layer metal films M1 to M5 of the multilayer wiring layer 811.

B in FIG. 42 illustrates the planar arrangement example of the metal film M2 as the second layer among the five-layer metal films M1 to M5 of the multilayer wiring layer 811.

C in FIG. 42 illustrates the planar arrangement example of the metal film M3 as the third layer among the five-layer metal films M1 to M5 of the multilayer wiring layer 811.

Figure 43:
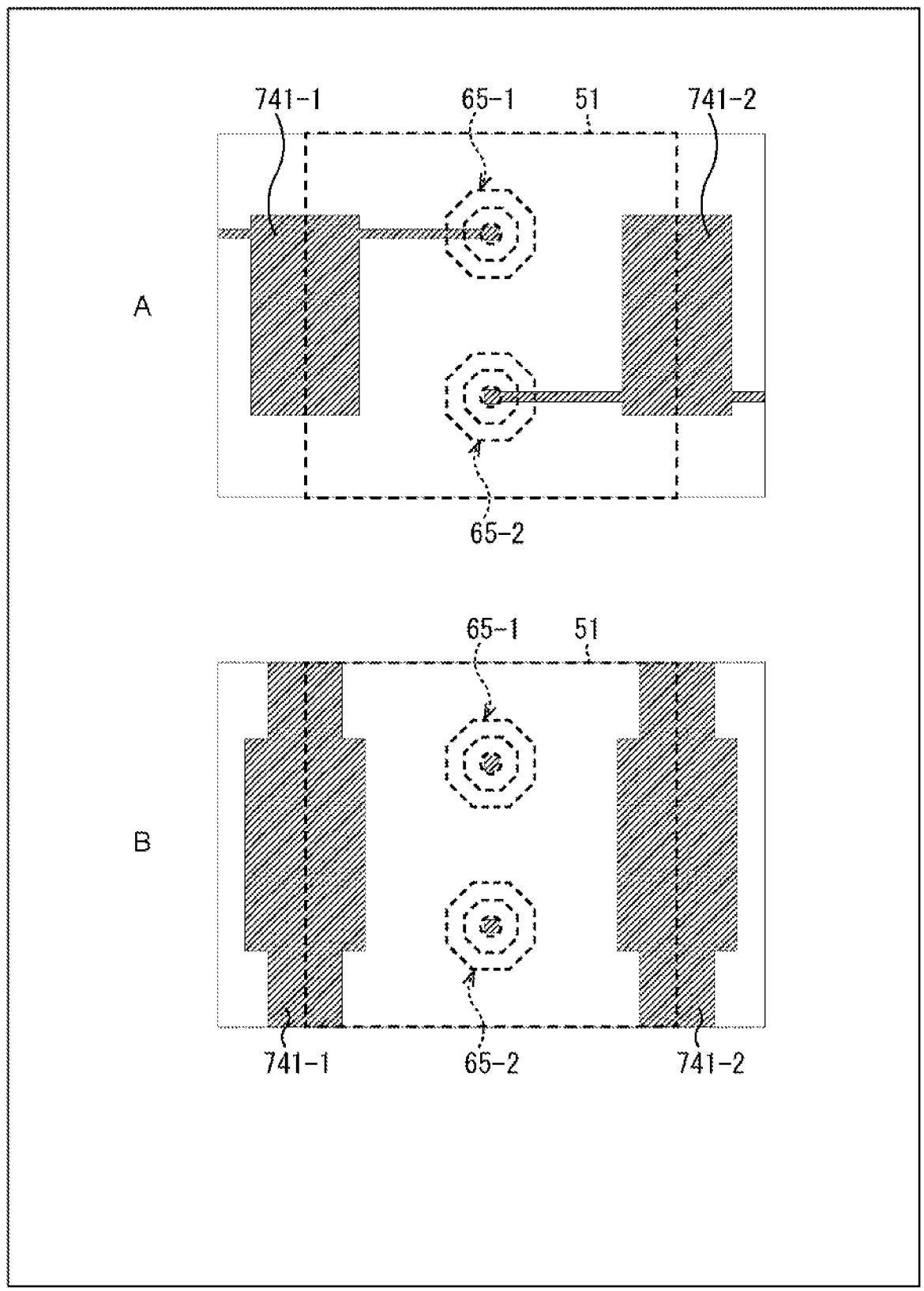
FIG. 43 is views for describing a five-layer metal film of a multilayer wiring layer.

A in FIG. 43 illustrates the planar arrangement example of the metal film M4 as the fourth layer among the five-layer metal films M1 to M5 of the multilayer wiring layer 811.

B in FIG. 43 illustrates the planar arrangement example of the metal film M5 as the fifth layer among the five-layer metal films M1 to M5 of the multilayer wiring layer 811.

In A to C in FIG. 42 and A and B in FIG. 43, the region of the pixel 51 and the regions of the signal extraction portions 65-1 and 65-2 having an octagonal shape illustrated in FIG. 11 are illustrated by broken lines.

In A to C in FIG. 42 and A and B in FIG. 43, the up-down direction in the drawings is the vertical direction of the pixel array unit 20, and the cross direction in the drawings is the horizontal direction of the pixel array unit 20.

As illustrated in A in FIG. 42, the reflective member 631 that reflects the infrared light is formed in the metal film M1 that is the first layer of the multilayer wiring layer 811. In the region of the pixel 51, two reflective members 631 are formed for each of the signal extraction portions 65-1 and 65-2, and the two reflective members 631 for the signal extraction portion 65-1 and the two reflective members 631 for the signal extraction portion 65-1 are formed symmetrically in the vertical direction.

Furthermore, a pixel transistor wiring region 831 is arranged in a space between the reflective members 631 of the pixel 51 and reflective members 631 of a pixel 51 adjacent in the horizontal direction. In the pixel transistor wiring region 831, wiring for connecting the pixel transistors Tr of the transfer transistor 721, the reset transistor 723, the amplification transistor 724, or the selection transistor 725 is formed. The wiring for the pixel transistor Tr is also formed symmetrically in the vertical direction with reference to an intermediate line (not illustrated) of the two signal extraction portions 65-1 and 65-2.

Furthermore, wires such as a ground line 832, a power supply line 833, and a ground line 834 are formed in a space between the reflective member 631 of the pixel and a reflective member 631 of a pixel 51 adjacent in the vertical direction. These wires are also formed symmetrically in the vertical direction with reference to the intermediate line of the two signal extraction portions 65-1 and 65-2.

In this way, the first-layer metal film M1 is symmetrically arranged in the region on the signal extraction portion 65-1 side and the region on the signal extraction portion 65-2 side in the pixel, so that a wiring load is evenly adjusted between the signal extraction portions 65-1 and 65-2. Thereby, drive variation of the signal extraction portions 65-1 and 65-2 is reduced.

In the first-layer metal film M1, the large-area reflective members 631 are formed under the signal extraction portions 65-1 and 65-2 formed in the substrate 61, so that the infrared light having entered the substrate 61 via the on-chip lens 62 and transmitted through the substrate 61 without being photoelectrically converted in the substrate 61 can be reflected by the reflective members 631 to re-enter the substrate 61. As a result, the amount of infrared light photoelectrically converted in the substrate 61 can be increased, and quantum efficiency (QE), that is, the sensitivity of the pixel 51 to infrared light can be improved.

Meanwhile, in the first-layer metal film M1, in the case of arranging the light-shielding member 631' in the same region as the reflective members 631 instead of the reflective members 631, the infrared light having entered the substrate 61 from the light incident surface via the on-chip lens 62 and transmitted through the substrate 61 without being photoelectrically converted in the substrate 61 can be suppressed from being scattered in the wiring layer and entering a nearby pixel. Thereby, the erroneous detection of light in the nearby pixel can be prevented.

As illustrated in B in FIG. 42, in the metal film M2 as the second layer of the multilayer wiring layer 811, a control line region 851 in which control lines 841 to 844 and the like for transmitting a predetermined signal in the horizontal direction are formed is arranged at a position between the signal extraction portions 65-1 and 65-2. The control lines 841 to 844 are lines for transmitting, for example, the drive signal TRG, the drive signal RST, the selection signal SEL, or the drive signal FDG.

By arranging the control line region 851 between the two signal extraction portions 65, influences on each of the signal extraction portions 65-1 and 65-2 become equal, and the drive variation of the signal extraction portions 65-1 and 65-2 can be reduced.

Furthermore, a capacitance region 852 in which the FD 722B and the additional capacitance 727A are formed is arranged in a predetermined region different from the control line region 851 of the metal film M2 as the second layer. In the capacitance region 852, the FD 722B or the additional capacitance 727A is configured by forming the metal film M2 in a comb-teeth shape.

By arranging the FD 722B or the additional capacitance 727A in the metal film M2 as the second layer, the pattern of the FD 722B or the additional capacitance 727A can be freely arranged according to a desired wiring capacitance in the design, and the design freedom can be improved.

As illustrated in C in FIG. 42, in the metal film M3 as the third layer of the multilayer wiring layer 811, at least the vertical signal line 29 for transmitting the pixel signal output from each pixel 51 to the column processing unit 23 is formed. Three or more vertical signal lines 29 can be arranged for one pixel column in order to improve a read speed of the pixel signal. Furthermore, shielding wiring may be arranged to reduce a coupling capacitance, in addition to the vertical signal lines 29.

In the fourth-layer metal film M4 and the fifth-layer metal film M5 of the multilayer wiring layer 811, the voltage supply lines 741-1 and 741-2 for applying the predetermined voltage MIX0 or MIX1 are formed in the P+ semiconductor regions 73-1 and 73-2 of the signal extraction portions 65 of each pixel 51.

The metal film M4 and the metal film M5 illustrated in A and B in FIG. 43 illustrate an example of adopting the voltage supply lines 741 of the first arrangement example illustrated in A in FIG. 33.

The voltage supply line 741-1 of the metal film M4 is connected to the voltage application wiring 814 (for example, FIG. 36) of the metal film M1 via the metal films M3 and M2, and the voltage application wiring 814 is connected to the P+ semiconductor region 73-1 of the signal extraction portion 65-1 of the pixel 51. Similarly, the voltage supply line 741-2 of the metal film M4 is connected to the voltage application wiring 814 (for example, FIG. 36) of the metal film M1 via the metal films M3 and M2, and the voltage application wiring 814 is connected to the P+ semiconductor region 73-2 of the signal extraction portion 65-2 of the pixel 51.

The voltage supply lines 741-1 and 741-2 of the metal film M5 are connected to the tap drive unit 21 around the pixel array unit 20. The voltage supply line 741-1 of the metal film M4 and the voltage supply line 741-1 of the metal film M5 are connected by a via or the like (not illustrated) at a predetermined position in a plane region where both of the metal films are present. The predetermined voltage MIX0 or MIX1 from the tap drive unit 21 is transmitted through the voltage supply lines 741-1 and 741-2 of the metal film M5 and is supplied to the voltage supply lines 741-1 and 741-2 of the metal film M4, and is supplied from the voltage supply lines 741-1 and 741-2 to the voltage application wiring 814 of the metal film M1 via the metal films M3 and M2.

By adopting the back-illuminated CAPD sensor as the light-receiving element 1, the wiring width and layout of the drive wiring can be freely designed, such as the voltage supply lines 741-1 and 741-2 for applying the predetermined voltage MIX0 or MIX1 to the signal extraction portion 65 of each pixel 51 being wired in the vertical direction, as illustrated in A and B in FIG. 43. Furthermore, wiring suitable for high-speed driving and wiring considering load reduction are also possible.

<Planar Arrangement Example of Pixel Transistors>

Figure 44:
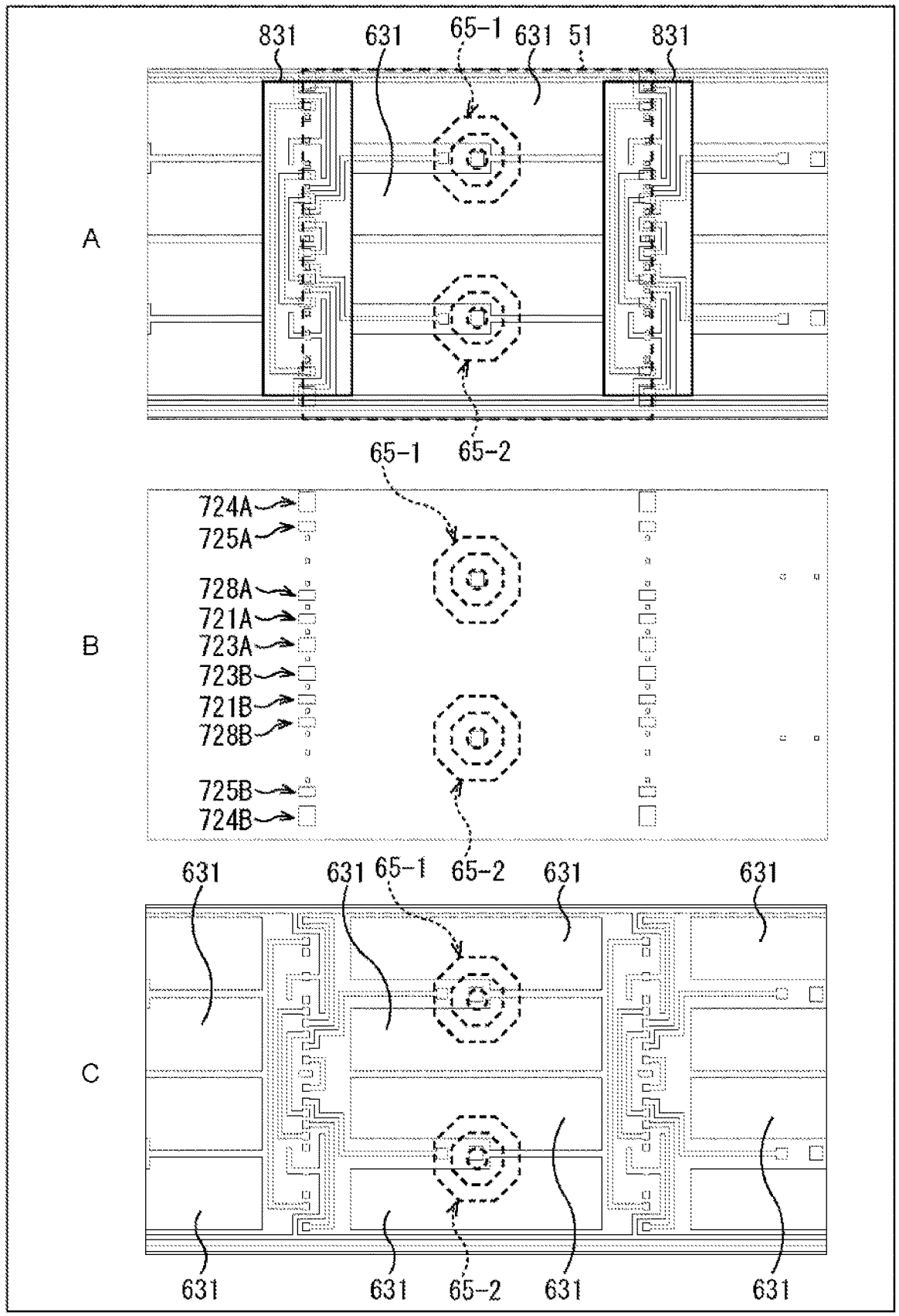
FIG. 44 is views for describing a polysilicon layer.

FIG. 44 is plan views in which the first-layer metal film M1 illustrated in A in FIG. 42, and a polysilicon layer for forming a gate electrode of the pixel transistor Tr formed on the metal film M1 and the like are superposed.

A in FIG. 44 is a plan view in which the metal film M1 in C in FIG. 44 and the polysilicon layer in B in FIG. 44 are superimposed, B in FIG. 44 is a plan view of only the polysilicon layer, and C in FIG. 44 is a plan view of only the metal film M1. The plan view of the metal film M1 in C in FIG. 44 is the same as the plan view illustrated in A in FIG. 42, but hatching is omitted.

As described with reference to A in FIG. 42, the pixel transistor wiring region 831 is formed between the reflective members 631 of the respective pixels.

In the pixel transistor wiring region 831, the pixel transistors Tr each corresponding to the signal extraction portions 65-1 and 65-2 are arranged as illustrated in B in FIG. 44, for example.

In B in FIG. 44, gate electrodes of the reset transistors 723A and 723B, the transfer transistors 721A and 721B, the switching transistors 728A and 728B, the selection transistors 725A and 725B, and the amplification transistors 724A and 724B are formed from a side close to the intermediate line (not illustrated) of the two signal extraction portions 65-1 and 65-2 with reference to the intermediate line.

The wiring for connecting the pixel transistors Tr of the metal film M1 illustrated in C in FIG. 44 is also formed symmetrically in the vertical direction with reference to the intermediate line (not illustrated) of the two signal extraction portions 65-1 and 65-2.

By symmetrically arranging the plurality of pixel transistors Tr in the pixel transistor wiring region 831 in the region on the signal extraction portion 65-1 side and the region on the signal extraction portion 65-2 side in this manner, the drive variation of the signal extraction portions 65-1 and 65-2 can be reduced.

<Modification of Reflective Member 631>

Next, a modification of the reflective member 631 formed in the metal film M1 will be described with reference to FIGS. 45 and 46.

In the above example, the large-area reflective member 631 is arranged in the region around the signal extraction portion 65 in the pixel 51, as illustrated in A in FIG. 42.

Figure 45:
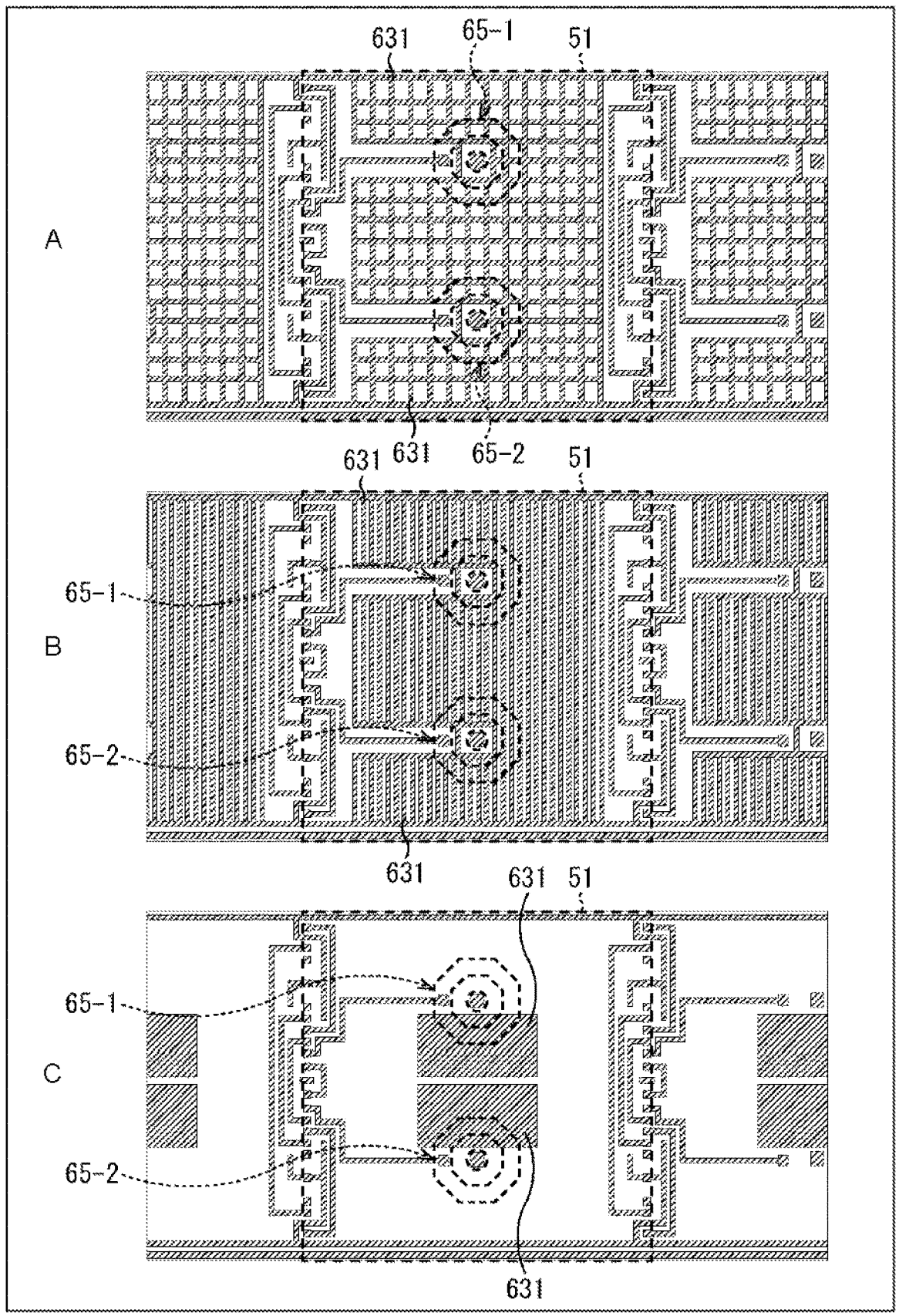
FIG. 45 is views illustrating a modification of a reflective member formed in a metal film.

In contrast, the reflective member 631 can also be arranged in a grid-like pattern, as illustrated in A in FIG. 45, for example. By forming the reflective member 631 in a grid-like pattern in this manner, pattern anisotropy can be eliminated and XY anisotropy of reflection ability can be reduced. In other words, by forming the reflective member 631 in a grid-like pattern, reflection of incident light biased to some region can be reduced and the incident light can be isotropically reflected, and thus the distance-measuring accuracy is improved.

Alternatively, the reflective member 631 may be arranged in a striped pattern, for example, as illustrated in B in FIG. 45. By forming the reflective member 631 in a striped pattern in this manner, the pattern of the reflective member 631 can also be used as a wiring capacitance, and thus a configuration with a maximized dynamic range can be implemented.

Note that B in FIG. 45 illustrates an example of the vertical stripe shape, but a horizontal stripe shape may be adopted.

Alternatively, the reflective member 631 may be arranged only in a pixel center region, more specifically, only between the two signal extraction portions 65, as illustrated in C in FIG. 45, for example. By forming the reflective member 631 in the pixel center region and not forming the reflective member 631 in a pixel center region end, components reflected to an adjacent pixel in the case where oblique light is incident can be suppressed while obtaining an effect of improving the sensitivity by the reflective member 631 with respect to the pixel center region, whereby a configuration emphasizing crosstalk suppression can be implemented.

Figure 46:
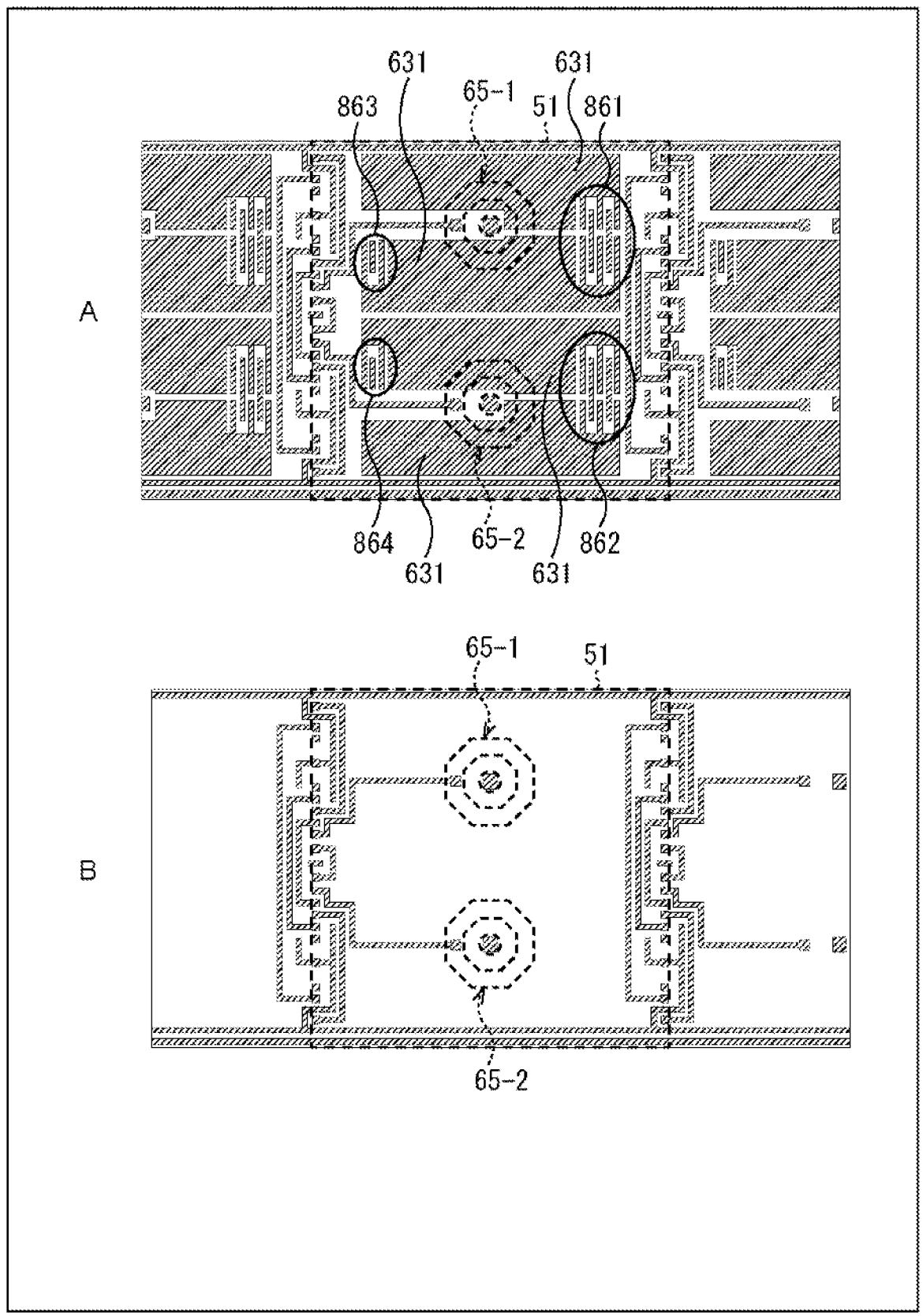
FIG. 46 is views illustrating a modification of a reflective member formed in a metal film.

Furthermore, by arranging a part of the reflective member 631 in a comb-teeth pattern, as illustrated in A in FIG. 46, a part of the metal film M1 may be allocated to the wiring capacitance of the FD 722 or the additional capacitance 727.

In A in FIG. 46, the comb-teeth shapes within regions 861 to 864 surrounded by the solid circles constitute at least a part of the FD 722 or the additional capacitance 727. The FD 722 or the additional capacitance 727 may be appropriately distributed and arranged in the metal film M1 and the metal film M2. The pattern of the metal film M1 can be arranged in a well-balanced manner in the reflective member 631 and in the capacitance of the FD 722 or the additional capacitance 727.

B in FIG. 46 illustrates the pattern of the metal film M1 in the case of not arranging the reflective member 631. To increase the amount of infrared light photoelectrically converted in the substrate 61 and improve the sensitivity of the pixel 51, it is favorable to arrange the reflective member 631 but a configuration in which no reflective member 631 is arranged can be adopted.

The arrangement examples of the reflective member 631 illustrated in FIGS. 45 and 46 can be similarly applied to the light-shielding member 631'.

<Configuration Example of Substrate of Light-Receiving Element>

The light-receiving element 1 in FIG. 1 can adopt the substrate configuration of any one of A to C in FIG. 47.

A in FIG. 47 illustrates an example in which the light-receiving element 1 is configured using one semiconductor substrate 911 and a support substrate 912 under the semiconductor substrate 911.

In this case, in the upper semiconductor substrate 911, a pixel array region 951 corresponding to the above-described pixel array unit 20, a control circuit 952 that controls each of the pixels in the pixel array region 951, and a logic circuit 953 including a signal processing circuit for the pixel signal are formed.

The control circuit 952 includes the tap drive unit 21, the vertical drive unit 22, the horizontal drive unit 24, and the like described above. The logic circuit 953 includes the column processing unit 23 that performs AD conversion processing for the pixel signal and the like, and the signal processing unit 31 that performs distance calculation processing of calculating a distance from a ratio of the pixel signals acquired in each of the two or more signal extraction portions 65 in the pixel, calibration processing, and the like.

Alternatively, as illustrated in B in FIG. 47, the light-receiving element 1 can have a configuration in which a first semiconductor substrate 921 in which the pixel array region 951 and the control circuit 952 are formed, and a second semiconductor substrate 922 in which the logic circuit 953 is formed are stacked. Note that the first semiconductor substrate 921 and the second semiconductor substrate 922 are electrically connected by, for example, a through via or a Cu—Cu metal bond.

Alternatively, as illustrated in C in FIG. 47, the light-receiving element 1 can also have a configuration in which a first semiconductor substrate 931 in which only the pixel array region 951 is formed, and a second semiconductor substrate 932 in which an area control circuit 954 is formed are stacked, the area control circuit 954 being provided with a control circuit that control each pixel and a signal processing circuit that processes the pixel signal on a pixel basis or on an area of a plurality of pixels basis. The first semiconductor substrate 931 and the second semiconductor substrate 932 are electrically connected by, for example, a through via or a Cu—Cu metal bond.

According to the configuration provided with the control circuit and the signal processing circuit on a pixel basis or on an area basis as in the light-receiving element 1 in C in FIG. 47, optimum drive timing and gain can be set for each division control unit, and optimized distance information can be acquired regardless of the distance or reflectance. Furthermore, the distance information can be calculated by driving only a part of the pixel array region 951 instead of the entire pixel array region 951. Therefore, the power consumption can be suppressed according to an operation mode.

Eighteenth Embodiment

<Configuration Example of Pixel>

Next, another embodiment will be described in addition to the above-described first to seventeenth embodiments. For example, it is concerned that an electric field of a photoelectric conversion region distant from a P+ semiconductor region 73 as a voltage application portion or an N+ semiconductor region 71 as a charge detection portion becomes weak when, for example, the thickness of a substrate 61 is increased. Therefore, in the following embodiment, a configuration for strengthening the electric field in the photoelectric conversion region, improving quantum efficiency (QE), and implementing high-speed drive will be described.

Figure 48:
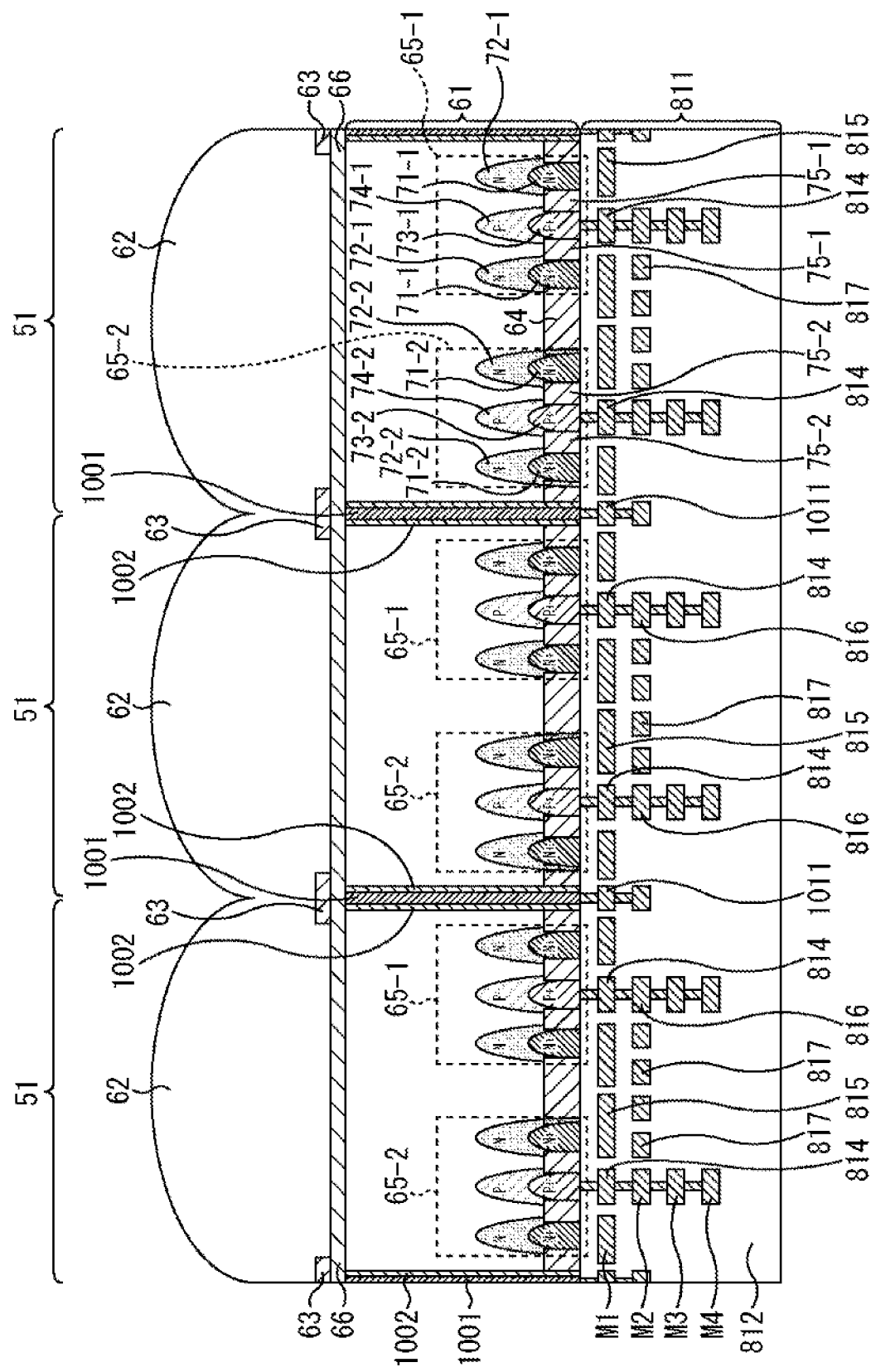
FIG. 48 is a cross-sectional view of a plurality of pixels in an eighteenth embodiment.

FIG. 48 is a cross-sectional view of pixels according to an eighteenth embodiment.

FIG. 48 illustrates a cross-sectional view of a plurality of pixels corresponding to the line B-B' in FIG. 11, similarly to FIG. 36 and the like described above.

In FIG. 48, a portion corresponding to the cross-sectional view of the plurality of pixels in the fourteenth embodiment illustrated in FIG. 36 is denoted by the same reference numeral, and description thereof is omitted as appropriate.

When comparing a configuration of a pixel 51 according to the eighteenth embodiment in FIG. 48 with the configuration of the pixel 51 according to the fourteenth embodiment illustrated in FIG. 36, a through electrode 1001 penetrating the substrate 61 as a P-type semiconductor layer and separating adjacent pixels 51, and an insulating film 1002 covering an outer periphery (side wall) of the through electrode 1001 are newly formed in a pixel boundary portion that is a boundary portion of the adjacent pixels 51. The through electrode 1001 is formed using, for example, a metal material such as tungsten (W), aluminum (Al), copper (Cu), titanium (Ti), titanium nitride (TiN), tantalum (Ta), or tantalum nitride (TaN), or polysilicon or the like. The insulating film 1002 is formed using, for example, silicon oxide (SiO$_2$) or silicon oxynitride (SiON). The material of the insulating film 1002 may be an oxide or nitride containing at least one element of hafnium (Hf), aluminum (Al), zirconium (Zr), tantalum (Ta), or titanium (Ti), an oxide or nitride containing at least one element of lantern (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu), or yttrium (Y), or the like. The through electrode 1001 functions as a pixel separation portion that separates the semiconductor layer (substrate 61) of the adjacent pixels 51. Note that it can also be considered that the through electrode 1001 including the outer peripheral insulating film 1002 and the insulating film 1002 constitute the pixel separation portion.

The through electrode 1001 is electrically connected to voltage application wiring 1011 of a metal film M1 that is a metal film of a multilayer wiring layer 811, the metal film being closest to the substrate 61, and a predetermined bias (voltage) is applied to the through electrode 1001 via the voltage application wiring 1011. Here, the bias applied to the through electrode 1001 is a voltage lower than a voltage applied to the P+ semiconductor region 73 of a signal extraction portion 65 that is an inactive tap, and in the above example, 0 V is applied to the P+ semiconductor region 73 of the signal extraction portion 65 as an inactive tap, and thus the bias is a voltage lower than 0 V, that is, a negative bias.

The through electrode 1001 and the insulating film 1002 can be formed by forming a trench from a front surface side or a back surface side of the substrate 61 to reach an opposite substrate surface using dry etching or the like, and embedding polysilicon or a metal material to serve as the through electrode 1001 in the trench after forming the insulating film 1002.

Figure 49:
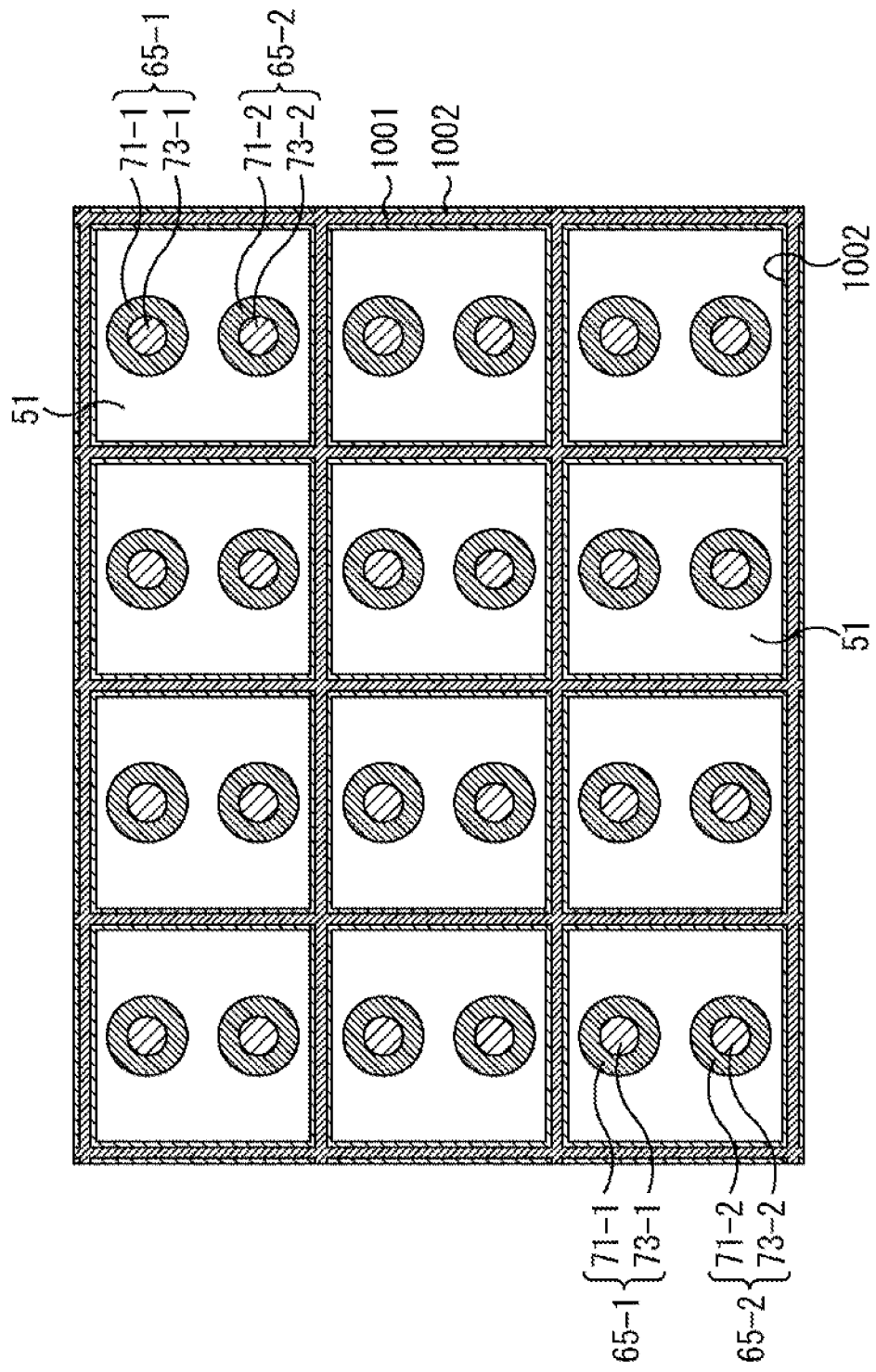
FIG. 49 is a plan view of the plurality of pixels in FIG. 48.

FIG. 49 is a plan view of a plurality of the pixels 51 in FIG. 48 in plan view.

As illustrated in FIG. 49, the through electrode 1001 is arranged in a grid-like manner in the boundary portion of the adjacent pixels 51, and the insulating film 1002 is formed to cover the side wall of the through electrode 1001.

According to the pixel 51 of the eighteenth embodiment, the through electrode 1001 is formed as a pixel separation portion in the boundary portion of the pixel 51, and the negative bias is applied to the through electrode 1001. As a result, the electric field in a plane direction toward the signal extraction portion 65 (tap) can be strengthened, the quantum efficiency (QE) can be improved, and the high-speed drive can be implemented. Furthermore, resistance to the high-speed drive is improved.

Figure 50:
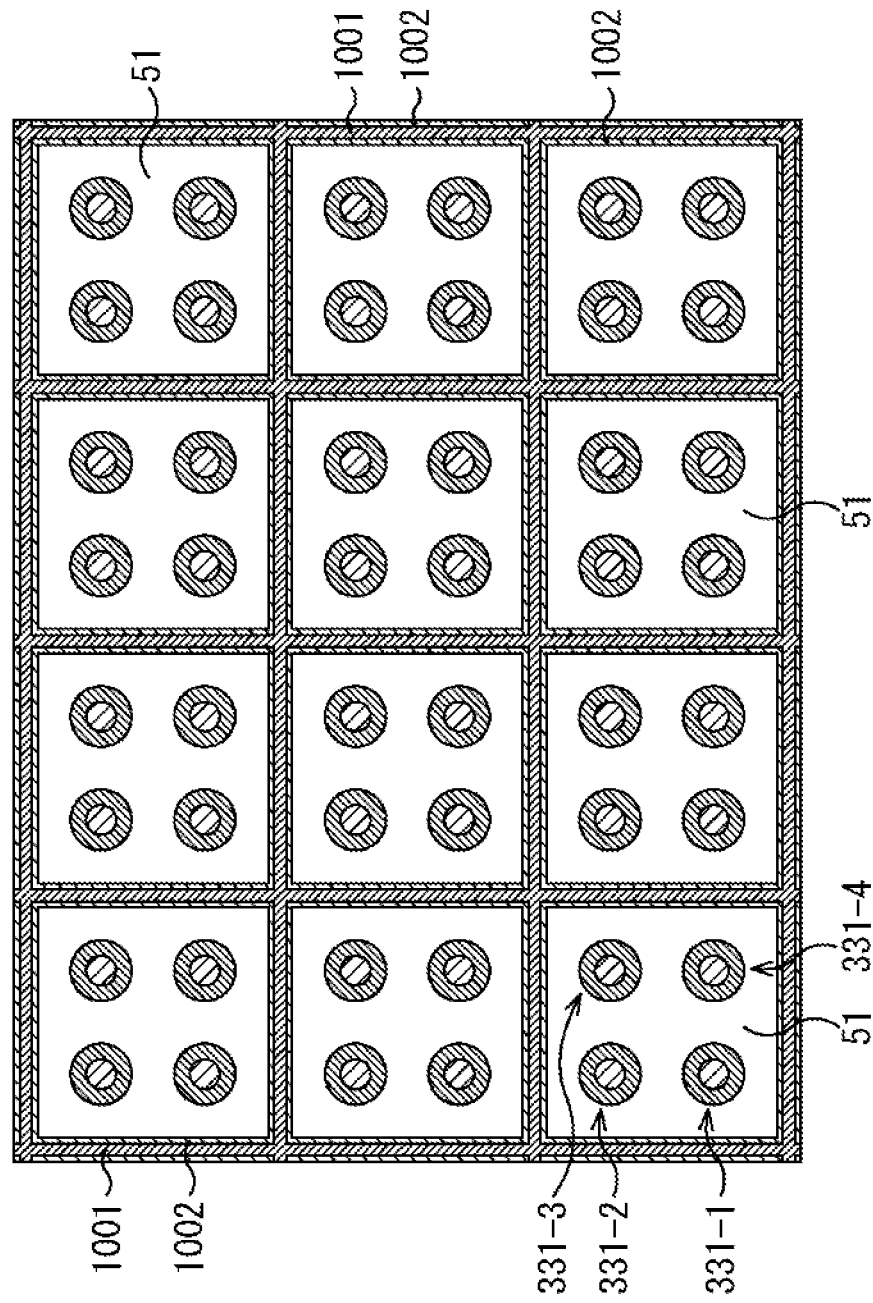
FIG. 50 is a plan view illustrating an arrangement example of a through electrode and an insulating film in a four-tap pixel structure.

Note that FIG. 49 illustrates a plan view of a so-called two-tap pixel structure in which one pixel 51 includes two signal extraction portions 65, whereas FIG. 50 illustrates a plan view of a so-called four-tap pixel structure in which the pixel 51 includes four signal extraction portions.

FIG. 50 is a plan view illustrating an arrangement example of the through electrode 1001 and the insulating film 1002 in the four-tap pixel structure illustrated in FIG. 17.

Even in the case where the pixel 51 has the four-tap pixel structure, the through electrode 1001 is arranged in a grid-like manner in the boundary portion of the adjacent pixels 51, and the insulating film 1002 is formed to cover the outer periphery (side wall) of the through electrode 1001, similarly to the two-tap case.

<Modification 1 of Eighteenth Embodiment>
<Configuration Example of Pixel>

In the pixel 51 according to the eighteenth embodiment illustrated in FIGS. 48 and 49, the through electrode 1001 and the insulating film 1002 have been formed in the pixel boundary portion of the entire periphery of the pixel 51. However, the through electrode 1001 and the insulating film 1002 may be formed to divide the outer periphery of the pixel 51 into two parts, as illustrated in FIGS. 51 and 52.

Figure 51:
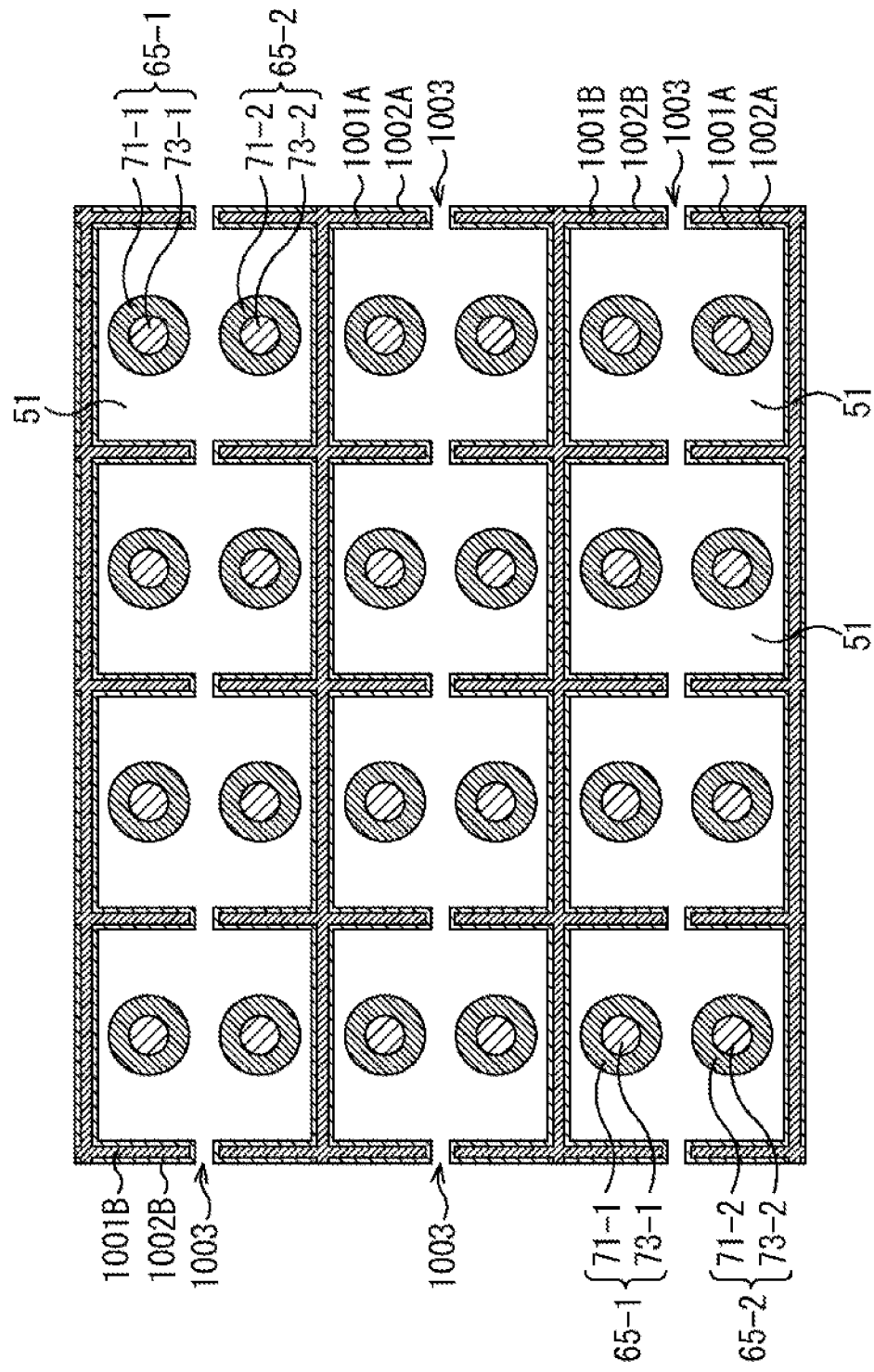
FIG. 51 is a plan view of pixels having a two-tap pixel structure according to a modification of the eighteenth embodiment.
Figure 52:
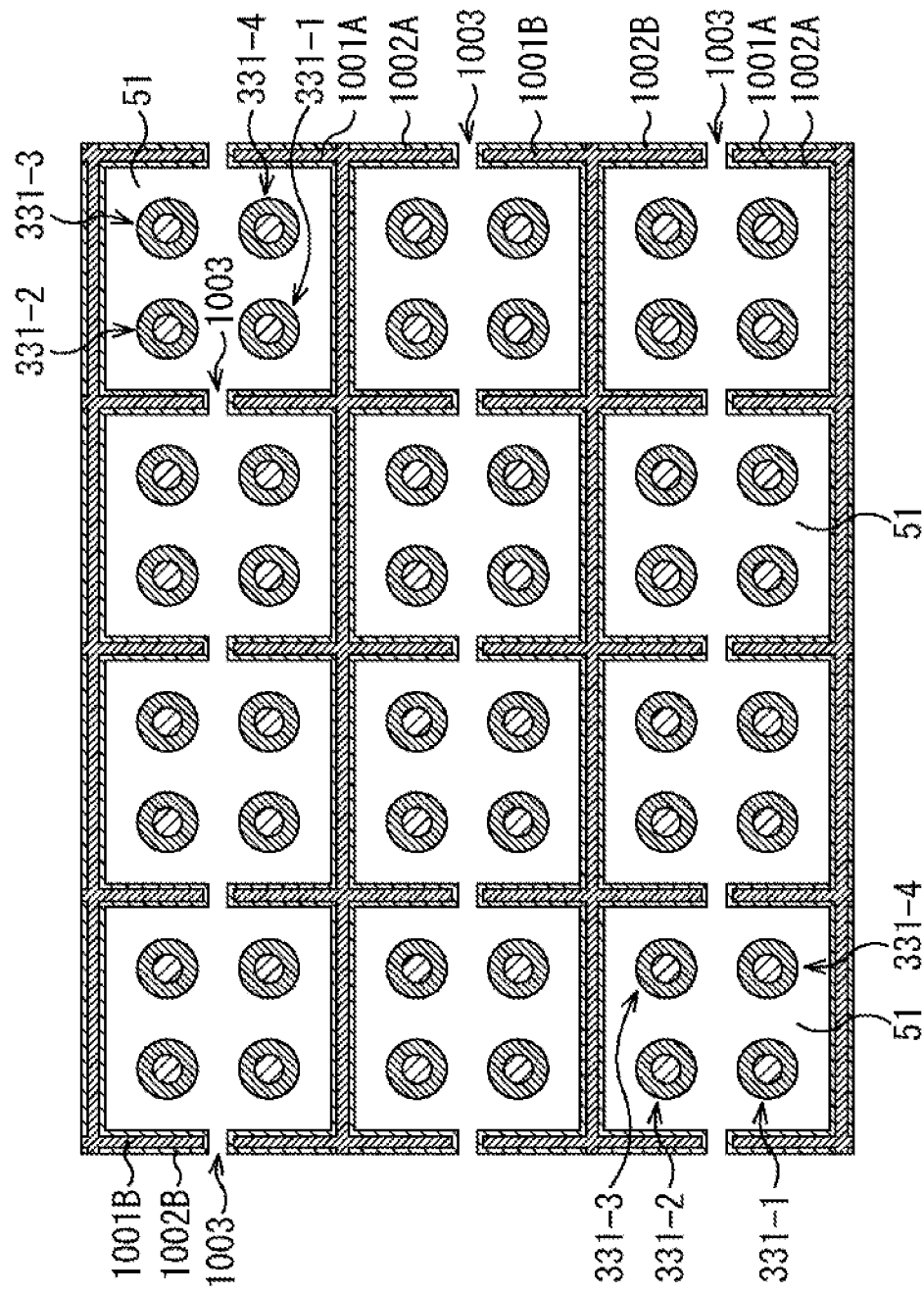
FIG. 52 is a plan view of pixels having a four-tap pixel structure according to a modification of the eighteenth embodiment.

FIG. 51 is a plan view of pixels according to a modification of the eighteenth embodiment in a case where the pixel 51 has a two-tap pixel structure.

In the case where the pixel 51 has the two-tap pixel structure, a gap portion 1003 is provided in a pixel boundary portion that intersects with an intermediate line (not illustrated) of two signal extraction portions 65, so that the through electrode 1001 and the insulating film 1002 are separated into a through electrode 1001A and an insulating film 1002A on one signal extraction portion 65 side, and a through electrode 1001B and an insulating film 1002B on the other signal extraction portion 65 side.

On a pixel-by-pixel basis, the through electrode 1001 and the insulating film 1002 of the pixel 51 include the through electrode 1001A and the insulating film 1002A arranged in the pixel boundary portion on one signal extraction portion 65 side, and the through electrode 1001B and the insulating film 1002B arranged in the pixel boundary portion on the other signal extraction portion 65 side, with reference to the intermediate line of the two signal extraction portions 65.

FIG. 52 is a plan view of pixels according to a modification of the eighteenth embodiment in a case where the pixel 51 has a four-tap pixel structure.

In the case where the pixel 51 has the four-tap pixel structure, for example, a gap portion 1003 is provided in a pixel boundary portion that intersects with an intermediate line (not illustrated) dividing four signal extraction portions 65 into two units in a vertical direction or in a horizontal direction, so that the through electrode 1001 and the insulating film 1002 are separated into a through electrode 1001A and an insulating film 1002A on a side of predetermined two signal extraction portions 65, and a through electrode 1001B and an insulating film 1002B on the other side of remaining two signal extraction portions 65. FIG. 52 illustrates a configuration example in which the gap portion 1003 is provided in the pixel boundary portion intersecting with the intermediate line dividing the four signal extraction portions 65 in the vertical direction into two units.

Even in the case where the gap portion 1003 is provided in the boundary portion of adjacent pixels 51 as illustrated in FIGS. 51 and 52, the quantum efficiency (QE) can be improved and the high-speed drive can be implemented by applying the negative bias to the through electrode 1001 via the voltage application wiring 1011. Furthermore, resistance to the high-speed drive is improved.

Note that, in the modification provided with the gap portion 1003 in a part of the pixel separation portion, the negative bias may be applied to both the through electrodes 1001A and 1001B at the same timing, similarly to the configuration of the pixel separation portion surrounding the entire pixel without a gap portion 1003, or at different timings.

Figure 53:
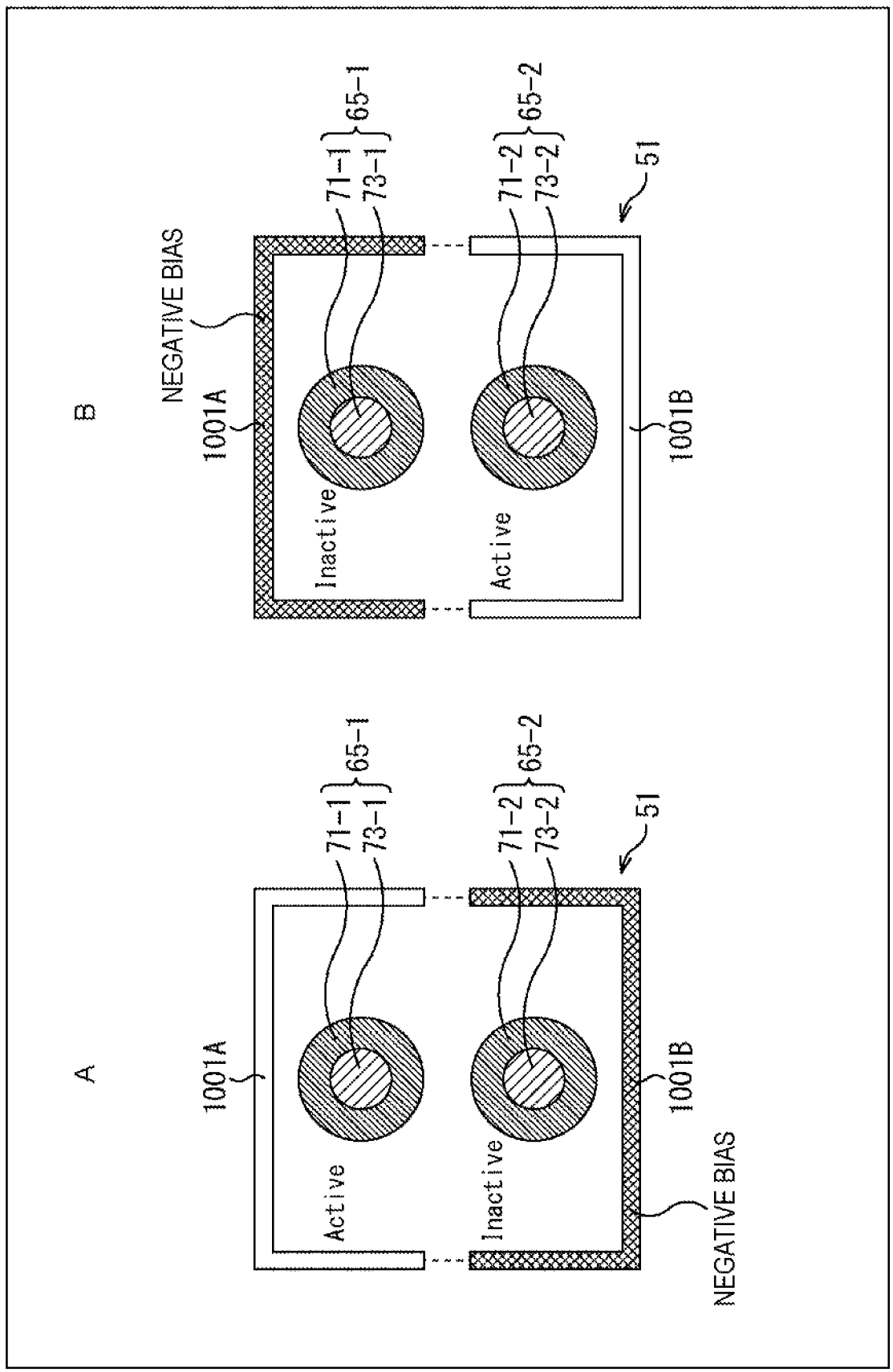
FIG. 53 is views for describing drive of applying a negative bias.

FIG. 53 is views for describing drive of the case of applying the negative bias to the through electrodes 1001A and 1001B at different timings in the case where the pixel 51 has the two-tap pixel structure.

For example, as illustrated in A in FIG. 53, in a case where a positive voltage is applied to the P+ semiconductor region 73-1 of the signal extraction portion 65-1 and the signal extraction portion 65-1 is an active tap, the negative bias is applied to the through electrode 1001B as the pixel separation portion on the inactive tap side.

Meanwhile, as illustrated in B in FIG. 53, in a case where the positive voltage is applied to the P+ semiconductor region 73-2 of the signal extraction portion 65-2 and the signal extraction portion 65-2 is an active tap, the negative bias is applied to the through electrode 1001A as the pixel separation portion on the inactive tap side. The application of the negative bias can be performed by, for example, a tap drive unit 21.

By applying the negative bias to the pixel separation portion on the inactive tap side opposite to the signal extraction portion 65 that is an active tap as described above, the electric field in the plane direction from the inactive tap side to the active tap side is strengthened. Therefore, the quantum efficiency (QE) can be improved and the high-speed drive can be implemented. Furthermore, resistance to the high-speed drive is improved.

Figure 54:
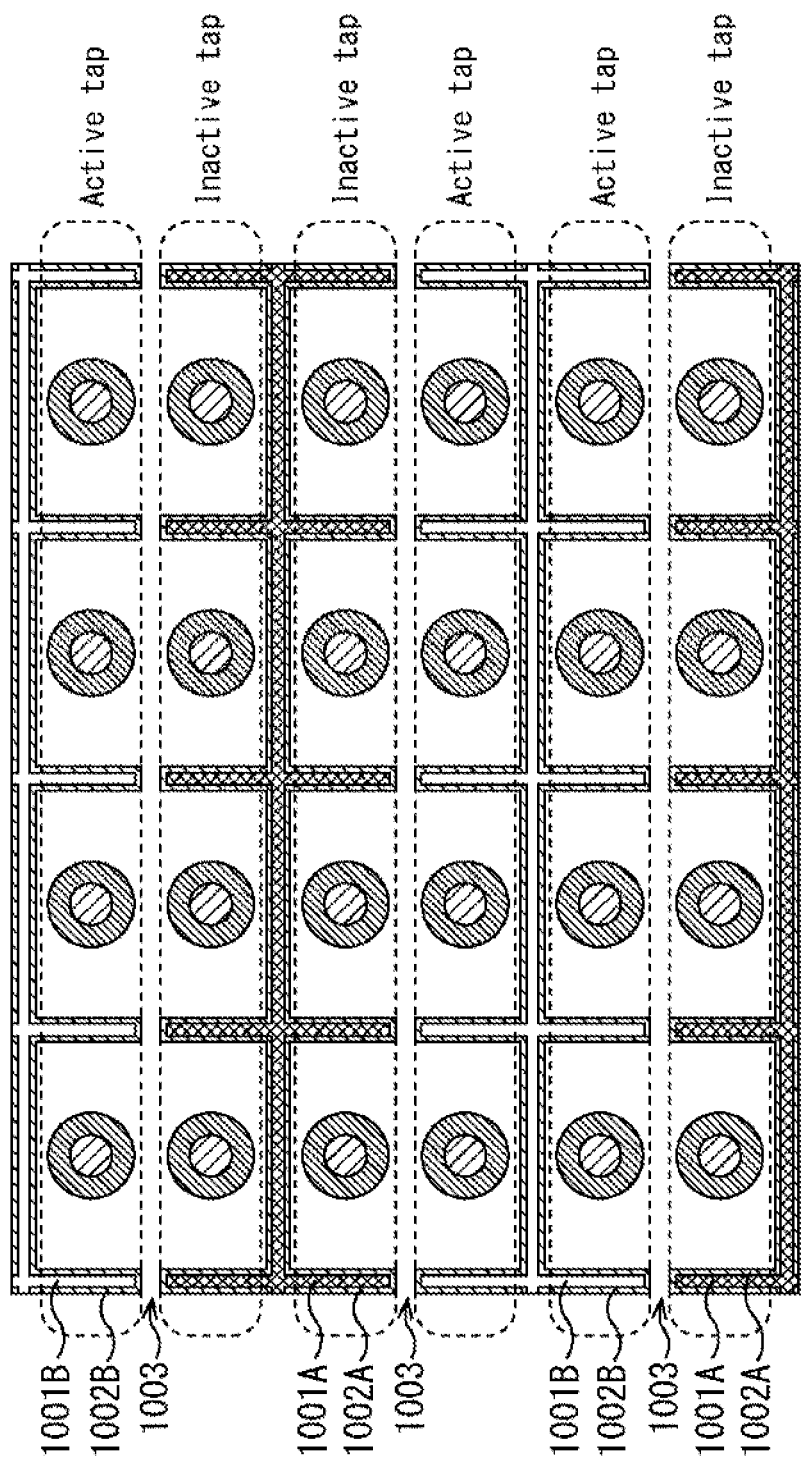
FIG. 54 is a view illustrating drive of applying a negative bias at different timings.
Figure 55:
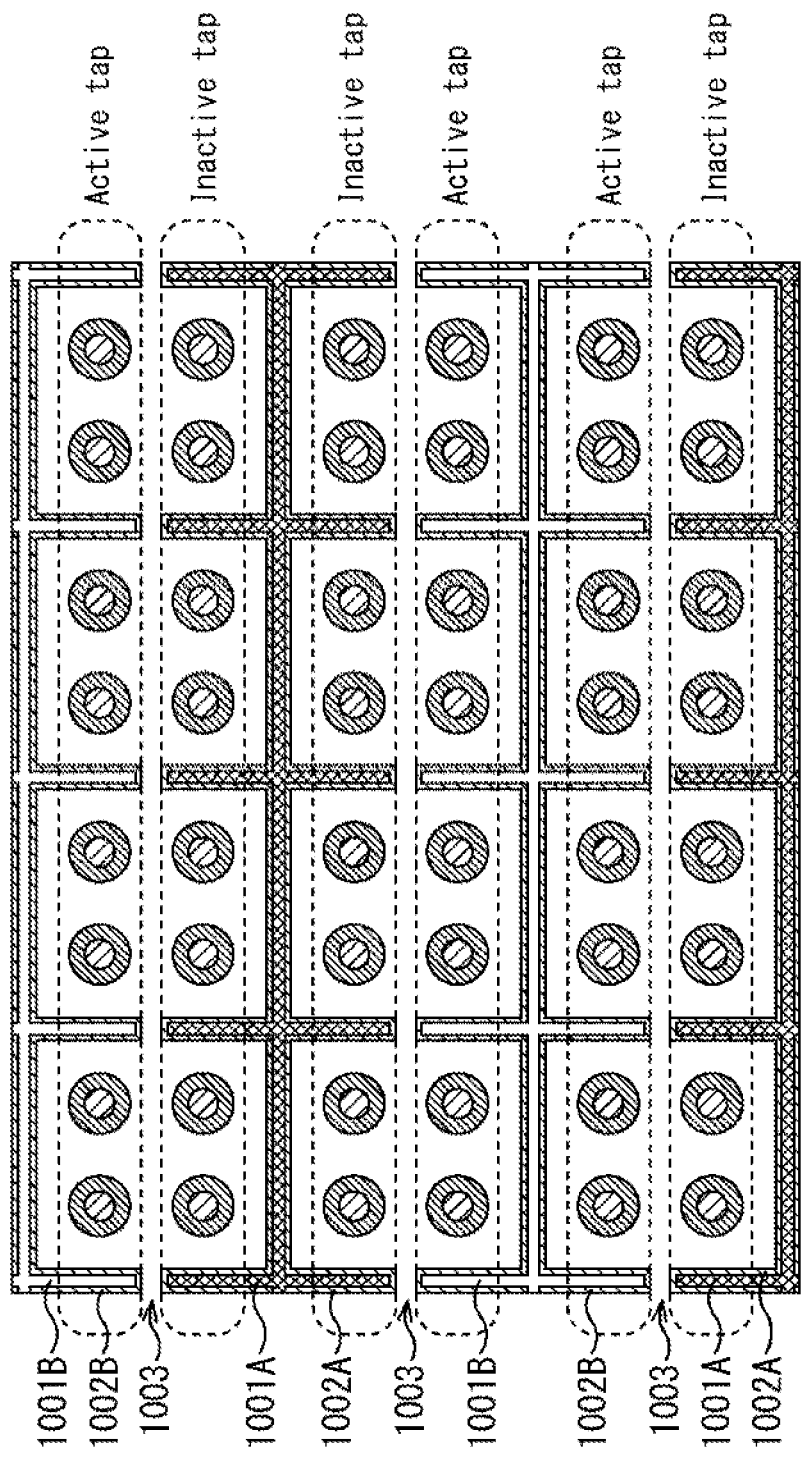
FIG. 55 is a view illustrating drive of applying a negative bias at different timings.

FIGS. 54 and 55 are views illustrating drive of applying the negative bias to a plurality of pixels 51 two-dimensionally arranged in a matrix at different timings.

FIG. 54 illustrates the case where the pixel 51 has the two-tap pixel structure and FIG. 55 illustrates the case where the pixel 51 has the four-tap pixel structure.

Since each of the through electrodes 1001A and 1001B is shared by two pixels 51 adjacent in the vertical direction, when referring to the two pixels 51 adjacent in the vertical direction as a first pixel 51 and a second pixel 51, the lower signal extraction portion 65 of the first pixel 51 and the upper signal extraction portion 65 of the second pixel 51 simultaneously become the active taps, and the negative bias is applied to the pixel separation portion (through electrode 1001A or 1001B) on the inactive tap side accordingly. Therefore, in the two pixels 51 adjacent in the vertical direction, the positions of the signal extraction portion 65 serving as the active tap and the signal extraction portion 65 serving as the inactive tap become opposite. Such drive can be implemented by the third and fourth arrangement examples of the voltage supply lines illustrated in A and B in FIG. 34.

Nineteenth Embodiment

<Configuration Example of Pixel>

Figure 56:
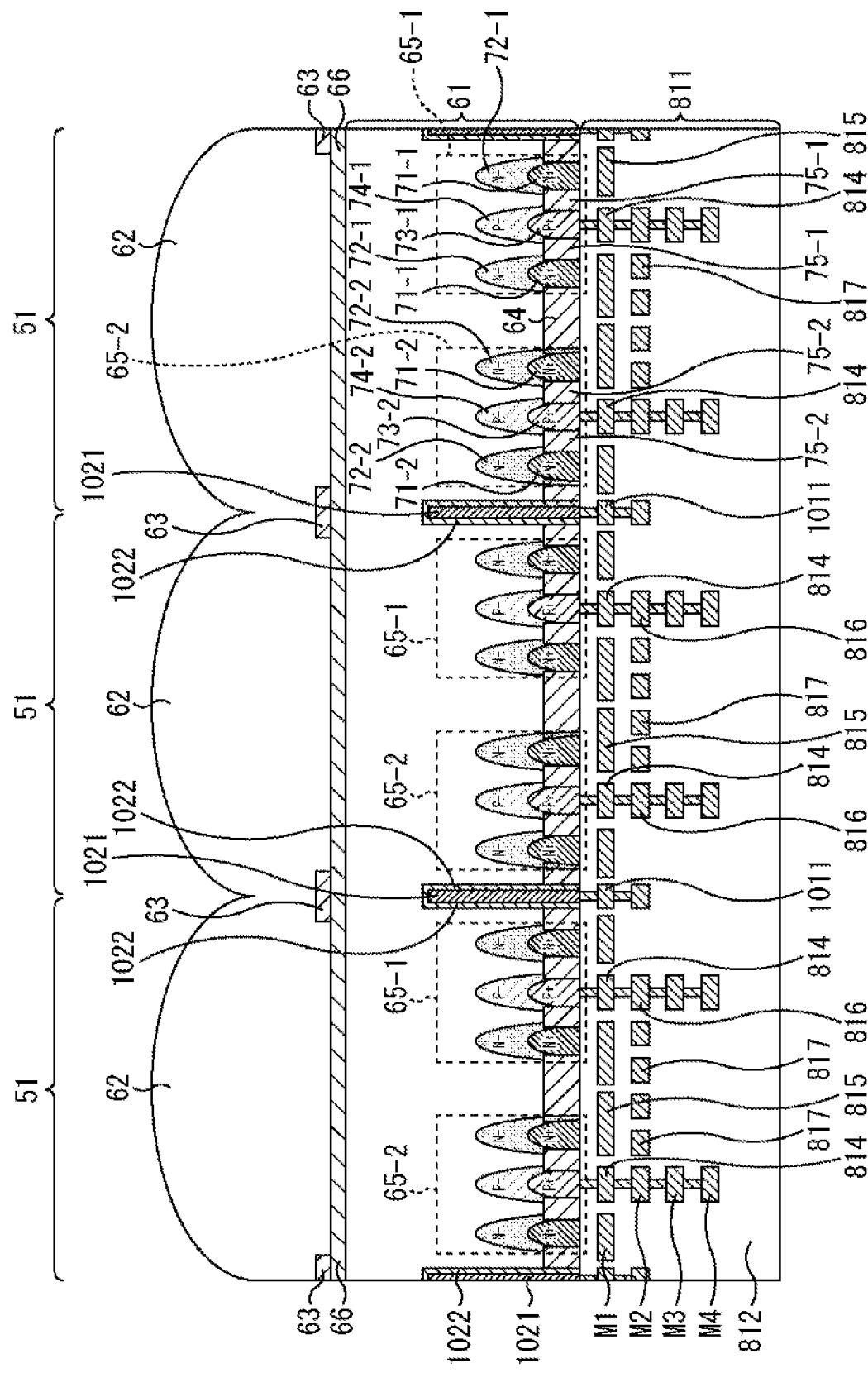
FIG. 56 is a cross-sectional view of a plurality of pixels in a nineteenth embodiment.

FIG. 56 is a cross-sectional view of pixels according to a nineteenth embodiment.

FIG. 56 illustrates a cross-sectional view of a plurality of pixels corresponding to the line B-B' in FIG. 11, similarly to FIG. 36 and the like described above.

In FIG. 56, a portion corresponding to the cross-sectional view of the plurality of pixels in the fourteenth embodiment illustrated in FIG. 36 is denoted by the same reference numeral, and description thereof is omitted as appropriate.

When comparing a configuration of a pixel 51 according to the nineteenth embodiment in FIG. 56 with the configuration of the pixel 51 according to the fourteenth embodiment illustrated in FIG. 36, a deep trench isolation (DTI) 1021 that separates adjacent pixels 51 and an insulating film 1022 covering an outer periphery (side wall) of the DTI 1021 are newly formed in a boundary portion of the adjacent pixels 51 up to a predetermined depth from a surface of a substrate 61 as a P-type semiconductor layer on a multilayer wiring layer 811 side. The DTI 1021 is formed using, for example, a metal material such as tungsten (W), aluminum (Al), copper (Cu), titanium (Ti), titanium nitride (TiN), tantalum (Ta), or tantalum nitride (TaN), or polysilicon or the like. The insulating film 1022 is formed using, for example, silicon oxide ($SiO_2$) or silicon oxynitride (SiON). The material of the insulating film 1022 may be an oxide or nitride containing at least one element of hafnium (Hf), aluminum (Al), zirconium (Zr), tantalum (Ta), or titanium (Ti), an oxide or nitride containing at least one element of lantern (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu), or yttrium (Y), or the like. The DTI 1021 functions as a pixel separation portion that separates the semiconductor layer (substrate 61) of adjacent pixels 51. Note that it can also be considered that the DTI 1021 including the outer peripheral insulating film 1022 and the insulating film 1022 constitute the pixel separation portion.

The DTI 1021 is electrically connected to voltage application wiring 1011 of a metal film M1 that is a metal film of the multilayer wiring layer 811, the metal film being closest to the substrate 61, and a negative bias (voltage) is applied to the DTI 1021 via the voltage application wiring 1011. Here, the negative bias applied to the DTI 1021 is a voltage lower than a voltage applied to a P+ semiconductor region 73 of a signal extraction portion 65 as an inactive tap.

The DTI 1021 and the insulating film 1022 can be formed by forming a trench up to a predetermined depth from a front surface side of the substrate 61 (multilayer wiring layer 811 side) by dry etching or the like, and embedding polysilicon or a metal material to serve as the DTI 1021 in the trench after forming the insulating film 1022.

When comparing the configuration of the pixel 51 according to the nineteenth embodiment in FIG. 56 with the configuration of the pixel 51 according to the eighteenth embodiment illustrated in FIG. 48, the pixel 51 according to the nineteenth embodiment is common to that of the eighteenth embodiment in providing the pixel separation portion for separating the substrate 61 as a P-type semiconductor layer in the pixel boundary portion and applying the negative bias to the pixel separation portion via the voltage application wiring 1011. Meanwhile, the pixel 51 according to the nineteenth embodiment is different from that of the eighteenth embodiment illustrated in FIG. 48 in that the DTI 1021 and the insulating film 1022 do not penetrate the substrate 61 and are formed only up to the predetermined depth from the back surface side of the substrate 61.

Although the plan view of the DTI 1021 and the insulating film 1022 is omitted, the DTI 1021 is arranged in a grid pattern in the boundary portion of the two-dimensionally arranged pixels 51, and the insulating film 1022 is formed to cover the side wall of the DTI 1021, similarly to FIG. 49.

According to the pixel 51 of the nineteenth embodiment, the DTI 1021 is formed as a pixel separation portion in the boundary portion of the pixel 51, and the negative bias is applied to the DTI 1021. As a result, the electric field in a plane direction toward the signal extraction portion 65 (tap) can be strengthened, the quantum efficiency (QE) can be improved, and the high-speed drive can be implemented. Furthermore, resistance to the high-speed drive is improved.

Twentieth Embodiment

<Configuration Example of Pixel>

Figure 57:
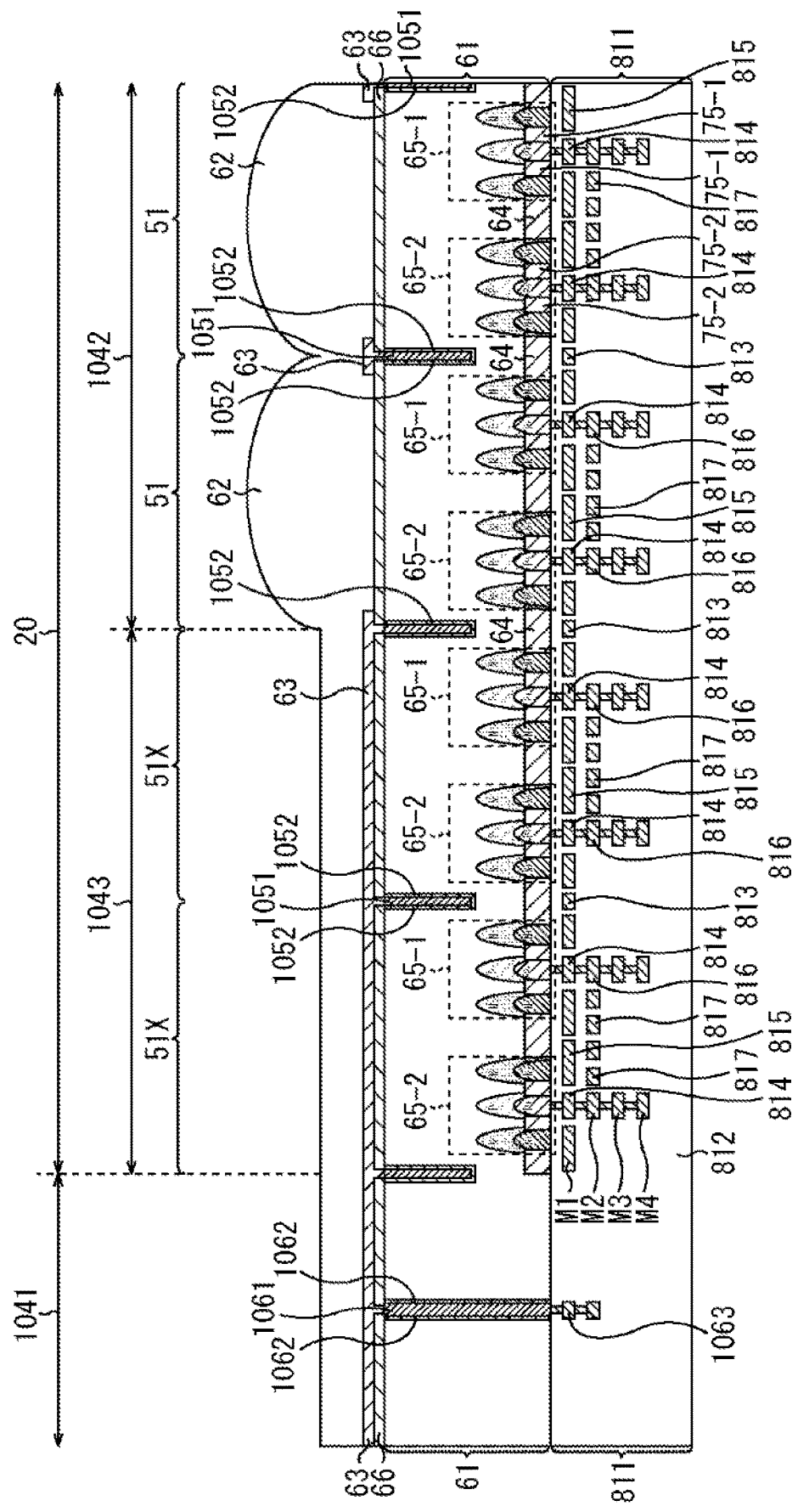
FIG. 57 is a cross-sectional view of a plurality of pixels in a twentieth embodiment.

FIG. 57 is a cross-sectional view of pixels according to a twentieth embodiment.

In FIG. 57, a portion corresponding to the cross-sectional view of the plurality of pixels in the fourteenth embodiment illustrated in FIG. 36 is denoted by the same reference numeral, and description thereof is omitted as appropriate.

FIG. 57 illustrates a cross-sectional view of a plurality of pixels corresponding to the B-B' line in FIG. 11, and illustrates a cross-sectional view of a pixel array unit 20 in which pixels 51 are two-dimensionally arranged and a peripheral circuit unit 1041 around the pixel array unit 20. As described with reference to FIG. 1, a tap drive unit 21, a vertical drive unit 22, and the like are formed in the peripheral circuit unit 1041, for example.

Figure 58:
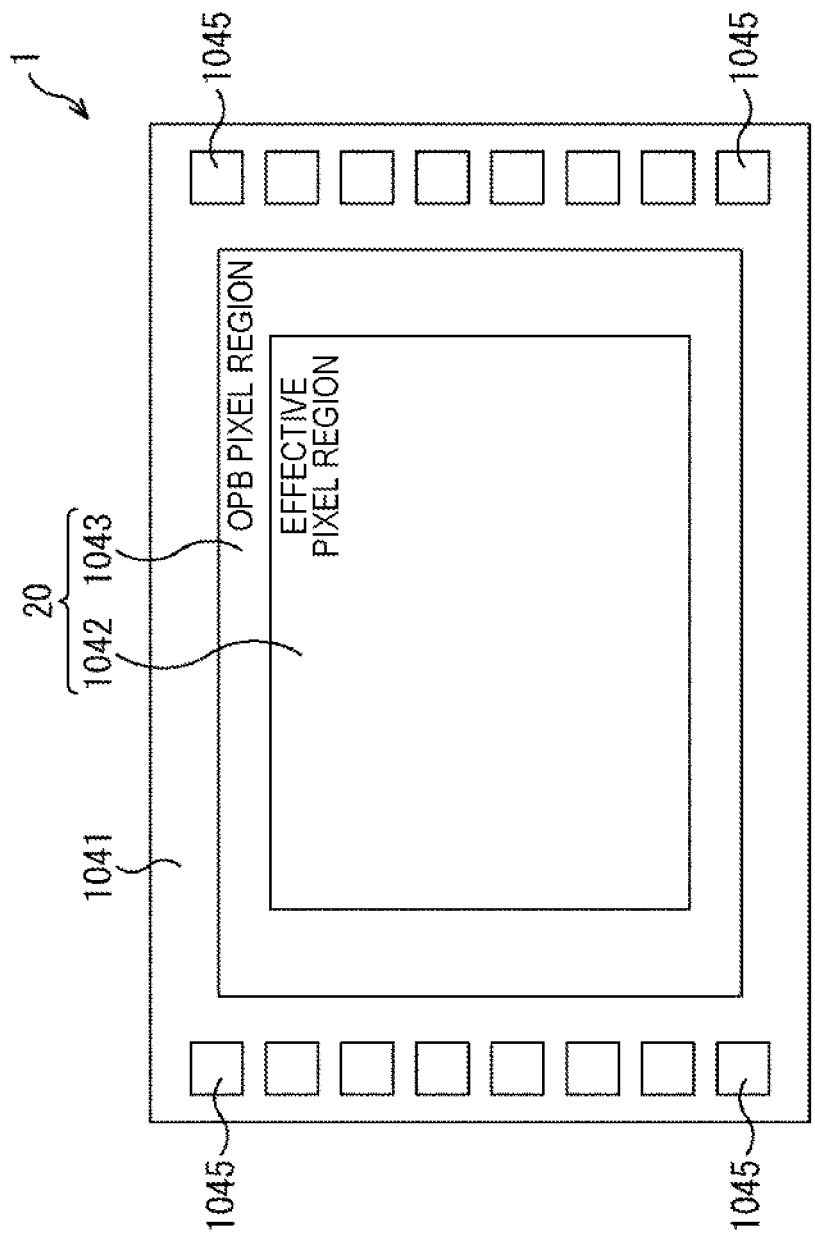
FIG. 58 is a plan view illustrating a positional relationship between a pixel array unit and a peripheral circuit unit.

FIG. 58 is a plan view illustrating a positional relationship between the pixel array unit 20 and the peripheral circuit unit 1041.

As illustrated in FIG. 58, the pixel array unit 20 includes an effective pixel region 1042 in which a plurality of pixels 51 is arranged, and an OPB pixel region 1043 around the effective pixel region 1042, and further, the peripheral circuit unit 1041 is arranged in an outer peripheral portion of the pixel array unit 20. A plurality of electrode pads 1045 as input/output terminals of a light-receiving element 1 is formed in the peripheral circuit unit 1041, for example.

Returning to FIG. 57, the pixels 51 that output signals according to the amount of incident light are arranged in a matrix in the effective pixel region 1042 of the pixel array unit 20. A light-shielding pixel 51X having an inter-pixel light-shielding film 63 formed on an entire pixel region is arranged in the OPB pixel region 1043. The inter-pixel light-shielding film 63 is formed on a fixed charge film 66 of the pixel array unit 20 and the peripheral circuit unit 1041 except for an aperture portion (pixel boundary portion) of each pixel 51 in the effective pixel region 1042. Note that, in the example in FIG. 57, the light-shielding pixel 51X is formed in two columns or two rows, but may be formed inf one column or one row or may be formed in three or more columns or three or more rows.

When comparing a configuration of the pixel 51 according to the twentieth embodiment in FIG. 57 with the configuration of the pixel 51 according to the fourteenth embodiment illustrated in FIG. 36, a deep trench isolation (DTI) 1051 that separates adjacent pixels 51 and an insulating film 1052 covering an outer periphery (side wall) of the DTI 1051 are newly formed in a boundary portion of the adjacent pixels 51 up to a predetermined depth from a light incident surface of a substrate 61 as a P-type semiconductor layer. The DTI 1051 is formed using, for example, a metal material such as tungsten (W), aluminum (Al), copper (Cu), titanium (Ti), titanium nitride (TiN), tantalum (Ta), or tantalum nitride (TaN), or polysilicon or the like. The insulating film 1052 is formed using, for example, silicon oxide ($SiO_2$) or silicon oxynitride (SiON). The material of the insulating film 1052 may be an oxide or nitride containing at least one element of hafnium (Hf), aluminum (Al), zirconium (Zr), tantalum (Ta), or titanium (Ti), an oxide or nitride containing at least one element of lantern (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu), or yttrium (Y), or the like. The DTI 1051 functions as a pixel separation portion that separates the semiconductor layer (substrate 61) of adjacent pixels 51. Note that it can also be considered that the DTI 1051 including the outer peripheral insulating film 1052 and the insulating film 1052 constitute the pixel separation portion. The DTI 1051 and the insulating film 1052 are also formed in a boundary portion of adjacent light-shielding pixels 51X in the OPB pixel region 1043 in a similar manner to the pixels 51.

The DTI 1051 and the insulating film 1052 can be formed by forming a trench up to a predetermined depth from the light incident surface side of the substrate 61 (on-chip lens 62 side) by dry etching or the like, and embedding polysilicon or a metal material to serve as the DTI 1051 in the trench after forming the insulating film 1052.

Although the plan view of the DTI 1051 and the insulating film 1052 is omitted, the DTI 1051 is arranged in a grid pattern in the boundary portion of the two-dimensionally arranged pixels 51, and the insulating film 1052 is formed to cover the side wall of the DTI 1051, similarly to FIG. 49.

The DTI 1051 is connected to the inter-pixel light-shielding film 63 on the light incident surface side of the substrate 61. The inter-pixel light-shielding film 63 is also connected to a through electrode 1061 formed in the peripheral circuit unit 1041, and the through electrode 1061 is connected to voltage application wiring 1063 of a multilayer wiring layer 811. An outer periphery (side wall) of the through electrode 1061 is covered with an insulating film 1062.

A negative bias (negative voltage) is supplied to the voltage application wiring 1063 formed in the multilayer wiring layer 811 of the peripheral circuit unit 1041, and the negative bias is applied to the DTI 1051 via the through electrode 1061 and the inter-pixel light-shielding film 63.

When comparing the configuration of the pixel 51 according to the twentieth embodiment in FIG. 57 with the configuration of the pixel 51 according to the eighteenth embodiment illustrated in FIG. 48, the pixel 51 according to the twentieth embodiment is common to that of the eighteenth embodiment in providing the pixel separation portion for separating the substrate 61 as a P-type semiconductor layer in the pixel boundary portion of the pixel 51 and applying the negative bias to the pixel separation portion via predetermined voltage application wiring.

Meanwhile, the pixel 51 according to the twentieth embodiment is different from that of the eighteenth embodiment illustrated in FIG. 48 in that the DTI 1051 and the insulating film 1052 do not penetrate the substrate 61 and are formed only up to the predetermined depth from the light incident surface side of the substrate 61. Furthermore, the pixel 51 according to the twentieth embodiment is also different in that the negative bias is applied to the DTI 1051 as a pixel separation portion from the voltage application wiring 1063 formed in the peripheral circuit unit 1041 outside the pixel array unit 20 via the through electrode 1061 formed in the peripheral circuit unit 1041 and the inter-pixel light-shielding film 63 on the fixed charge film 66. Note that a configuration of supplying the negative bias from an outside of a light-receiving element 1 to the inter-pixel light-shielding film 63 on the fixed charge film 66 and applying the negative bias to the DTI 1051 may be adopted other than the configuration of applying the negative bias from the voltage application wiring 1063 of the peripheral circuit unit 1041 to the DTI 1051 via the inter-pixel light-shielding film 63.

According to the pixel 51 of the twentieth embodiment, the DTI 1051 is formed as a pixel separation portion in the boundary portion of the pixel 51, and the negative bias is applied to the DTI 1051. As a result, the electric field in a plane direction toward the signal extraction portion 65 (tap) can be strengthened, the quantum efficiency (QE) can be improved, and the high-speed drive can be implemented. Furthermore, resistance to the high-speed drive is improved.

Twenty-First Embodiment

<Configuration Example of Pixel>

Figure 59:
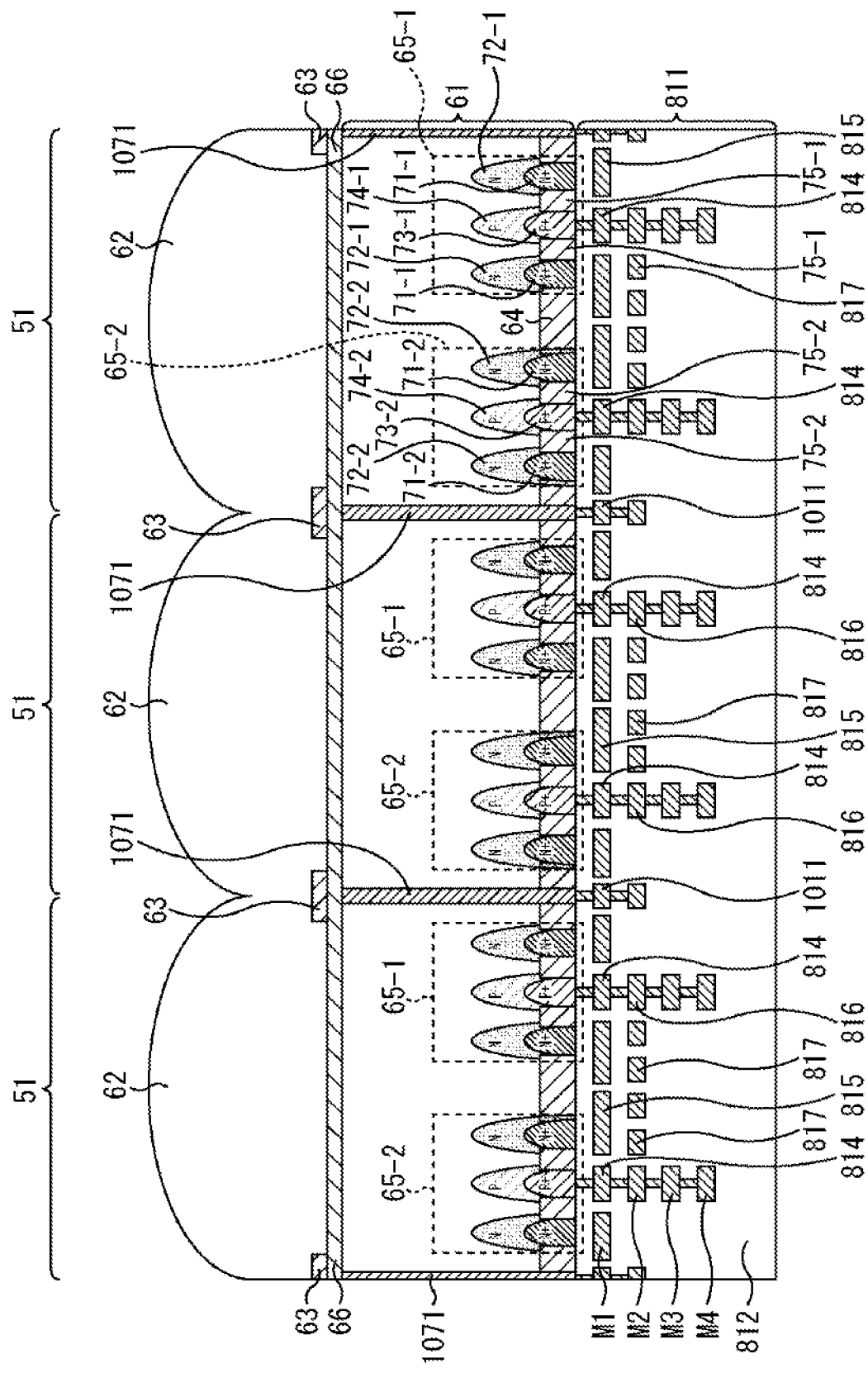
FIG. 59 is a cross-sectional view of a plurality of pixels in a twenty-first embodiment.

FIG. 59 is a cross-sectional view of pixels according to a twenty-first embodiment.

FIG. 59 illustrates a cross-sectional view of a plurality of pixels corresponding to the line B-B' in FIG. 11, similarly to FIG. 36 and the like described above.

In FIG. 59, a portion corresponding to the cross-sectional view of the plurality of pixels in the fourteenth embodiment illustrated in FIG. 36 is denoted by the same reference numeral, and description thereof is omitted as appropriate.

When comparing a configuration of a pixel 51 according to the twenty-first embodiment in FIG. 59 with the configuration of the pixel 51 according to the fourteenth embodiment illustrated in FIG. 36, a P+ semiconductor region 1071 as a high-concentration P+ semiconductor region is newly formed by, for example, ion implantation in an entire region in a depth direction of a substrate 61, of a boundary portion of adjacent pixels 51. The P+ semiconductor region 1071 functions as a pixel separation portion that separates a semiconductor layer (substrate 61) of adjacent pixels 51.

The P+ semiconductor region 1071 is electrically connected to voltage application wiring 1011 of a metal film M1 that is a metal film of a multilayer wiring layer 811, the metal film being closest to the substrate 61, and a negative bias (voltage) is applied to the P+ semiconductor region 1071 via the voltage application wiring 1011.

Although a plan view of the P+ semiconductor region 1071 is omitted, the P+ semiconductor region 1071 is formed in a grid pattern in the boundary portion of two-dimensionally arranged pixels 51, similarly to FIG. 49.

According to the pixel 51 of the twenty-first embodiment, the P+ semiconductor region 1071 is formed as a pixel separation portion in the boundary portion of the adjacent pixels 51, and the negative bias is applied to the P+ semiconductor region 1071. As a result, the electric field in a plane direction toward the signal extraction portion 65 (tap) can be strengthened, the quantum efficiency (QE) can be improved, and the high-speed drive can be implemented. Furthermore, resistance to the high-speed drive is improved.

In the above-described eighteenth to twenty-first embodiments, the negative bias is applied to the pixel separation portion formed in the pixel boundary portion of the pixels 51. Here, the negative bias is a voltage lower than a voltage (0 V) applied to a P+ semiconductor region 73 of a signal extraction portion 65 as an inactive tap. As a result, the electric field in a plane direction toward the signal extraction portion 65 (tap) can be strengthened, the quantum efficiency (QE) can be improved, and the high-speed drive can be implemented. Furthermore, resistance to the high-speed drive is improved.

Twenty-Second Embodiment

<Configuration Example of Pixel>

Next, another embodiment will be described in addition to the above-described eighteenth to twenty-first embodiments.

In the above-described eighteenth to twenty-first embodiments, the configuration of applying the negative bias using the pixel separation portion formed in the boundary portion of adjacent pixels 51 to strengthen the electric field in the plane direction has been described. In the following twenty-second to twenty-fifth embodiments, a configuration of strengthening an electric field in a depth direction perpendicular to a substrate 61 will be described.

Figure 60:
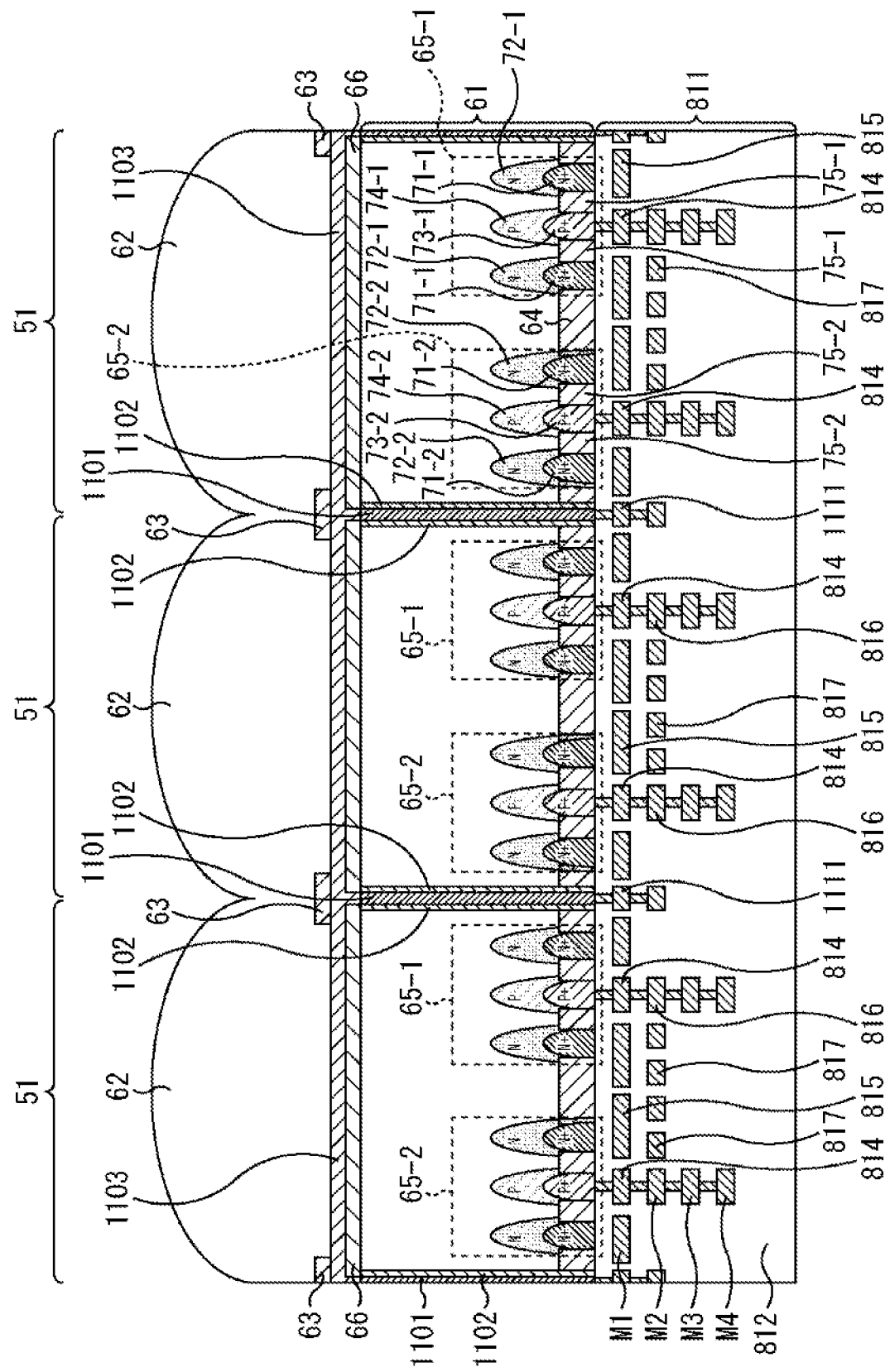
FIG. 60 is a cross-sectional view of a plurality of pixels in a twenty-second embodiment.

FIG. 60 is a cross-sectional view of pixels according to a twenty-second embodiment.

FIG. 60 illustrates a cross-sectional view of a plurality of pixels corresponding to the line B-B' in FIG. 11, similarly to FIG. 36 and the like described above.

In FIG. 60, a portion corresponding to the cross-sectional view of the plurality of pixels in the fourteenth embodiment illustrated in FIG. 36 is denoted by the same reference numeral, and description thereof is omitted as appropriate.

When comparing a configuration of a pixel 51 according to the twenty-second embodiment in FIG. 60 with the configuration of the pixel 51 according to the fourteenth embodiment illustrated in FIG. 36, a through electrode 1101 penetrating the substrate 61 as a P-type semiconductor layer and separating an adjacent pixel 51, and an insulating film 1102 covering an outer periphery (side wall) of the through electrode 1101 are newly formed in a pixel boundary portion that is a boundary portion of the adjacent pixel 51. The through electrode 1101 is formed using, for example, a metal material such as tungsten (W), aluminum (Al), copper (Cu), titanium (Ti), titanium nitride (TiN), tantalum (Ta), or tantalum nitride (TaN), or polysilicon or the like. The insulating film 1102 is formed using, for example, silicon oxide ($SiO_2$) or silicon oxynitride (SiON). The material of the insulating film 1102 may be an oxide or nitride containing at least one element of hafnium (Hf), aluminum (Al), zirconium (Zr), tantalum (Ta), or titanium (Ti), an oxide or nitride containing at least one element of lantern (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu), or yttrium (Y), or the like. The through electrode 1101 functions as a pixel separation portion that separates the semiconductor layer (substrate 61) of the adjacent pixels 51. Note that it can also be considered that the through electrode 1101 including the outer peripheral insulating film 1102 and the insulating film 1102 constitute the pixel separation portion.

The through electrode 1101 and the insulating film 1102 can be formed by forming a trench from a front surface side or a back surface side of the substrate 61 to reach an opposite substrate surface using dry etching or the like, and embedding polysilicon or a metal material to serve as the through electrode 1101 in the trench after forming the insulating film 1102.

A transparent conductive film 1103 is formed on an upper surface of a fixed charge film 66 formed on a light incident surface of the substrate 61 of each pixel 51, and the transparent conductive film 1103 is connected to the through electrode 1101 in a boundary portion of the pixel 51. As the transparent conductive film 1103, a material such as indium-tin-oxide (ITO), ZnO, SnO, $Cd_2SnO_4$, or $TiO_2$:Nb can be adopted.

The through electrode 1101 is electrically connected to voltage application wiring 1111 of a metal film M1 that is a metal film of a multilayer wiring layer 811, the metal film being closest to the substrate 61, and a negative bias is supplied to the voltage application wiring 1111. The negative bias of the voltage application wiring 1111 is applied to the fixed charge film 66 via the through electrode 1101 and the transparent conductive film 1103.

According to the pixel 51 of the twenty-second embodiment, the through electrode 1101 is formed as a pixel separation portion in the boundary portion of the pixel 51, and the transparent conductive film 1103 is formed on the upper surface of the fixed charge film 66. Then, the negative bias supplied from the voltage application wiring 1111 of the multilayer wiring layer 811 is applied to the fixed charge film 66 via the through electrode 1101 and the transparent conductive film 1103. As a result, the electric field in the depth direction from the light incident surface of the substrate 61 toward a signal extraction portion 65 (tap) can be strengthened, quantum efficiency (QE) can be improved, and high-speed drive can be implemented. Furthermore, resistance to the high-speed drive is improved.

Note that, if the fixed charge film 66 is not formed on the light incident surface side of the substrate 61 in the pixel 51, a configuration of forming an insulating film including an oxide film or the like on the light incident surface of the substrate 61, and applying the negative bias to the insulating film via the through electrode 1101 and the transparent conductive film 1103 can be adopted. The insulating film is not limited to a single-layer film and may be a stacked film.

Twenty-Third Embodiment

<Configuration Example of Pixel>

Figure 61:
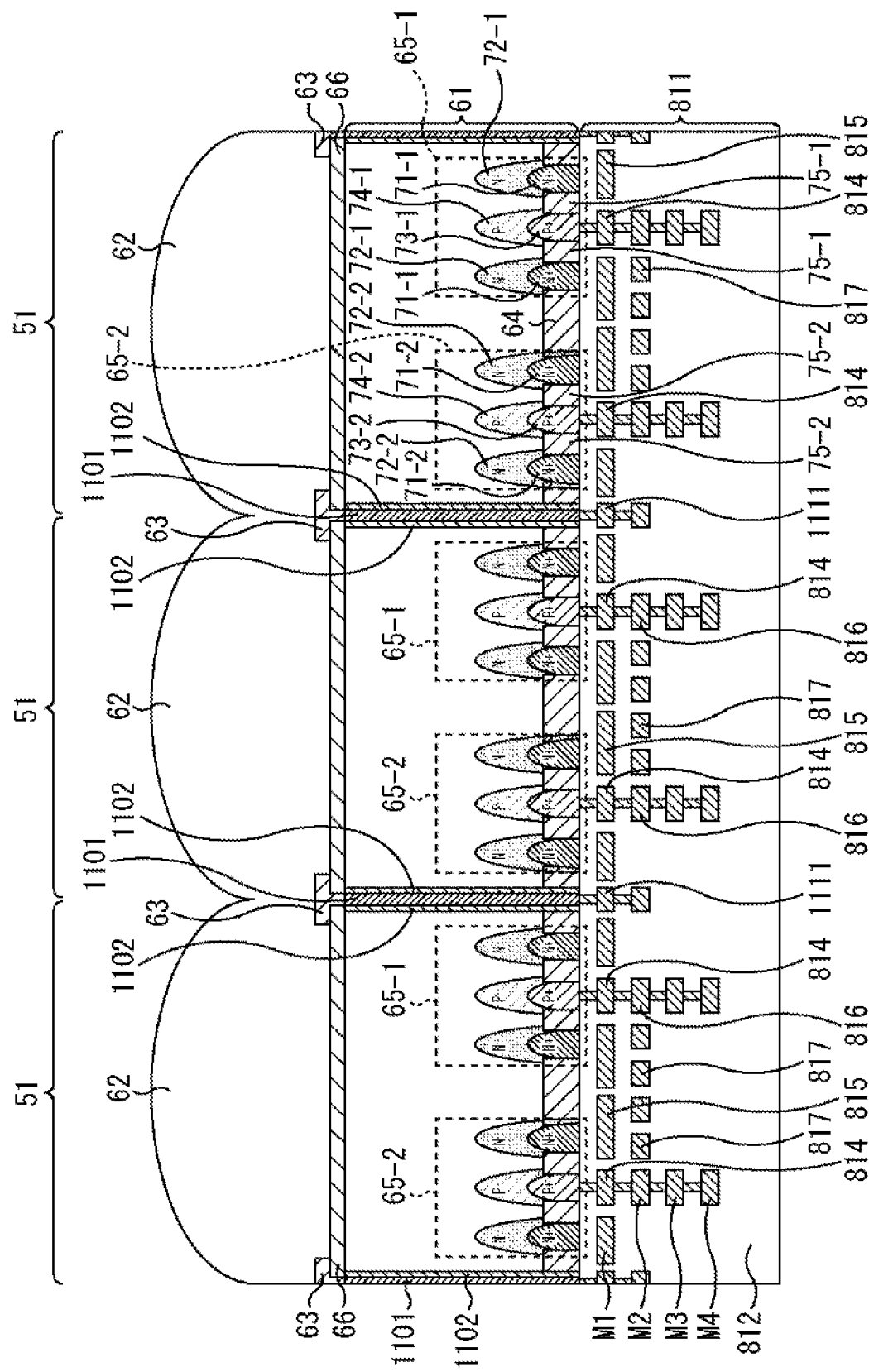
FIG. 61 is a cross-sectional view of a plurality of pixels in a twenty-third embodiment.

FIG. 61 is a cross-sectional view of pixels according to a twenty-third embodiment.

FIG. 61 illustrates a cross-sectional view of a plurality of pixels corresponding to the line B-B' in FIG. 11, similarly to FIG. 60 and the like.

In FIG. 61, a portion corresponding to the cross-sectional view of the plurality of pixels in the twenty-second embodiment illustrated in FIG. 60 is denoted by the same reference numeral, and description thereof is omitted as appropriate.

When comparing a configuration of a pixel 51 according to the twenty-third embodiment in FIG. 61 with the configuration of the pixel 51 according to the twenty-second embodiment illustrated in FIG. 60, the pixel 51 according to the twenty-third embodiment is common to that of the twenty-second embodiment in that a through electrode 1101 and an insulating film 1102 covering an outer periphery (side wall) of the through electrode 1101 are formed in a boundary portion of the pixel 51. Furthermore, the pixel 51 according to the twenty-third embodiment is common in that the through electrode 1101 is electrically connected to voltage application wiring 1111 of a metal film M1 of a multilayer wiring layer 811, the metal film being closest to a substrate 61, and a negative bias is supplied to the voltage application wiring 1111.

Meanwhile, in the pixel 51 according to the twenty-second embodiment illustrated in FIG. 60, the transparent conductive film 1103 has been formed on the upper surface of the fixed charge film 66, whereas in the twenty-third embodiment in FIG. 61, a transparent conductive film 1103 is not formed, and an inter-pixel light-shielding film 63 penetrates a fixed charge film 66 and is connected to a through electrode 1101, which is different. The inter-pixel light-shielding film 63 is formed using, for example, a metal material such as tungsten (W), aluminum (Al), or copper (Cu), and has light-shielding properties and conductivity.

According to the pixel 51 of the twenty-third embodiment, the through electrode 1101 is formed as a pixel separation portion in the boundary portion of the pixel 51, and the through electrode 1101 is connected to the inter-pixel light-shielding film 63. Then, the negative bias supplied from the voltage application wiring 1111 of the multilayer wiring layer 811 is applied to the fixed charge film 66 via the through electrode 1101 and the inter-pixel light-shielding film 63. As a result, the electric field in the depth direction from the light incident surface of the substrate 61 toward a signal extraction portion 65 (tap) can be strengthened, quantum efficiency (QE) can be improved, and high-speed drive can be implemented. Furthermore, resistance to the high-speed drive is improved.

Note that, if the fixed charge film 66 is not formed on the light incident surface side of the substrate 61 in the pixel 51, a configuration of forming an insulating film including an oxide film or the like on the light incident surface of the substrate 61, and applying the negative bias to the insulating film via the through electrode 1101 and the inter-pixel light-shielding film 63 can be adopted. The insulating film is not limited to a single-layer film and may be a stacked film.

Twenty-Fourth Embodiment

<Configuration Example of Pixel>

Figure 62:
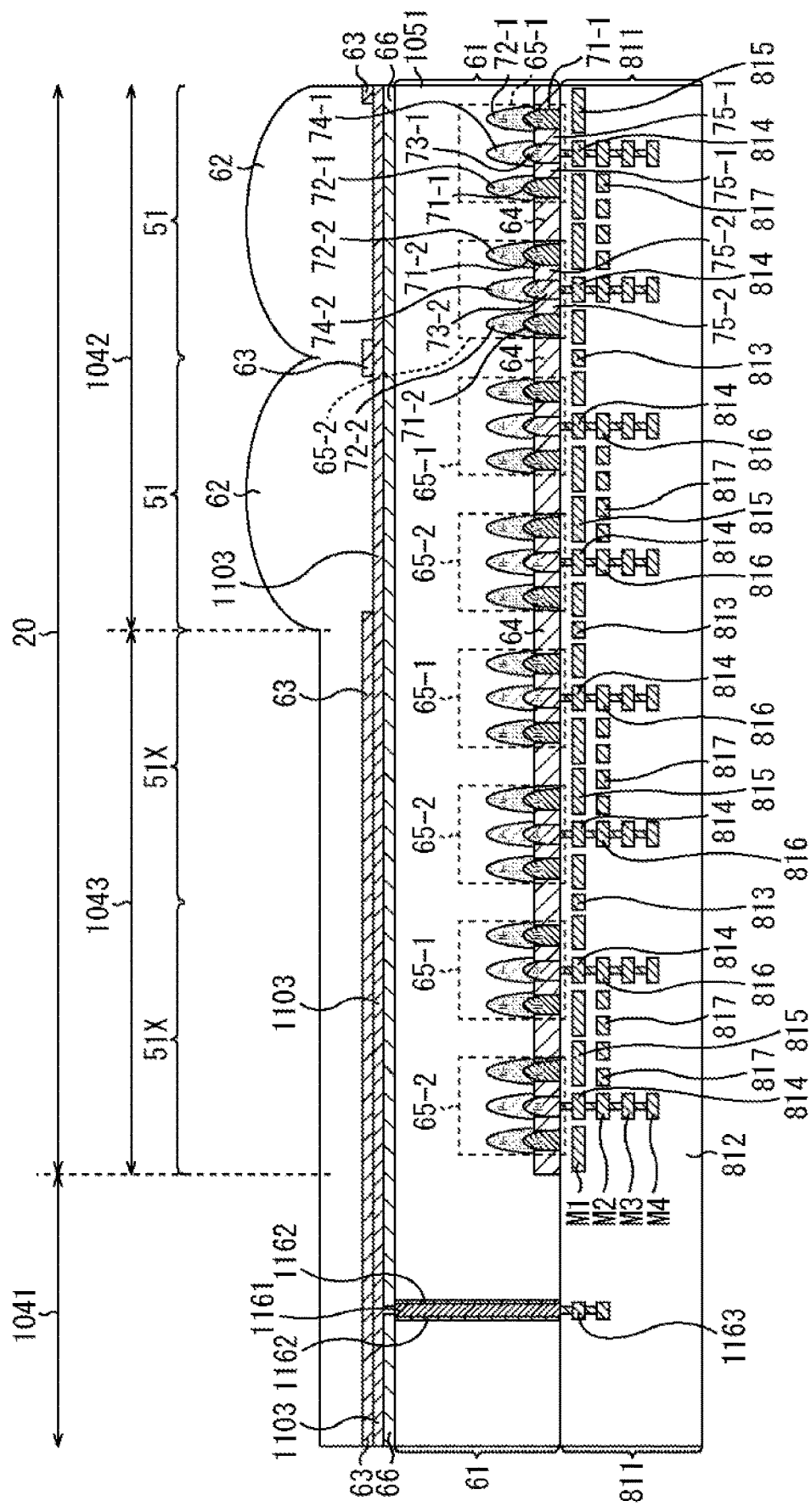
FIG. 62 is a cross-sectional view of a plurality of pixels in a twenty-fourth embodiment.

FIG. 62 is a cross-sectional view of pixels according to a twenty-fourth embodiment.

FIG. 62 illustrates a cross-sectional view of a plurality of pixels corresponding to the line B-B' in FIG. 11, similarly to FIG. 60 and the like.

In FIG. 62, a portion corresponding to the cross-sectional view of the plurality of pixels in the twenty-second embodiment illustrated in FIG. 60 is denoted by the same reference numeral, and description thereof is omitted as appropriate.

When comparing a configuration of a pixel 51 according to the twenty-fourth embodiment in FIG. 62 with the configuration of the pixel 51 according to the twenty-second embodiment illustrated in FIG. 60, the pixel 51 according to the twenty-fourth embodiment is common in that a transparent conductive film 1103 is formed on an upper surface of a fixed charge film 66, and is different in that a through electrode 1101 and an insulating film 1102 are not formed in a boundary portion of adjacent pixels 51.

In the twenty-fourth embodiment in FIG. 62, the through electrode 1101 is not formed in a pixel array unit 20, and thus a negative bias cannot be applied through the through electrode 1101. Therefore, in the twenty-fourth embodiment, the negative bias is supplied from voltage application wiring 1163 formed in a peripheral circuit unit 1041 outside the pixel array unit 20 to the transparent conductive film 1103 via a through electrode 1161, and the negative bias is applied from the transparent conductive film 1103 to the fixed charge film 66.

That is, in the twenty-fourth embodiment, the voltage application wiring 1163 is formed in the multilayer wiring layer 811 in the peripheral circuit unit 1041 outside the pixel array unit 20, and the negative bias is supplied to the voltage application wiring 1163. Furthermore, the through electrode 1161 with an outer periphery covered with an insulating film 1162 is formed in the peripheral circuit unit 1041 of the substrate 61, and the through electrode 1161 is connected to the transparent conductive film 1103 in a light incident surface of the substrate 61.

According to the pixel 51 of the twenty-fourth embodiment, the negative bias supplied from the voltage application wiring 1163 of the multilayer wiring layer 811 is applied to the fixed charge film 66 via the through electrode 1161 and the transparent conductive film 1103. As a result, the electric field in the depth direction from the light incident surface of the substrate 61 toward a signal extraction portion 65 (tap) can be strengthened, quantum efficiency (QE) can be improved, and high-speed drive can be implemented. Furthermore, resistance to the high-speed drive is improved.

Note that, if the fixed charge film 66 is not formed on the light incident surface side of the substrate 61 in the pixel 51, a configuration of forming an insulating film including an oxide film or the like on the light incident surface of the substrate 61, and applying the negative bias to the insulating film via the through electrode 1101 and the transparent conductive film 1103 can be adopted. The insulating film is not limited to a single-layer film and may be a stacked film.

Twenty-Fifth Embodiment

<Configuration Example of Pixel>

Figure 63:
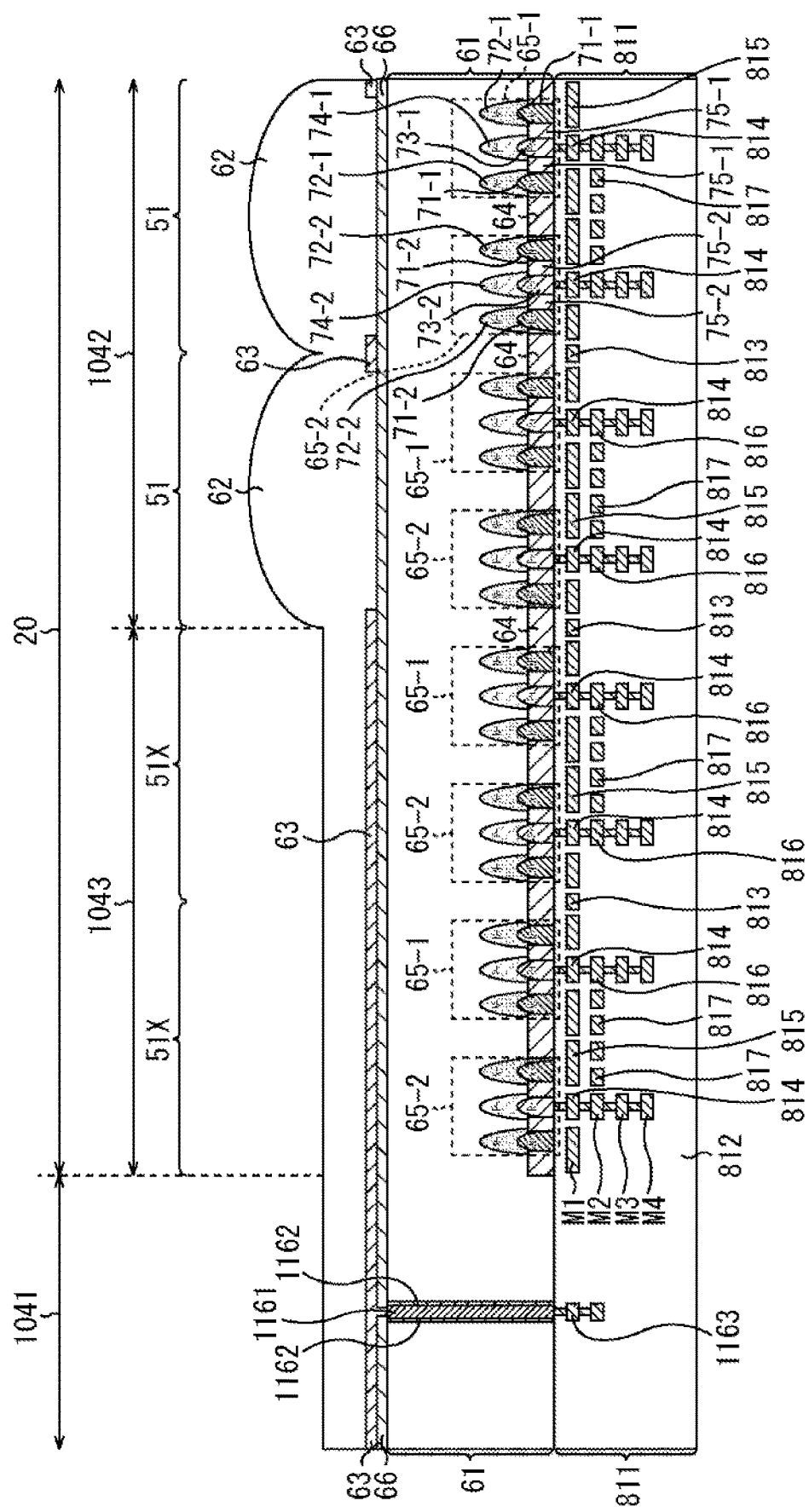
FIG. 63 is a cross-sectional view of a plurality of pixels in a twenty-fifth embodiment.

FIG. 63 is a cross-sectional view of pixels according to a twenty-fifth embodiment.

FIG. 63 illustrates a cross-sectional view of a plurality of pixels corresponding to the line B-B' in FIG. 11, similarly to FIG. 60 and the like.

In FIG. 63, a portion corresponding to the cross-sectional view of the plurality of pixels in the twenty-second and twenty-third embodiments illustrated in FIGS. 61 and 62 is denoted by the same reference numeral, and description thereof is omitted as appropriate.

When comparing a configuration of a pixel 51 according to the twenty-fifth embodiment in FIG. 63 with the configuration of the pixel 51 according to the twenty-third embodiment illustrated in FIG. 61, the pixel 51 according to the twenty-fifth embodiment is common in that a negative bias is applied to a fixed charge film 66 via an inter-pixel light-shielding film 63, and is different in that a through electrode 1101 and an insulating film 1102 are not formed in a boundary portion with an adjacent pixel 51.

In the twenty-fifth embodiment in FIG. 63, the through electrode 1101 is not formed in a pixel array unit 20, and thus the negative bias cannot be applied through the through electrode 1101. Therefore, in the twenty-fifth embodiment, the negative bias is supplied from voltage application wiring 1163 formed in a peripheral circuit unit 1041 outside the pixel array unit 20 to the inter-pixel light-shielding film 63 via a through electrode 1161, and the negative bias is applied from the inter-pixel light-shielding film 63 to the fixed charge film 66.

That is, in the twenty-fifth embodiment, the voltage application wiring 1163 is formed in a multilayer wiring layer 811 in the peripheral circuit unit 1041 outside the pixel array unit 20, and the negative bias is supplied to the voltage application wiring 1163. Furthermore, the through electrode 1161 with an outer periphery covered with an insulating film 1162 is formed in the peripheral circuit unit 1041 of the substrate 61, and the through electrode 1161 is connected to the inter-pixel light-shielding film 63 in a light incident surface of the substrate 61.

According to the pixel 51 of the twenty-fifth embodiment, the negative bias supplied from the voltage application wiring 1163 of the multilayer wiring layer 811 is applied to the fixed charge film 66 via the through electrode 1161 and the inter-pixel light-shielding film 63. As a result, the electric field in the depth direction from the light incident surface of the substrate 61 toward a signal extraction portion 65 (tap) can be strengthened, quantum efficiency (QE) can be improved, and high-speed drive can be implemented. Furthermore, resistance to the high-speed drive is improved.

Note that, if the fixed charge film 66 is not formed on the light incident surface side of the substrate 61 in the pixel 51, a configuration of forming an insulating film including an oxide film or the like on the light incident surface of the substrate 61, and applying the negative bias to the insulating film via the through electrode 1101 and the inter-pixel light-shielding film 63 can be adopted. The insulating film is not limited to a single-layer film and may be a stacked film.

In the above-described twenty-second to twenty-fifth embodiments, the negative bias is applied to the fixed charge film 66 formed on the light incident surface of the substrate 61 on an on-chip lens 62 side through the through electrode 1101 or 1161. Here, the negative bias is a voltage lower than a voltage (0 V) applied to a P+ semiconductor region 73 of a signal extraction portion 65 as an inactive tap. As a result, the electric field in the depth direction from the light incident surface of the substrate 61 toward a signal extraction portion 65 (tap) can be strengthened, quantum efficiency (QE) can be improved, and high-speed drive can be implemented. Furthermore, resistance to the high-speed drive is improved. Note that both the through electrode 1101 and the through electrode 1161 of the peripheral circuit unit 1041 may be provided, and the negative bias may be applied to the fixed charge film 66 using both of the electrodes.

<Configuration Example of Distance-Measuring Module>

Figure 64:
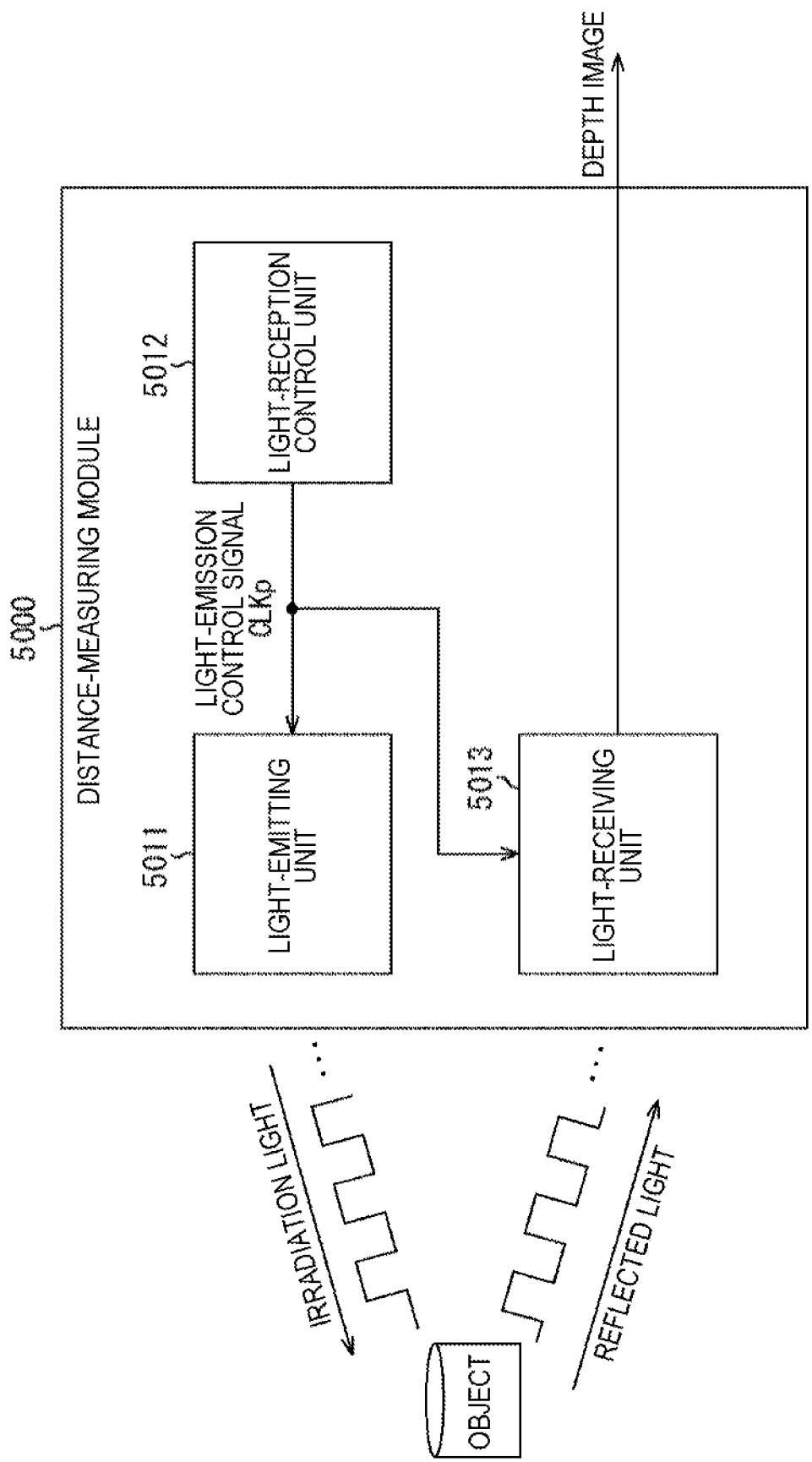
FIG. 64 is a block diagram illustrating a configuration example of a distance-measuring module.

FIG. 64 is a block diagram illustrating a configuration example of a distance-measuring module that outputs distance measurement information using a light-receiving element 1 in FIG. 1.

A distance-measuring module 5000 includes a light-emitting unit 5011, a light-emission control unit 5012, and a light-receiving unit 5013.

The light-emitting unit 5011 includes a light source that emits light of a predetermined wavelength, and emits irradiation light having brightness that periodically varies and irradiates an object with the irradiation light. For example, the light-emitting unit 5011 includes a light-emitting diode that emits infrared light having a wavelength of 780 nm to 1000 nm as the light source, and generates the irradiation light in synchronization with a light-emission control signal CLKp having a square wave supplied from the light-emission control unit 5012.

Note that the light-emission control signal CLKp is not limited to the square wave as long as the light-emission control signal is a periodic signal. For example, the light-emission control signal CLKp may be a sine wave.

The light-emission control unit 5012 supplies the light-emission control signal CLKp to the light-emitting unit 5011 and the light-receiving unit 5013 to control irradiation timing of the irradiation light. The frequency of the light-emission control signal CLKp is, for example, 20 megahertz (MHz). Note that the frequency of the light-emission control signal CLKp is not limited to 20 megahertz (MHz) and may be 5 megahertz (MHz) or the like.

The light-receiving unit 5013 receives reflected light reflected from the object, calculates distance information for each pixel according to a light-receiving result, and generates and outputs a depth image representing the distance to the object using a gradation value for each pixel.

The above-described light-receiving element 1 is used as the light-receiving unit 5013, and the light-receiving element 1 as the light-receiving unit 5013 calculates the distance information for each pixel from signal strength detected in a charge detection portion (N+ semiconductor region 71) of each of signal extraction portions 65-1 and 65-2 of each pixel 51 of a pixel array unit 20 on the basis of the light-emission control signal CLKp.

As described above, the light-receiving element 1 in FIG. 1 can be incorporated as the light-receiving unit 5013 of the distance-measuring module 5000 that obtains and outputs the distance information to the object by an indirect ToF method. As the light-receiving unit 5013 of the distance-measuring module 5000, the light-receiving element 1 in one of the above-described embodiments, specifically, a back-illuminated light-receiving element with improved pixel sensitivity is adopted, whereby the distance-measuring characteristics as the distance-measuring module 5000 can be improved.

<Application Example to Moving Bodies>

The technology according to the present disclosure (present technology) can be applied to various products. For example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 65:
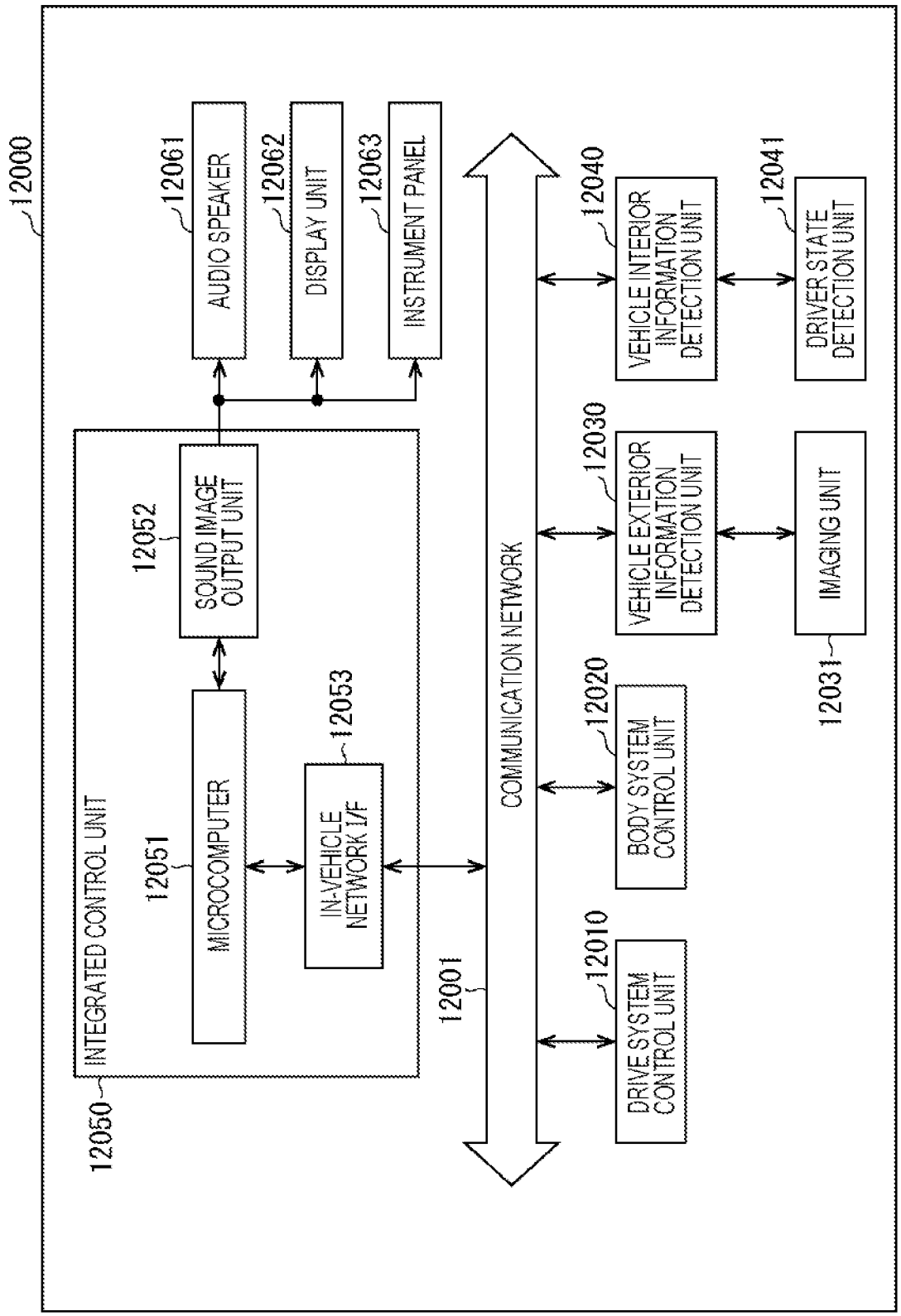
FIG. 65 is a block diagram illustrating an example of a schematic configuration of a vehicle control system.

FIG. 65 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 65, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to an amount of the received light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive force generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on a vehicular gap, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic drive of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare such as by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 65, as the output device, an audio speaker 12061, a display unit 12062, and an instrument panel 12063 are exemplarily illustrated. The display unit 12062 may include, for example, at least one of an on-board display or a head-up display.

Figure 66:
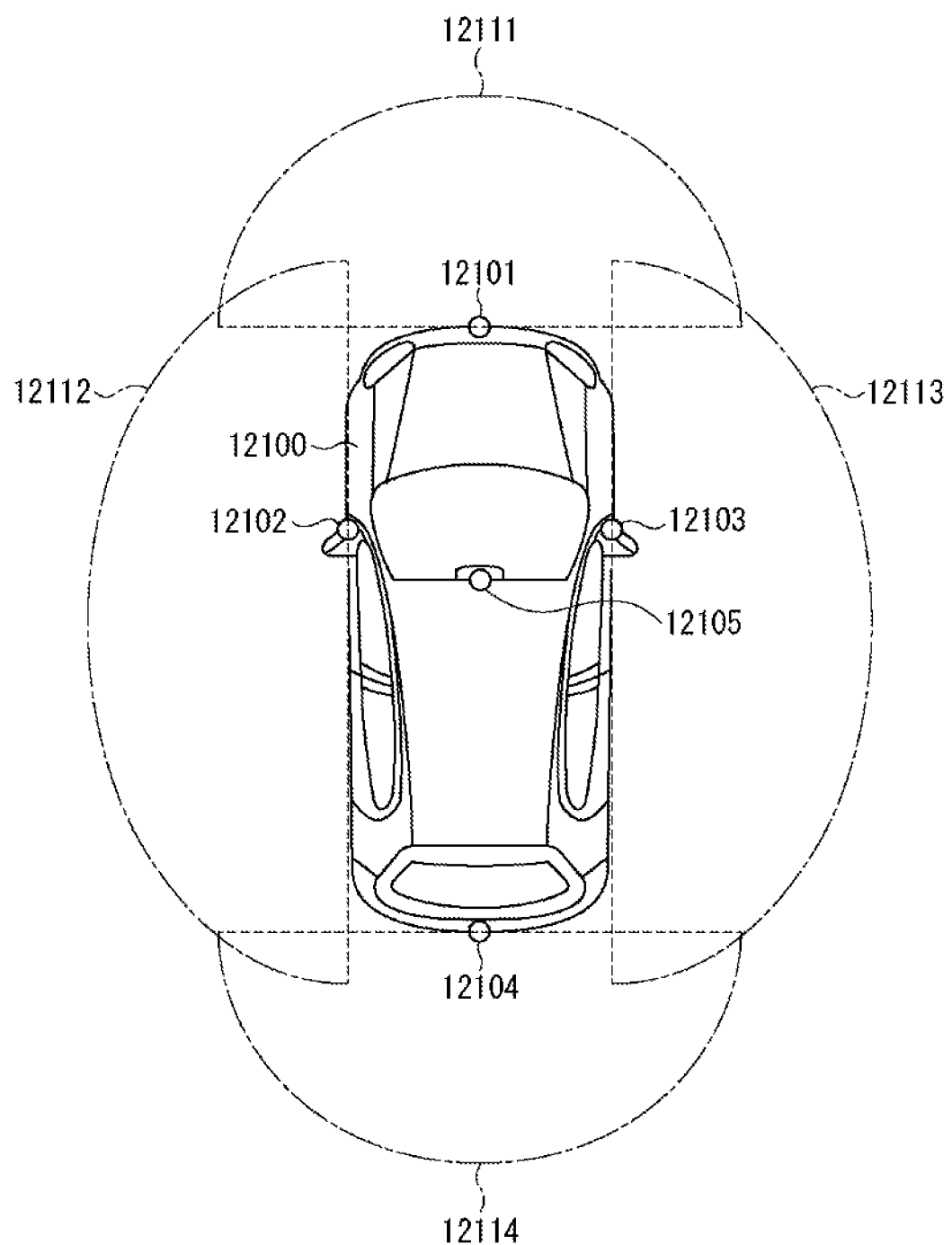
FIG. 66 is an explanatory diagram illustrating an example of installation positions of a vehicle exterior information detection unit and an imaging unit.

FIG. 66 is a diagram illustrating an example of an installation position of the imaging unit 12031.

In FIG. 66, a vehicle 12100 includes, as the imaging unit 12031, imaging units 12101, 12102, 12103, 12104, and 12105.

The imaging units 12101, 12102, 12103, 12104, and 12105 are provided at positions of a front nose, side mirrors, a rear bumper or a back door, an upper portion of a windshield, and the like in an interior of the vehicle 12100, for example. The imaging unit 12101 provided at the front nose and the imaging unit 12105 provided at an upper portion of the windshield in an interior of the vehicle mainly acquire images in front of the vehicle 12100. The imaging units 12102 and 12103 provided at the side mirrors mainly acquire images on sides of the vehicle 12100. The imaging unit 12104 provided at the rear bumper or the back door mainly acquires a rear image of the vehicle 12100. The front images acquired in the imaging units 12101 and 12105 are mainly used for detection of a leading vehicle, a pedestrian, an obstacle, a traffic light, a traffic sign, a lane, or the like.

Note that FIG. 66 illustrates an example of capture ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of imaging elements or may be an image sensor having pixels for phase difference detection.

For example, the microcomputer 12051 obtains distances to each of the three-dimensional objects in the imaging ranges 12111 to 12114 and temporal change of the distances (relative speeds to the vehicle 12100) on the basis of the distance information obtained from the imaging units 12101 to 12104, thereby to extract particularly a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic driving of autonomous travel without depending on an operation of the driver, and the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. The microcomputer 12051 then determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. Such recognition of a pedestrian is performed by a process of extracting characteristic points in the captured images of the imaging units 12101 to 12104, as the infrared camera, for example, and by a process of performing pattern matching processing for the series of characteristic points indicating a contour of an object and determining whether or not the object is a pedestrian. When the microcomputer 12051 determines that a pedestrian exists in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like representing the pedestrian at a desired position.

An example of the vehicle control system to which the technology according to the present disclosure is applicable has been described. The technology according to the present disclosure is applicable to the imaging unit 12031 in the above-described configurations. Specifically, for example, by applying the light-receiving element 1 illustrated in FIG. 1 to the imaging unit 12031, characteristics such as sensitivity can be improved.

Embodiments of the present technology are not limited to the above-described embodiments, and various modifications can be made without departing from the gist of the present technology.

For example, the above-described two or more embodiments can be combined as appropriate. That is, the following specification can be appropriately selected according to which characteristic such as the sensitivity of the pixel is prioritized: the number and location of the signal extraction portions provided in the pixel, the shape of the signal extraction portion, whether or not to adopt a shared structure, presence or absence of the on-chip lens, presence or absence of the inter-pixel light-shielding portion, presence or absence of the separation region, the thickness of the on-chip lens and the substrate, the type of the substrate and film design, presence or absence of a bias to the light incident surface, or presence or absence of the reflective member.

Furthermore, in the above-described embodiments, the examples of using electrons as the signal carrier have been described. However, holes generated by photoelectric conversion may be used as the signal carrier. In such a case, the charge detection portion for detecting the signal carrier is configured by the P+ semiconductor region and the voltage application portion for generating the electric field in the substrate is configured by the N+ semiconductor region, and the holes are detected as the signal carrier in the charge detection portion provided in the signal extraction portion.

According to the present technology, the distance-measuring characteristics can be improved by configuring the CAPD sensor as the back-illuminated light-receiving element.

Note that, the above embodiments have been described using the drive method of directly applying the voltage to the P+ semiconductor region 73 formed in the substrate 61 to move the charges photoelectrically converted by the generated electric field. However, the present technology is not limited to the drive method and can be applied to other drive methods. For example, it may be a drive method of using first and second transfer transistors and first and second floating diffusion regions formed in the substrate 61, distributing and accumulating the charges photoelectrically converted by applying a predetermined voltage to each of the gates of the first and second transfer transistors to the first floating diffusion region via the first transfer transistor or the second floating diffusion region via the second transfer transistor, respectively. In that case, the first and second transfer transistors formed in the substrate 61 function as the first and second voltage application portions, respectively, to which a predetermined voltage is applied and the first and second floating diffusion regions formed in the substrate 61 function as the first and second charge detection portions, respectively, that detect the charges generated by photoelectric conversion.

Furthermore, in other words, in the drive method of directly applying the voltage to the P+ semiconductor regions 73 formed in the substrate 61 to move the charges photoelectrically converted by the generated electric field, the two P+ semiconductor regions 73 functioning as the first and second voltage application portions are control nodes to which a predetermined voltage is applied, and the two N+ semiconductor regions 71 functioning as the first and second charge detection portions are detection nodes for detecting the charges. In the drive method of applying a predetermined voltage to gates of the first and second transfer transistors formed in the substrate 61 and distributing and accumulating the photoelectrically converted charges to the first floating diffusion region or the second floating diffusion region, the gates of the first and second transfer transistors are control nodes to which a predetermined voltage is applied, and the first and second diffusion regions formed in the substrate 61 are detection nodes for detecting the charges.

Furthermore, the effects described in the present specification are merely examples and are not limited, and other effects may be exhibited.

Note that the present technology can also have the following configurations.

(1)

A light-receiving element including:
an on-chip lens;
a wiring layer; and
a semiconductor layer arranged between the on-chip lens and the wiring layer, in which
the semiconductor layer includes
 a first pixel,
 a second pixel adjacent to the first pixel, and
 a first pixel separation portion that separates the semiconductor layer at least up to a predetermined depth between the first pixel and the second pixel,
the first pixel includes
 a first voltage application portion connected to first control wiring,
 a second voltage application portion connected to second control wiring,
 a first charge detection portion arranged around the first voltage application portion, and
 a second charge detection portion arranged around the second voltage application portion,
the second pixel includes
 a third voltage application portion connected to third control wiring,
 a fourth voltage application portion connected to fourth control wiring,
 a third charge detection portion arranged around the third voltage application portion, and
 a fourth charge detection portion arranged around the fourth voltage application portion, and
the first pixel separation portion includes
 a fifth voltage application portion connected to fifth control wiring.

(2)

The light-receiving element according to (1), in which
the wiring layer includes at least one layer provided with a reflective member, and
the reflective member is provided to overlap with the first charge detection portion or the second charge detection portion in plan view.

(3)

The light-receiving element according to (1) or (2), in which
the wiring layer includes at least one layer provided with a light-shielding member, and
the light-shielding member is provided to overlap with the first charge detection portion or the second charge detection portion in plan view.

(4)

The light-receiving element according to any one of (1) to (3), in which
the first pixel separation portion penetrates the semiconductor layer to separate the first pixel and the second pixel.

(5)

The light-receiving element according to any one of (1) to (4), in which
the semiconductor layer further includes
 a third pixel adjacent to the second pixel, and
 a second pixel separation portion that separates the semiconductor layer at least up to a predetermined depth between the second pixel and the third pixel,
the second pixel is
 arranged between the first pixel and the third pixel,
the third pixel includes
 a sixth voltage application portion connected to sixth control wiring,
 a seventh voltage application portion connected to seventh control wiring,
 a fifth charge detection portion arranged around the sixth voltage application portion, and
 a sixth charge detection portion arranged around the seventh voltage application portion, and
the second pixel separation portion includes
 an eighth voltage application portion connected to eighth control wiring.

(6)

The light-receiving element according to (5), in which
application of a voltage to the fifth voltage application portion is performed at same timing as application of a voltage to the eighth voltage application portion.

(7)

The light-receiving element according to (5), in which
application of a voltage to the fifth voltage application portion is performed at different timing from application of a voltage to the eighth voltage application portion.

(8)

The light-receiving element according to (7), in which
application of a voltage to the first voltage application portion is synchronized with the application of a voltage to the eighth voltage application portion, and
application of a voltage to the second voltage application portion is synchronized with the application of a voltage to the fifth voltage application portion.

(9)

The light-receiving element according to (8), in which
the voltage applied to the fifth voltage application portion is lower than the voltage applied to the first voltage application portion, and
the voltage applied to the eighth voltage application portion is lower than the second voltage.

(10)

The light-receiving element according to any one of (1) to (9), in which
the voltage applied to the fifth voltage application portion is a negative voltage.

(11)

The light-receiving element according to (5), in which
the semiconductor layer further includes
 a fourth pixel adjacent to the first pixel,
 a fifth pixel adjacent to the second pixel and the fourth pixel, and
 a third pixel separation portion that separates the semiconductor layer at least up to a predetermined depth between the fourth pixel and the fifth pixel,
the fourth pixel includes
 a ninth voltage application portion connected to ninth control wiring,
 a tenth voltage application portion connected to tenth control wiring, a seventh charge detection portion arranged around the ninth voltage application portion, and
an eighth charge detection portion arranged around the tenth voltage application portion,
the fifth pixel includes
an eleventh voltage application portion connected to eleventh control wiring,
a twelfth voltage application portion connected to twelfth control wiring,
a ninth charge detection portion arranged around the eleventh voltage application portion, and
a tenth charge detection portion arranged around the twelfth voltage application portion,
the third pixel separation portion includes
a thirteenth voltage application portion connected to thirteenth control wiring, and
the thirteenth control wiring is connected to the fifth control wiring.

(12)
The light-receiving element according to any one of (1) to (11), in which
the first pixel separation portion separates the semiconductor layer up to the predetermined depth from a surface of the semiconductor layer on a wiring layer side.

(13)
The light-receiving element according to any one of (1) to (11), in which
the first pixel separation portion separates the semiconductor layer up to the predetermined depth from a surface of the semiconductor layer on an on-chip lens side.

(14)
A light-receiving element including:
an on-chip lens;
a wiring layer; and
a semiconductor layer arranged between the on-chip lens and the wiring layer, in which
the semiconductor layer includes
a first pixel,
a second pixel adjacent to the first pixel, and
a first pixel separation portion that separates the semiconductor layer at least up to a predetermined depth between the first pixel and the second pixel,
an inter-pixel light-shielding film formed between the first pixel and the second pixel, on a front surface of the semiconductor layer on the on-chip lens side, and
a through electrode connected to the inter-pixel light-shielding film,
the first pixel includes
a first voltage application portion connected to first control wiring,
a second voltage application portion connected to second control wiring,
a first charge detection portion arranged around the first voltage application portion, and
a second charge detection portion arranged around the second voltage application portion,
the second pixel includes
a third voltage application portion connected to third control wiring,
a fourth voltage application portion connected to fourth control wiring,
a third charge detection portion arranged around the third voltage application portion, and
a fourth charge detection portion arranged around the fourth voltage application portion, and the first pixel separation portion includes
a fifth voltage application portion at least partly connected to the inter-pixel light-shielding film.

(15)
The light-receiving element according to any one of (1) to (14), in which
the fifth voltage application portion is formed using polysilicon or a metal material.

(16)
The light-receiving element according to any one of (1) to (15), in which
the fifth voltage application portion is formed by a high-concentration impurity region of a same conductive type as the first voltage application portion and the second voltage application portion.

(17)
The light-receiving element according to any one of (1) to (16), in which
the first and second voltage application portions are respectively configured by first and second P-type semiconductor regions formed in the semiconductor layer.

(18)
The light-receiving element according to any one of (1) to (16), in which
the first and second voltage application portions are respectively configured by first and second transfer transistors formed in the semiconductor layer.

(19)
A distance-measuring module including:
the light-receiving element according to (1) or (14);
a light source configured to radiate irradiation light in which brightness periodically varies; and
a light-emission control unit configured to control irradiation timing of the irradiation light.

REFERENCE SIGNS LIST

1 Light-receiving element
20 Pixel array unit
21 Tap drive unit
22 Vertical drive unit
51 Pixel
61 Substrate
62 On-chip lens
66 Fixed charge film
71-1, 71-2, 71 N+ semiconductor region
73-1, 73-2, 73 P+ semiconductor region
441-1, 441-2, 441 Separation region
471-1, 471-2, 471 Separation region
631 Reflective member
721 Transfer transistor
722 FD
723 Reset transistor
724 Amplification transistor
725 Selection transistor
727 Additional capacitance
728 Switching transistor
741 Voltage supply line
811 Multilayer wiring layer
812 Interlayer insulating film
813 Power supply line
814 Voltage application wiring
815 Reflective member
816 Voltage application wiring
817 Control line
M1 to M5 Metal film 1001 (1001A or 1001B) Through electrode
1002 (1002A or 1002B) Insulating film
1003 Gap portion
1011 Voltage application wiring
1021 DTI
1022 Insulating film
1041 Peripheral circuit unit
1051 DTI
1052 Insulating film
1061 Through electrode
1062 Insulating film
1063 Voltage application wiring
1071 P+ semiconductor region
1101 Through electrode
1102 Insulating film
1103 Transparent conductive film
1111 Voltage application wiring
1161 Through electrode
1162 Insulating film
1163 Voltage application wiring
5000 Distance-measuring module
5011 Light-emitting unit
5012 Light-emission control unit
5013 Light-receiving unit

What is claimed is:

1. A light-receiving element, comprising:
an on-chip lens;
a wiring layer; and
a semiconductor layer arranged between the on-chip lens and the wiring layer,
wherein the semiconductor layer includes:
a first pixel;
a second pixel adjacent to the first pixel; and
a first pixel separation portion that separates the semiconductor layer at least up to a predetermined depth between the first pixel and the second pixel,
wherein the first pixel separation portion includes:
an inter-pixel light-shielding film:
a non-tapered through electrode connected to the inter-pixel light-shielding film; and
a transparent conductive film provided between the inter-pixel light-shielding film and a top portion of the non-tapered through electrode,
wherein the first pixel includes;
a first voltage application portion connected to first control wiring;
a second voltage application portion connected to second control wiring;
a first charge detection portion arranged around the first voltage application portion; and
a second charge detection portion arranged around the second voltage application portion,
wherein the second pixel includes:
a third voltage application portion connected to third control wiring;
a fourth voltage application portion connected to fourth control wiring;
a third charge detection portion arranged around the third voltage application portion; and
a fourth charge detection portion arranged around the fourth voltage application portion, and
wherein the first pixel separation portion includes a fifth voltage application portion connected to fifth control wiring.

2. The light-receiving element according to claim 1, wherein
the wiring layer includes at least one layer provided with a reflective member, and
the reflective member is provided to overlap with the first charge detection portion or the second charge detection portion in a plan view.

3. The light-receiving element according to claim 1, wherein
the wiring layer includes at least one layer provided with a light-shielding member, and
the light-shielding member is provided to overlap with the first charge detection portion or the second charge detection portion in a plan view.

4. The light-receiving element according to claim 1, wherein the first pixel separation portion penetrates the semiconductor layer to separate the first pixel and the second pixel.

5. The light-receiving element according to claim 1, wherein the semiconductor layer further includes;
a third pixel adjacent to the second pixel; and
a second pixel separation portion that separates the semiconductor layer at least up to a predetermined depth between the second pixel and the third pixel,
wherein the second pixel is arranged between the first pixel and the third pixel,
wherein the third pixel includes:
a sixth voltage application portion connected to sixth control wiring;
a seventh voltage application portion connected to seventh control wiring;
a fifth charge detection portion arranged around the sixth voltage application portion; and
a sixth charge detection portion arranged around the seventh voltage application portion; and
wherein the second pixel separation portion includes an eighth voltage application portion connected to eighth control wiring.

6. The light-receiving element according to claim 5, wherein an applied voltage to the fifth voltage application portion occurs at a same time as an applied voltage to the eighth voltage application portion.

7. The light-receiving element according to claim 5, wherein an applied voltage to the fifth voltage application portion occurs at a different time than an applied voltage to the eighth voltage application portion.

8. The light-receiving element according to claim 7, wherein an applied voltage to the first voltage application portion is synchronized with the applied voltage to the eighth voltage application portion, and an applied voltage to the second voltage application portion is synchronized with the applied voltage to the fifth voltage application portion.

9. The light-receiving element according to claim 8, wherein
the applied voltage to the fifth voltage application portion is lower than the applied voltage to the first voltage application portion, and
the applied voltage to the eighth voltage application portion is lower than the second voltage.

10. The light-receiving element according to claim 1, wherein an applied voltage to the fifth voltage application portion is a negative voltage.

11. The light-receiving element according to claim 5, wherein the semiconductor layer further includes;
a fourth pixel adjacent to the first pixel;
a fifth pixel adjacent to the second pixel and the fourth pixel; and a third pixel separation portion that separates the semiconductor layer at least up to a predetermined depth between the fourth pixel and the fifth pixel, wherein the fourth pixel includes:
- a ninth voltage application portion connected to ninth control wiring;
- a tenth voltage application portion connected to tenth control wiring;
- a seventh charge detection portion arranged around the ninth voltage application portion; and
- an eighth charge detection portion arranged around the tenth voltage application portion, wherein the fifth pixel includes;
- an eleventh voltage application portion connected to eleventh control wiring;
- a twelfth voltage application portion connected to twelfth control wiring;
- a ninth charge detection portion arranged around the eleventh voltage application portion; and
- a tenth charge detection portion arranged around the twelfth voltage application portion, wherein the third pixel separation portion includes a thirteenth voltage application portion connected to thirteenth control wiring, and wherein the thirteenth control wiring is connected to the fifth control wiring.

12. The light-receiving element according to claim 1, wherein the first pixel separation portion separates the semiconductor layer up to the predetermined depth from a surface of the semiconductor layer on a wiring layer side.

13. The light-receiving element according to claim 1, wherein the first pixel separation portion separates the semiconductor layer up to the predetermined depth from a surface of the semiconductor layer on an on-chip lens side.

14. A light-receiving element, comprising:
an on-chip lens;
a wiring layer; and
a semiconductor layer arranged between the on-chip lens and the wiring layer, wherein the semiconductor layer includes;
- a first pixel;
- a second pixel adjacent to the first pixel;
- a first pixel separation portion that separates the semiconductor layer at least up to a predetermined depth between the first pixel and the second pixel;
- an inter-pixel light-shielding film formed between the first pixel and the second pixel, on a front surface of the semiconductor layer on the on-chip lens side;
- a non-tapered through electrode connected to the inter-pixel light-shielding film; and
- a transparent conductive film provided between the inter-pixel light-shielding film and a top portion of the non-tapered through electrode, wherein the first pixel includes;
- a first voltage application portion connected to first control wiring;
- a second voltage application portion connected to second control wiring;
- a first charge detection portion arranged around the first voltage application portion; and
- a second charge detection portion arranged around the second voltage application portion, wherein the second pixel includes:
- a third voltage application portion connected to third control wiring;
- a fourth voltage application portion connected to fourth control wiring;
- a third charge detection portion arranged around the third voltage application portion; and
- a fourth charge detection portion arranged around the fourth voltage application portion, and wherein the first pixel separation portion includes a fifth voltage application portion at least partly connected to the inter-pixel light-shielding film.

15. The light-receiving element according to claim 1, wherein the fifth voltage application portion is formed using polysilicon or a metal material.

16. The light-receiving element according to claim 1, wherein the fifth voltage application portion is formed by a high-concentration impurity region of a same conductive type as the first voltage application portion and the second voltage application portion.

17. The light-receiving element according to claim 1, wherein the first and second voltage application portions are respectively configured by first and second P-type semiconductor regions formed in the semiconductor layer.

18. The light-receiving element according to claim 1, wherein the first and second voltage application portions are respectively configured by first and second transfer transistors formed in the semiconductor layer.

19. A distance-measuring module, comprising:
a light-receiving element, comprising:
an on-chip lens;
a wiring layer; and
a semiconductor layer arranged between the on-chip lens and the wiring layer, wherein the semiconductor layer includes:
- a first pixel;
- a second pixel adjacent to the first pixel; and
- a first pixel separation portion that separates the semiconductor layer at least up to a predetermined depth between the first pixel and the second pixel, wherein the first pixel separation portion includes:
- an inter-pixel light-shielding film;
- a non-tapered through electrode connected to the inter-pixel light-shielding film; and
- a transparent conductive film provided between the inter-pixel light-shielding film and a top portion of the non-tapered through electrode, wherein the first pixel includes:
- a first voltage application portion connected to first control wiring;
- a second voltage application portion connected to second control wiring;
- a first charge detection portion arranged around the first voltage application portion; and
- a second charge detection portion arranged around the second voltage application portion, wherein the second pixel includes:
- a third voltage application portion connected to third control wiring;
- a fourth voltage application portion connected to fourth control wiring;
- a third charge detection portion arranged around the third voltage application portion; and
- a fourth charge detection portion arranged around the fourth voltage application portion, and wherein the first pixel separation portion includes a fifth voltage application portion connected to fifth control wiring;

a light source configured to radiate irradiation light in which brightness periodically varies; and a light-emission control unit configured to control irradiation timing of the irradiation light.

20. The distance-measuring module according to claim 19, wherein
the wiring layer includes at least one layer provided with a reflective member, and
the reflective member is provided to overlap with the first charge detection portion or the second charge detection portion in a plan view.

* * * * *